United States Patent
Kotake et al.

(10) Patent No.: US 12,164,231 B2
(45) Date of Patent: *Dec. 10, 2024

(54) CHEMICALLY AMPLIFIED POSITIVE RESIST COMPOSITION AND RESIST PATTERN FORMING PROCESS

(71) Applicant: Shin-Etsu Chemical Co., Ltd., Tokyo (JP)

(72) Inventors: Masaaki Kotake, Joetsu (JP); Satoshi Watanabe, Joetsu (JP); Keiichi Masunaga, Joetsu (JP); Masaki Ohashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 302 days.

This patent is subject to a terminal disclaimer.

(21) Appl. No.: 17/591,741

(22) Filed: Feb. 3, 2022

(65) Prior Publication Data

US 2022/0269174 A1 Aug. 25, 2022

(30) Foreign Application Priority Data

Feb. 12, 2021 (JP) ................. 2021-020953

(51) Int. Cl.
   *G03F 7/039* (2006.01)
   *G03F 7/004* (2006.01)
   (Continued)

(52) U.S. Cl.
   CPC .......... *G03F 7/0392* (2013.01); *G03F 7/0045* (2013.01); *G03F 7/2006* (2013.01); *G03F 7/322* (2013.01)

(58) Field of Classification Search
   CPC ...... G03F 7/004; G03F 7/0392; G03F 7/0045; G03F 7/0046; G03F 7/0397;
   (Continued)

(56) References Cited

U.S. PATENT DOCUMENTS 6,479,210 B2 11/2002 Kinoshita et al.
6,485,883 B2 11/2002 Kodama et al.
(Continued)

FOREIGN PATENT DOCUMENTS

EP 1 684 118 A1 7/2006
EP 1 975 711 A1 10/2008
(Continued)

OTHER PUBLICATIONS

Non-Final Office Action dated Jan. 10, 2024, issued in U.S. Appl. No. 17/524,085. (19 pages).
(Continued)

*Primary Examiner* — Sean M DeGuire
*Assistant Examiner* — Alexander N. Lee
(74) *Attorney, Agent, or Firm* — WHDA, LLP

(57) ABSTRACT

A chemically amplified positive resist composition is provided comprising (A) a sulfurane or selenurane compound having formula (A1) wherein M is sulfur or selenium and (B) a base polymer containing a polymer comprising repeat units having formula (B1). The resist composition exhibits a high resolution during pattern formation and forms a pattern with improved LER and CDU.

(A1)

(Continued)

-continued

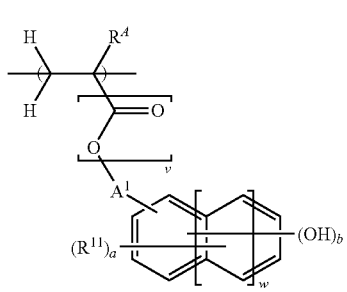

(B1)

12 Claims, 3 Drawing Sheets

(51) Int. Cl.
G03F 7/20 (2006.01)
G03F 7/32 (2006.01)

(58) Field of Classification Search
CPC ...... G03F 7/0395; G03F 7/039; G03F 7/2006;
G03F 7/322; G03F 1/50; C08F 2/50;
C08F 220/22; C08F 220/301; C08F
220/303; C07C 381/00; C07C 381/12;
C07C 391/00; C07C 391/02
USPC ...................................................... 430/270.1
See application file for complete search history.

(56) References Cited

U.S. PATENT DOCUMENTS

| | | | |
|---|---|---|---|
| 6,492,091 B2 | 12/2002 | Kodama et al. | |
| 7,214,467 B2 | 5/2007 | Kanna et al. | |
| 9,075,306 B2 | 7/2015 | Takeda et al. | |
| 2006/0166133 A1 | 7/2006 | Koitabashi et al. | |
| 2010/0009286 A1 | 1/2010 | Takeda et al. | |
| 2010/0316955 A1* | 12/2010 | Masunaga | G03F 7/0392 |
| | | | 430/326 |
| 2011/0171577 A1 | 7/2011 | Tsuchimura et al. | |
| 2013/0230762 A1* | 9/2013 | Hashizume | H01M 10/0567 |
| | | | 429/163 |
| 2017/0329227 A1 | 11/2017 | Ohashi et al. | |
| 2018/0180992 A1* | 6/2018 | Kotake | G03F 7/004 |
| 2018/0180998 A1 | 6/2018 | Kotake et al. | |

FOREIGN PATENT DOCUMENTS

| | | | |
|---|---|---|---|
| JP | 11202439 A * | 7/1999 | |
| JP | 11-327143 A | 11/1999 | |
| JP | 2006-201532 A | 8/2006 | |
| JP | 2006-215180 A | 8/2006 | |
| JP | 3955384 B2 | 8/2007 | |
| JP | 4116340 B2 | 7/2008 | |
| JP | 2008-249762 A | 10/2008 | |
| JP | 4226803 B2 | 2/2009 | |
| JP | 2009-53518 A | 3/2009 | |
| JP | 4231622 B2 | 3/2009 | |
| JP | 2010-100604 A | 5/2010 | |
| JP | 4575479 B2 | 11/2010 | |
| JP | 2011-22564 A | 2/2011 | |
| JP | 5083528 B2 | 11/2012 | |

OTHER PUBLICATIONS

Non-Final Office Action dated Jan. 30, 2024, issued in U.S. Appl. No. 17/591,719. (18 pages).

* cited by examiner

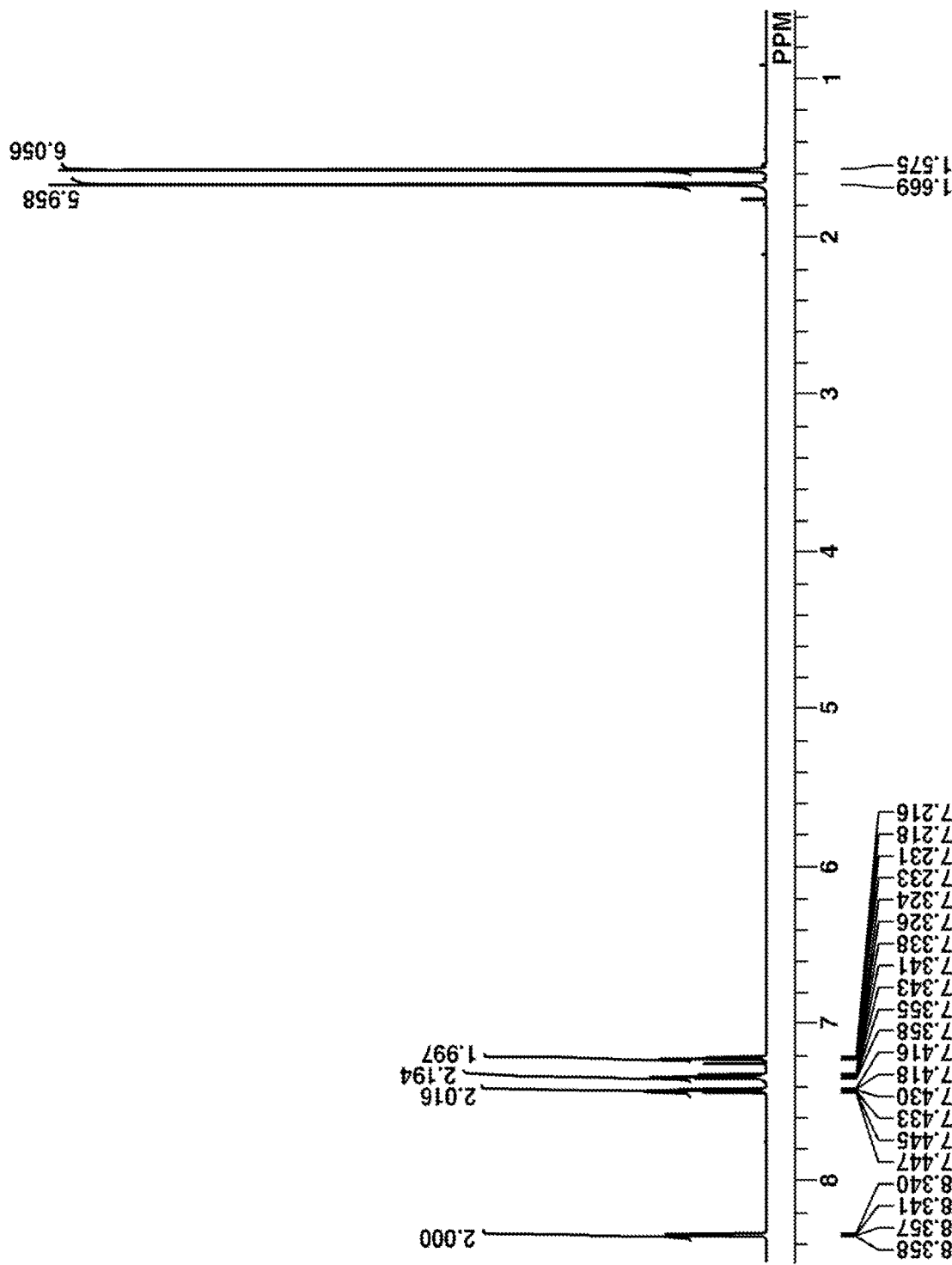

CHEMICALLY AMPLIFIED POSITIVE RESIST COMPOSITION AND RESIST PATTERN FORMING PROCESS

CROSS-REFERENCE TO RELATED APPLICATION

This non-provisional application claims priority under 35 U.S.C. § 119(a) on Patent Application No. 2021-020953 filed in Japan on Feb. 12, 2021, the entire contents of which are hereby incorporated by reference.

TECHNICAL FIELD

This invention relates to a chemically amplified positive resist composition and a resist pattern forming process using the same.

BACKGROUND ART

To meet the demand for higher integration density and operating speed of LSIs, the effort to reduce the pattern rule is in rapid progress. Acid-catalyzed chemically amplified resist compositions are most often used in forming resist patterns with a feature size of 0.2 µm or less. High-energy radiation such as UV, deep-UV or EB is used as the light source for exposure of these resist compositions. In particular, while EB lithography is utilized as the ultra-fine microfabrication technique, it is also indispensable in processing photomask blanks to form photomasks for use in semiconductor device fabrication.

Polymers comprising a major proportion of aromatic structure having an acidic side chain, for example, polyhydroxystyrene are useful in resist materials for the KrF excimer laser lithography. These polymers are not used in resist materials for the ArF excimer laser lithography since they exhibit strong absorption at a wavelength of around 200 nm. These polymers, however, are expected to form useful resist materials for the EB and EUV lithography for forming patterns of finer size than the processing limit of ArF excimer laser because they offer high etching resistance.

Often used as the base polymer in positive resist compositions for EB and EUV lithography is a polymer having an acidic functional group on phenol side chain masked with an acid-decomposable protective group (acid labile group). Upon exposure to high-energy radiation, the acid-decomposable protective group is deprotected by the catalysis of an acid generated from a photoacid generator so that the polymer may turn soluble in alkaline developer. Typical of the acid-decomposable protective group are tertiary alkyl, tert-butoxycarbonyl, and acetal groups. The use of protective groups requiring a relatively low level of activation energy for deprotection such as acetal groups offers the advantage that a resist film having a high sensitivity is obtainable. However, if the diffusion of generated acid is not fully controlled, deprotection reaction can occur even in the unexposed region of the resist film, giving use to problems like a lowering of line edge roughness (LER) and degradation of critical dimension uniformity (CDU) of pattern line width.

Attempts were made to ameliorate resist sensitivity and pattern profile in a controlled way by properly selecting and combining components used in resist compositions and adjusting processing conditions. One outstanding problem is the diffusion of acid. Since acid diffusion has a significant impact on the sensitivity and resolution of a chemically amplified resist composition, many studies are made on the acid diffusion problem.

Patent Documents 1 and 2 describe photoacid generators cap able of generating bulky acids like benzenesulfonic acid upon exposure, for thereby controlling acid diffusion and reducing roughness. Since these acid generators are still insufficient in controlling acid diffusion, it is desired to have an acid generator with more controlled diffusion.

Patent Document 3 proposes to control acid diffusion in a resist composition by binding an acid generator capable of generating a sulfonic acid upon light exposure to a base polymer. This approach of controlling acid diffusion by binding repeat units capable of generating acid upon exposure to a base polymer is effective in forming a pattern with reduced LER. However, a problem arises with respect to the solubility in organic solvent of the base polymer having bound therein repeat units capable of generating acid upon exposure, depending on the structure and proportion of the repeat units.

Patent Document 4 describes a resist composition comprising a polymer comprising repeat units having an acetal group and a sulfonium salt capable of generating an acid having a high acid strength such as fluoroalkanesulfonic acid. The composition forms a pattern with noticeable LER. This is because the acid strength of fluoroalkanesulfonic acid is too high for the deprotection of the acetal group requiring a relatively low level of activation energy far deprotection. Even if acid diffusion is controlled, deprotection reaction can be promoted in the unexposed region by a minor amount of acid that has diffused thereto. The same problem arises with sulfonium salts capable of generating benzenesulfonic acids as described in Patent Documents 1 and 2. It is thus desired to have an acid generator capable of generating an acid having an appropriate strength to deprotect the acetal group.

While the aforementioned methodology of generating a bulky acid is effective for suppressing acid diffusion, the methodology of tailoring an acid diffusion inhibitor (also known as quencher) is also considered effective. The acid diffusion inhibitor is, in fact, essential for controlling acid diffusion and improving resist performance.

Studies have been made on the acid diffusion inhibitor while amines and weak acid onium salts have been generally used. The weak acid onium salts are exemplified in several patent documents. For example, Patent Document 5 describes that the addition of triphenylsulfonium acetate ensures to form a satisfactory resist pattern without T-top profile, a difference in line width between isolated and grouped patterns, and standing waves. Patent Document 6 describes the addition of ammonium salts of sulfonic acids or carboxylic acids for achieving improvements in sensitivity, resolution and exposure margin. Also, Patent Document 7 describes that a resist composition for KrF or EB lithography comprising a PAG capable of generating a fluorinated carboxylic acid is improved in resolution and process latitude such as exposure margin and depth of focus. These compositions are used in the KrF, EB and $F_2$ lithography processes.

Patent Document 8 describes a positive photosensitive composition for ArF lithography comprising a carboxylic acid onium salt. These systems are based on the mechanism that a salt exchange occurs between a weak acid onium salt and a strong acid (sulfonic acid) generated by a PAG upon exposure, to form a weak acid and a strong acid onium salt. That is, the strong acid (sulfonic acid) having high acidity is replaced by a weak acid (carboxylic acid), thereby suppressing acid-catalyzed decomposition reaction of acid labile group and reducing or controlling the distance of acid diffusion. The onium salt apparently functions as an acid diffusion inhibitor.

However, noticeable LER is still a problem in the recent progress of miniaturization when a resist composition comprising the foregoing carboxylic acid onium salt or fluorocarboxylic acid onium salt is used in patterning. It would be desirable to have an acid diffusion inhibitor capable of minimizing LER.

CITATION LIST

Patent Document 1: JP-A 2009-053518
Patent Document 2: JP-A 2010-100604
Patent Document 3: JP-A 2011-022564
Patent Document 4: JP 5083528
Patent Document 5: JP 3955384 (U.S. Pat. No. 6,479,210)
Patent Document 6: JP-A H11-327143
Patent Document 7: JP 4231622 (U.S. Pat. No. 6,485,883)
Patent Document 8: JP 4226803 (U.S. Pat. No. 6,492,091)
Patent Document 9: JP 4575479

DISCLOSURE OF INVENTION

An object of the invention is to provide a chemically amplified positive resist composition which exhibits a high resolution upon pattern formation and forms a resist pattern with improved LER and CDU, and a pattern forming process using the same.

The inventors have found that a resist composition comprising an acid diffusion inhibitor in the form of a sulfurane or selenurane compound of specific structure can be processed by lithography to form a resist pattern of good profile having a high resolution, reduced LER and improved CDU.

In one aspect, the invention provides a chemically amplified positive resist composition comprising (A) a sulfurane of selenurane compound having the following formula (A1 and (B) a base polymer containing a polymer which is decomposed under the action of acid to increase its solubility in alkaline developer, the polymer comprising repeat units having the following formula (B1).

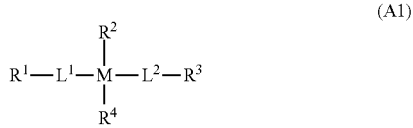
(A1)

Herein $R^1$ to $R^4$ are each independently a $C_1$-$C_{20}$ hydrocarbyl group which may contain a heteroatom, $R^1$ and $R^2$ may bond together M form a ring with $L^1$ and M to which they are attached, each pair of $R^1$ and $R^2$, and $R^3$ and $R^4$ may bond together to form spiro rings containing M as the spiro atom. $L^1$ and $L^2$ are each independently —O— or —N(R)—, R is hydrogen or a $C_1$-$C_{20}$ hydrocarbyl group which may contain a heteroatom. M is sulfur or selenium.

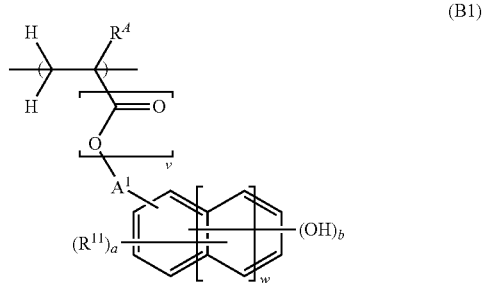
(B1)

Herein $R^A$ is hydrogen, fluorine, methyl or trifluoromethyl. $R^{11}$ is halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group. $A^1$ is a single bond or a $C_1$-$C_{10}$ saturated hydrocarbylene group in w which any constituent —$CH_2$— may be replaced by —O—; v is 0 or 1, w is an integer of 0 to 2, a is an integer satisfying $0 \le a \le 5+2w-b$, and b is an integer of 1 to 3.

In a preferred embodiment, the polymer further comprises repeat units having the formula (B2).

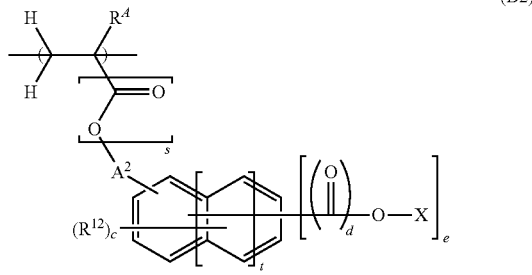
(B2)

Herein $R^A$ is as defined above. $R^{12}$ is halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group. $A^2$ is a single bond or $C_1$-$C_{10}$ saturated hydrocarbylene group in which any constituent —$CH_2$— may be replaced by —O—. The subscript s is 0 or 1, t is an integer of 0 to 2, c is an integer satisfying $0 \le c \le 5+2t-e$, d is 0 or 1, e is an integer of 1 to 3. X is an acid labile group when e=1, and X is hydrogen or an acid labile group, at least one being an acid labile group, when e=2 or 3.

In a preferred embodiment, the polymer further comprises repeat units of at least one type selected from repeat units having the formula (B3), repeat units having the formula (B4), and repeat units having the formula (B5).

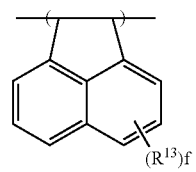
(B3)

5
-continued (B4)
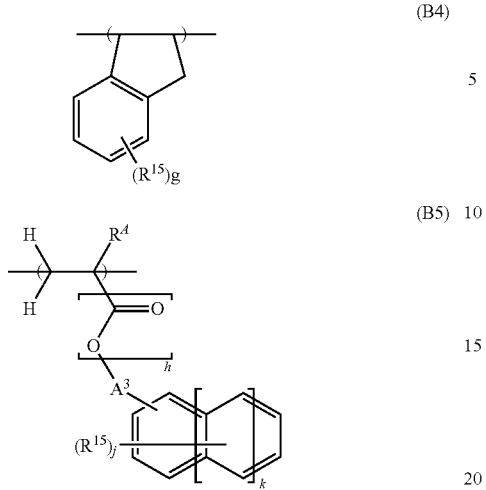

(B5)

Herein R^A is as defined above. R^13 and R^14 are each independently hydroxy, halogen, an optionally halogenated $C_2$-$C_8$ saturated hydrocarbylcarbonyloxy group, optionally halogenated $C_1$-$C_8$ saturated hydrocarbyl group, or optionally halogenated $C_1$-$C_8$ saturated hydrocarbyloxy group. R^15 is an acetyl group, $C_1$-$C_{20}$ saturated hydrocarbyl group, $C_1$-$C_{20}$ saturated hydrocarbyloxy group. $C_2$-$C_{20}$ saturated hydrocarbylcarbonyloxy group, $C_2$-$C_{20}$ saturated hydrocarbyloxyhydrocarbyl group, $C_2$-$C_{20}$ saturated hydrocarbylthiohydrocarbyl group, halogen, nitro group, cyano group, sulfinyl group, or sulfonyl group. A^3 is a single bond or $C_1$-$C_{10}$ saturated hydrocarbylene group in which any constituent —CH$_2$— may be replaced by —O—; f and g are each independently an integer of 0 to 4, h is 0 or 1, j is an integer of 0 to 5, and k is an integer of 0 to 2.

In a preferred embodiment, the polymer further comprises repeat units of at least one type selected from repeat units having the formulae (B6) to (B13).

(B6)
(B7)
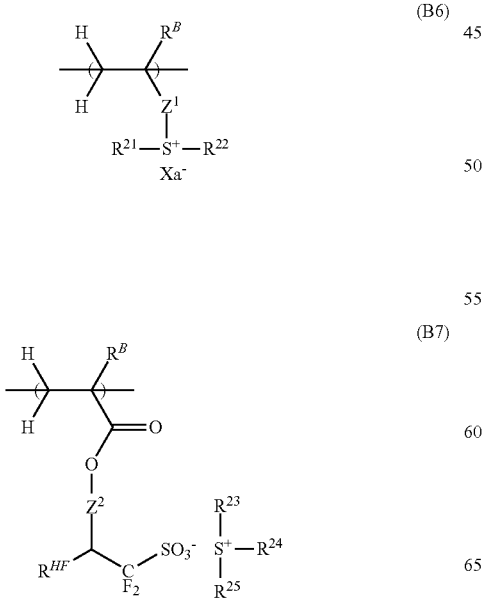

6
-continued (B8)
(B9)
(B10)
(B11)
(B12)
(B13)
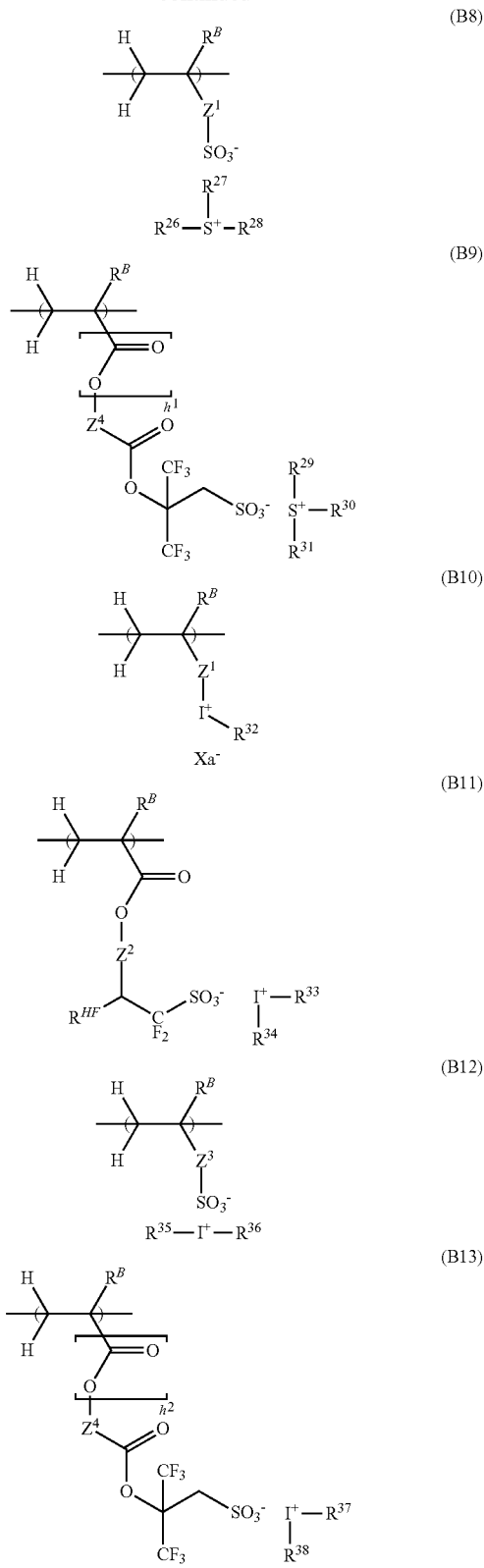

Herein R^B is each independently hydrogen or methyl. Z^1 is a single bond, a $C_1$-$C_6$ aliphatic hydrocarbylene group, phenylene group, naphthylene group or $C_7$-$C_{18}$ group obtained by combining the foregoing, —O—Z^{11}—, or —C(=O)—NH—$Z^{11}$—, wherein $Z^{11}$ is a $C_1$-$C_6$ aliphatic hydrocarbylene group, phenylene group, naphthylene group or $C_7$-$C_{18}$ group obtained by combining the foregoing, which may contain a carbonyl moiety, ester bond, ether bond or hydroxy moiety. $Z^2$ is a single bond or —$Z^{21}$—C(=O)—O—, wherein $Z^{21}$ is a $C_1$-$C_{20}$ hydrocarbylene group which may contain a heteroatom. $Z^3$ is a single bond, methylene, ethylene, phenylene, fluorinated phenylene, trifluoromethyl-substituted phenylene, —O—$Z^{31}$—, —C(=O)—O—$Z^{31}$—, or —C(=O)—NH—$Z^{31}$—, wherein $Z^{31}$ is a $C_1$-$C_6$ aliphatic hydrocarbylene group, phenylene group, fluorinated phenylene group, trifluoromethyl-substituted phenylene group, or $C_7$-$C_{20}$ group obtained by combining the foregoing, which may contain a carbonyl moiety, ester bond, ether bond or hydroxy moiety. $Z^4$ is a single bond or $C_1$-$C_{30}$ hydrocarbylene group which may contain a heteroatom, $h^1$ and $h^2$ are each independently 0 or 1, $h^1$ and $h^2$ are 0 when $Z^4$ is a single bond. $R^{21}$ to $R^{38}$ are each independently a $C_1$-$C_{20}$ hydrocarbyl group which may contain a heteroatom. $R^{21}$ and $R^{22}$ may bond together to form a ring with the sulfur atom to which they are attached, $R^{23}$ and $R^{24}$, $R^{26}$ and $R^{27}$, or $R^{29}$ and $R^{30}$ may bond together to form a ring with the sulfur atom to which they are attached. $R^{HF}$ is hydrogen or trifluoromethyl. $Xa^-$ is a non-nucleophilic counter ion.

The positive resist composition may further comprise (C) a photoacid generator.

The positive resist composition may further comprise (D) a polymer comprising repeat units having the formula (D1) and repeat units of at least one type selected from repeat units having the formulae (D2) to (D5).

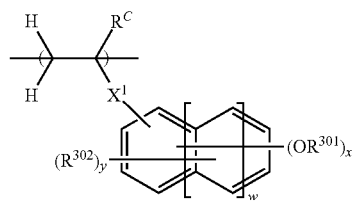

(D1)

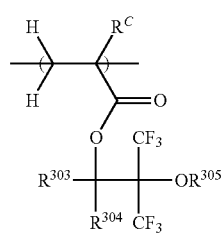

(D2)

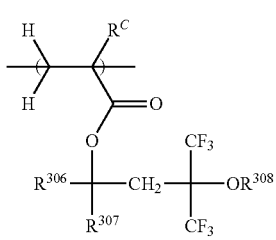

(D3)

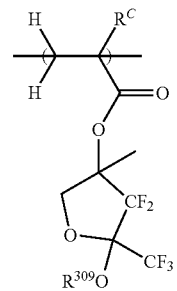

(D4)

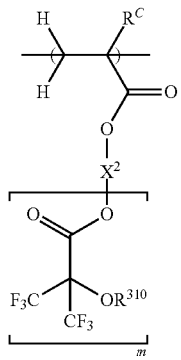

(D5)

Herein $R^C$ is each independently hydrogen or methyl. $R^D$ is each independently hydrogen, fluorine, methyl or trifluoromethyl. $R^{301}$ is hydrogen or a $C_1$-$C_5$ straight or branched hydrocarbyl group in which a heteroatom-containing moiety may intervene in a carbon-carbon bond. $R^{302}$ is a $C_1$-$C_5$ straight or branched hydrocarbyl group in which a heteroatom-containing moiety may intervene in a carbon-carbon bond. $R^{303}$, $R^{304}$, $R^{306}$ and $R^{307}$ are each independently hydrogen or a $C_1$-$C_{10}$ saturated hydrocarbyl group. $R^{305}$, $R^{308}$, $R^{309}$ and $R^{310}$ are each independently hydrogen, a $C_1$-$C_{15}$ hydrocarbyl group, $C_1$-$C_{15}$ fluorinated hydrocarbyl group, or acid labile group. In the hydrocarbyl or fluorinated hydrocarbyl group represented by $R^{305}$, $R^{308}$, $R^{309}$ and $R^{310}$, an ether bond or carbonyl moiety may intervene in a carbon-carbon bond. The subscript x is an integer of 1 to 3, y is an integer satisfying 0≤y≤5+2z−x, z is 0 or 1, m is an integer of 1 to 3. $X^1$ is a single bond, —C(=O)—O— or —C(=O)—NH—. $X^2$ is a $C_1$-$C_{20}$ (m+1)-valent hydrocarbon group or $C_1$-$C_{20}$ (m+1)-valent fluorinated hydrocarbon group.

The positive resist composition may further comprise (E) an organic solvent.

In another aspect, the invention provides a resist pattern forming process comprising the steps of applying the chemically amplified positive resist composition defined above onto a substrate to form a resist film thereon, exposing the resist film patternwise to high-energy radiation, and developing the exposed resist film in an alkaline developer.

Typically, the high-energy radiation is EUV or EB.

In a preferred embodiment, the substrate has the outermost surface of a silicon-containing material. Often, the substrate is a photomask blank.

Also contemplated herein is a photomask blank which is coated with the chemically amplified positive resist composition defined above.

Advantageous Effects of Invention

Owing to the sulfurane or selenurane compound having formula (A1), the chemically amplified positive resist composition of the invention is effective for controlling acid diffusion during the exposure step. When the composition is coated onto a substrate to form a resist film and processed to form a pattern, the resist film exhibits a very high resolution during pattern formation, and forms a pattern with reduced LER and improved CDU. Owing to the repeat units having formula (B1), the polymer has a satisfactory solubility in alkaline developer and the adhesion of the resist film to the substrate is improved.

The pattern forming process using the positive resist composition can form a resist pattern with reduced LER and improved CDU while maintaining a high resolution. The invention is best suited for a micropatterning process, typically EUV or EB lithography.

BRIEF DESCRIPTION OF DRAWINGS

FIG. 3 is a diagram showing the $^1$H-NMR spectrum of Compound Q-B in Synthesis Example 1-2.

DESCRIPTION OF EMBODIMENTS

Figure 1:
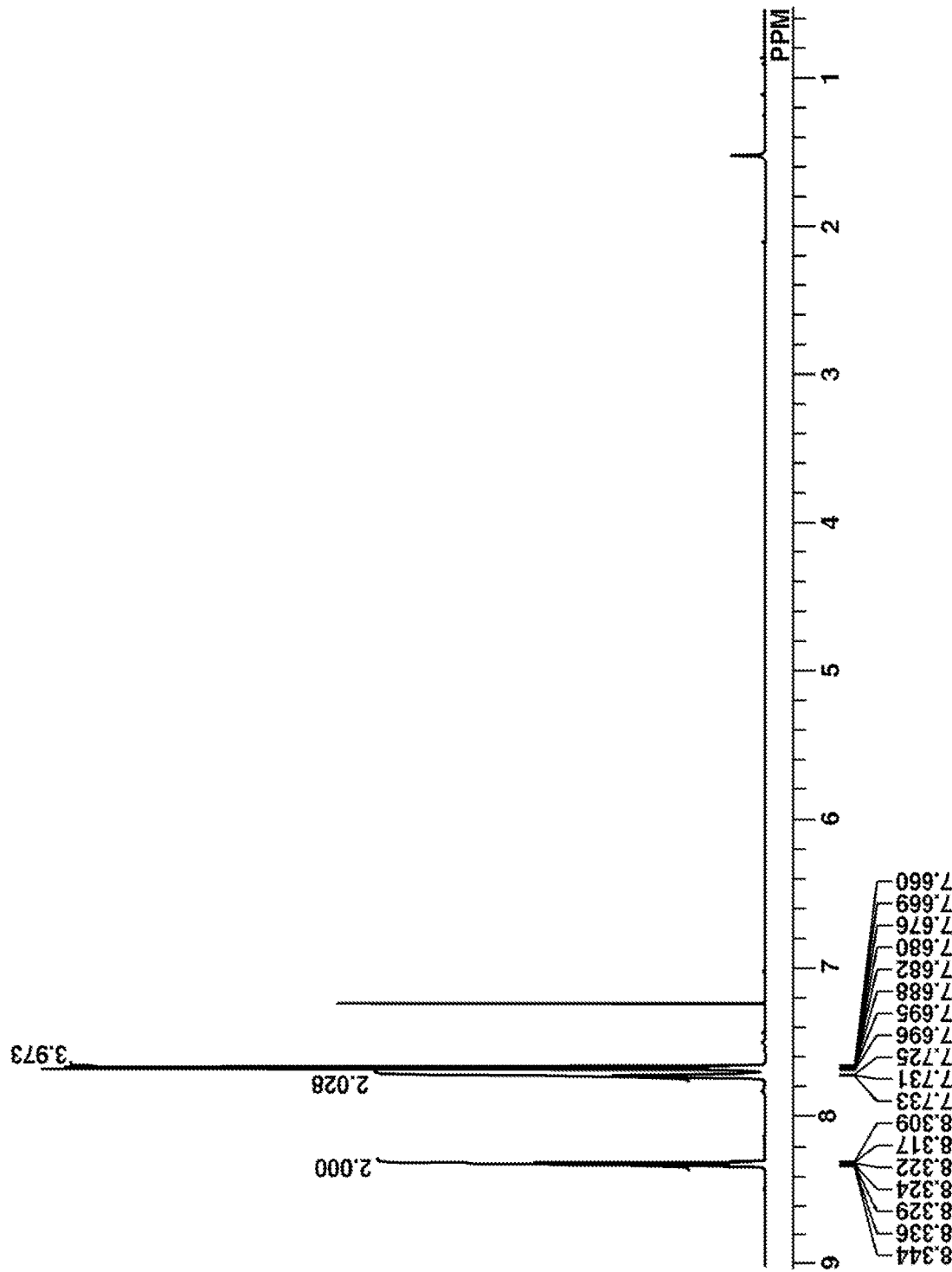
FIG. 1 is a diagram showing the $^1$H-NMR spectrum of Compound Q-A in Synthesis Example 1-1.

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. The terms "group" and "moiety" are interchangeable. In chemical formulae, Me stands for methyl, Ac stands for acetyl, and the broken line designates a valence bond.

The abbreviations and acronyms have the following meaning.

EB: electron beam.
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LER: line edge roughness
CDU: critical dimension uniformity It is understood that for some structures represented by chemical formulae, there can exist enantiomers and diastereomers because of the presence of asymmetric carbon atoms. In such a case, a single formula collectively represents all such isomers. The isomers may be used alone or in admixture.

Positive Resist Composition

One embodiment of the invention is a chemically amplified positive resist composition comprising (A) a specific sulfurane or selenurane compound and (B) a base polymer containing a specific polymer.

(A) Sulfurane or Selenurane Compound

The sulfurane or selenurane compound as component (A) has the formula (A1).

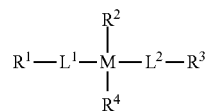

In formula (A1), $R^1$ to $R^4$ are each independently a $C_1$-$C_{20}$ hydrocarbyl group which may contain a heteroatom. $R^1$ and $R^2$ may bond together to form a ring with $L^1$ and M to which they are attached, $R^1$ and $R^2$, and $R^3$ and $R^4$ may bond together to form Spiro rings with M as the spiro atom. $L^1$ and $L^2$ are each independently —O— or —N(R)—. R is hydrogen or a $C_1$-$C_{20}$ hydrocarbyl group which may contain a heteroatom. M is sulfur or selenium.

The $C_1$-$C_{20}$ hydrocarbyl groups represented by $R^1$ to $R^4$ and R may be saturated or unsaturated and straight, branched or cyclic. Examples thereof include alkyl groups such as methyl, ethyl, propyl, isopropyl, n-butyl, sec-butyl, tert-butyl, tert-pentyl, n-pentyl, n-hexyl, n-octyl, 2-ethylhexyl, n-nonyl and n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, ticyclo[5.2.1.0$^{2,6}$] decanyl, adamantyl, and adamantylmethyl; and aryl groups such as phenyl, naphthyl and anthracenyl. In these groups, some hydrogen may be substituted by a moiety containing, a heteroatom such as oxygen, sulfur, nitrogen or halogen exclusive of fluorine, and a moiety containing a heteroatom such as oxygen, sulfur or nitrogen may intervene in a carbon-carbon bond, so that the group may contain a hydroxy, chlorine, bromine, iodine, cyano, carbonyl, ether bond, thioether bond, ester bond, sulfonic ester bond, carbonate bond, carbamate bond, lactone ring, sultone ring, or carboxylic anhydride.

Illustrative examples of the compound having formula (A1) are shown below, but not limited thereto.

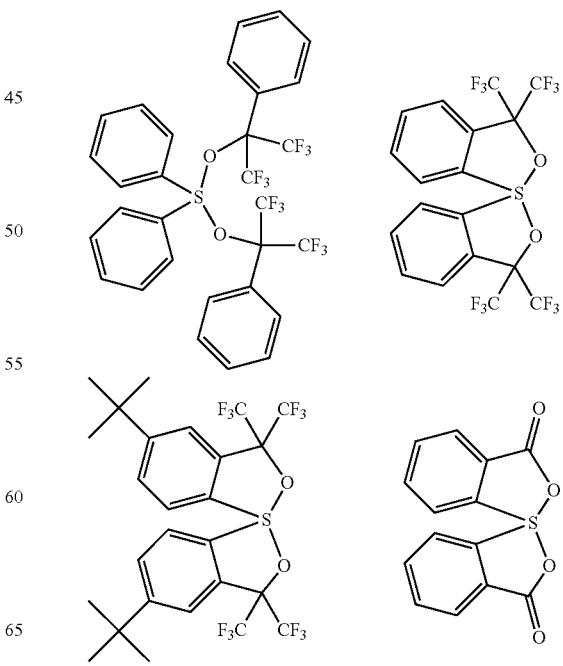

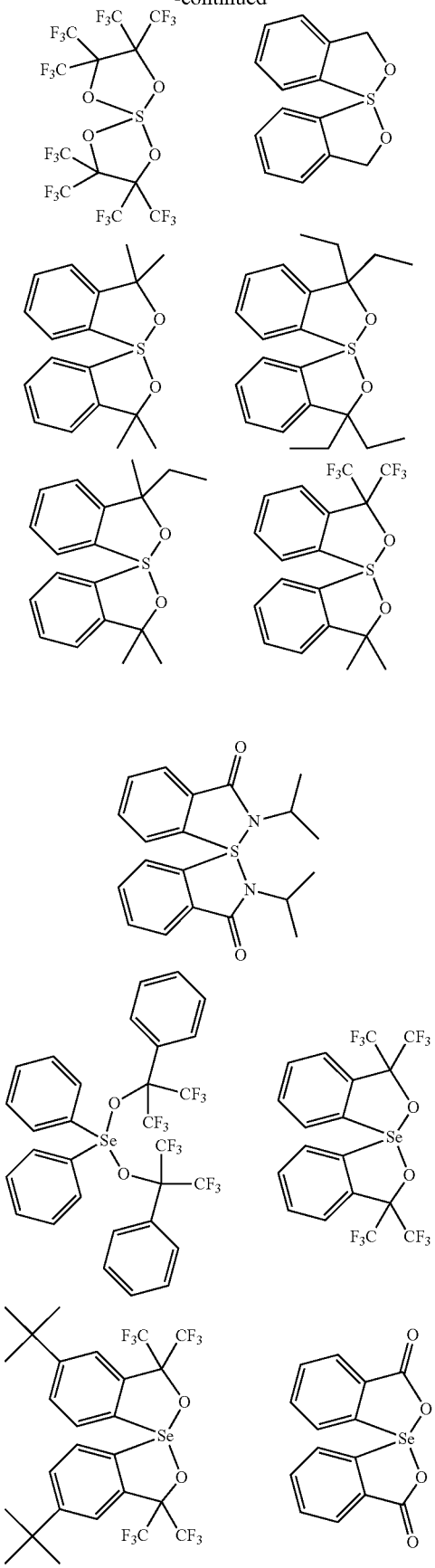
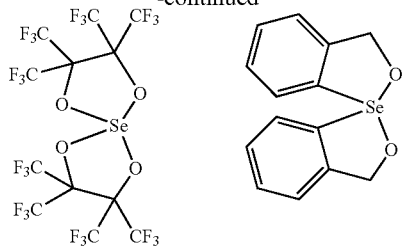
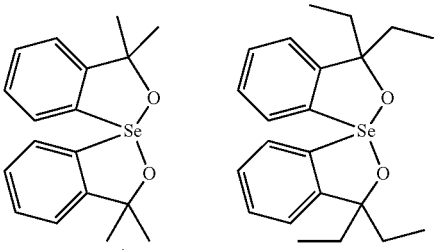
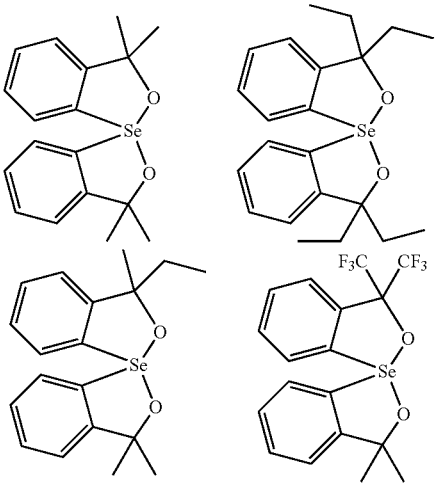
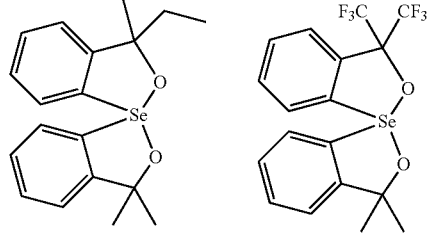
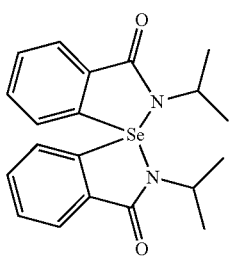 [SMILES: CC(C)N1C(=O)c2ccccc2[Se]12c1ccccc1C(=O)N2C(C)C]

The compound having formula (A1) may be synthesized by a combination of well-known organic chemistry methods, for example, with reference to Journal of the Chemical Society [Section] D: Chemical Communications, 1971, 12, p 649-50. Journal of Organic Chemistry, Vol. 42, No. 25, 1977, p 4006-4016, and Journal of Organic Chemistry, Vol. 46, No. 6, 1981, p 1049-1053.

The compound having formula (A1) functions quite effectively as an acid diffusion inhibitor in a chemically amplified positive resist composition. As used herein, the "acid diffusion inhibitor" is a compound capable of trapping the acid generated from a photoacid generator in the chemically amplified positive resist composition to prevent the acid from diffusing to the unexposed region, for thereby forming the desired pattern.

Although the acid diffusion controlling mechanism of the compound having formula (A1) is not well understood, one assumption is described below. When the acid generated by the PAG acts on the compound, either of M-L$^1$ and M-L$^2$ bonds in the compound is cleaved whereby the compound is converted to a sulfonium cation or selenium cation. The counter anion is a conjugate base of the generated acid, meaning that the generated acid is trapped. As a consequence, the compound having formula (A1) functions as an acid diffusion inhibitor.

Amine compounds are used from the past as the acid diffusion inhibitor in photoresist compositions. The amine compound neutralizes and traps the acid generated by the PAG. The amine compound, however, brings about a dark/bright dimensional difference due to its localization within a resist film and its volatilization from a resist film surface layer (known as chemical flare). It is noted that the term "dark" refers to an area including wide light-shielded portion and "bright" refers to an area including wide exposed portion. The amine compound also causes top-rounded profile rather than the ideal rectangular profile because a film surface layer becomes short of acid diffusion restriction. Although it is possible to prevent volatilization by designing the compound to a high molecular weight to elevate the boiling point, the problem of localization within resist film is left unsolved.

In contrast, the compound having formula (A1) is a highly crystalline, non-volatile sulfurane or selenurane compound, which eliminates the risk of chemical flare. Since the compound having formula (A1) is low polar and highly compatible with the resist casting solvent (e.g., PGMEA), it is presumed that the compound is uniformly distributed within a resist film. This ensures uniform trapping of the generated acid in the exposed region, leading to improvements in LER and CDU.

Also known as the acid diffusion inhibitor other than the amine compound are onium salt type acid diffusion inhibitors. The onium salt type acid diffusion inhibitor is a salt compound of weak acid (the weak acid is, for example, a carboxylic acid or alkane sulfonic acid). It undergoes ion exchange with the strong acid (e.g., α,α'-difluorosulfonic acid) generated by the PAG, thereby trapping the generated acid. A weak acid is created instead which is insufficient to cleave the acid labile group on the base polymer in a photoresist composition. Accordingly, the onium salt of weak acid functions as an acid diffusion inhibitor. Examples of the onium salt type acid diffusion inhibitor include salts of carboxylic acids and sulfonic acids as described in Patent Document 8 and JP-A 2003-005376.

As compared with the amine compounds, the onium salt type acid diffusion inhibitors are effective for improving LER and CDU at the sacrifice of contrast. This is because the acid trapping via ion exchange is not irreversible reaction, but equilibration reaction. That is, insufficient acid diffusion control invites a degradation of contrast.

In contrast, the compound having formula (A1) is effective not only for improving LER and CDU, but also for providing a high contrast and hence, a high resolution. This is because the compound having formula (A1) has a high diffusion control function capable of preventing the once trapped acid from being released again, rather than the equilibration reaction of the onium salt.

In the resist composition, the compound having formula (A1) is preferably present in an amount of 0.1 to 100 parts by weight, more preferably 1 to 80 parts by weight per 80 parts by weight of the base polymer (B) to be described later. As long as the amount of the compound is within the range, a satisfactory acid diffusion controlling function is exerted, and any performance losses such as a lowering of sensitivity and formation of foreign particles due to a shortage of dissolution are avoided. The compound having formula (A1) may be used alone or in admixture of two or more.

B) Base Polymer

The base polymer as component (B) contains a polymer comprising repeat units having the following formula (B1). Notably, the unit having formula (B1) is also referred to as unit (B1).

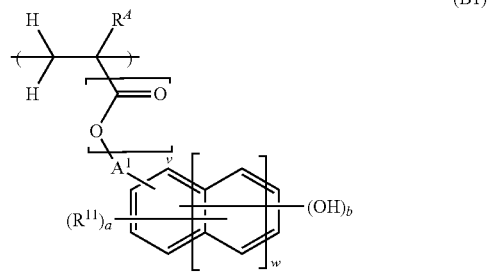

In formula (B1), $R^A$ is hydrogen, fluorine, methyl or trifluoromethyl.

In formula (B1), $R^{11}$ is halogen, an optionally halogenated $C_2$-$C_7$ saturated hydrocarbylcarbonyloxy group, optionally halogenated $C_1$-$C_6$ saturated hydrocarbyl group, or optionally halogenated $C_1$-$C_6$ saturated hydrocarbyloxy group. The saturated hydrocarbyl group and saturated hydrocarbyl moiety in the saturated hydrocarbylcarbonyloxy group and saturated hydrocarbyloxy group may be straight, branched or cyclic. Examples thereof include alkyl groups such as methyl, ethyl, propyl, isopropyl, butyl, pentyl and hexyl; cycloalkyl groups such as cyclopropyl, cyclobutyl, cyclopentyl and cyclohexyl; and combinations thereof. A carbon count within the upper limit ensures a sufficient solubility in alkaline developer. When "a" is 2 or more, a plurality of groups $R^{11}$ may be identical or different.

In formula (B1), $A^1$ is a single bond or a $C_1$-$C_{10}$ saturated hydrocarbylene group in which any constituent —$CH_2$— may be replaced by —O—. The saturated hydrocarbylene group may be straight, branched or cyclic and examples thereof include alkanediyl groups such as methylene, ethane-1,2-diyl, propane-1,3-diyl, butane-1,4-diyl, pentane-1,5-diyl, hexane-1,6-diyl, and structural isomers thereof; cyclic saturated hydrocarbylene groups such as cyclopropanediyl cyclobutanediyl, cyclopentanediyl, and cyclohexanediyl; and combinations thereof. For the saturated hydrocarbylene group containing an ether bond, in case of v=1 in formula (B1), the ether bond may be incorporated at any position excluding the position between the α- and β-carbons relative to the ester oxygen. In case of v=0, the atom bonding to the backbone becomes an ether oxygen atom, and a second ether bond may be incorporated at any position excluding the position between the α- and β-carbons relative to the ether oxygen. Saturated hydrocarbylene groups having no more than 10 carbon atoms are desirable because of a sufficient solubility in alkaline developer.

In formula (B1), v is 0 or 1. The subscript w is an integer of 0 to 2, and the corresponding structure represents a benzene skeleton when w=0, a naphthalene skeleton when w=1, and an anthracene skeleton when w=2. The subscript "a" is an integer in the range: 0≤a≤5+2w−b, and b is an integer of 1 to 3. In case of w=0, preferably "a" is an integer of 0 to 3, and b is an integer of 1 to 3. In case of w=1 or 2, preferably "a" is an integer of 0 to 4, and b is an integer of 1 to 3.

Preferred examples of the repeat units (B1) wherein v=0 and $A^1$ is a single bond (meaning that the aromatic ring is directly bonded to the main chain of the polymer), that is, repeat units free of a linker: —C(=O)—O-$A^1$-include units derived from 3-hydroxystyrene, 4-hydroxystyrene, 5-hydroxy-2-vinylnaphthalene, and 6-hydroxy-2-vinylnaphthalene. More preferred are repeat units having the formula (B1-1).

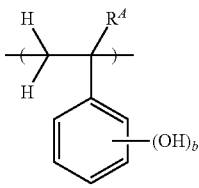

(B1-1)

Herein $R^A$ and b are as defined above.

Preferred examples of the repeat units (B1) wherein v=1, that is, having a linker: —C(=O)—O-$A^1$- are shown below, but not limited thereto.

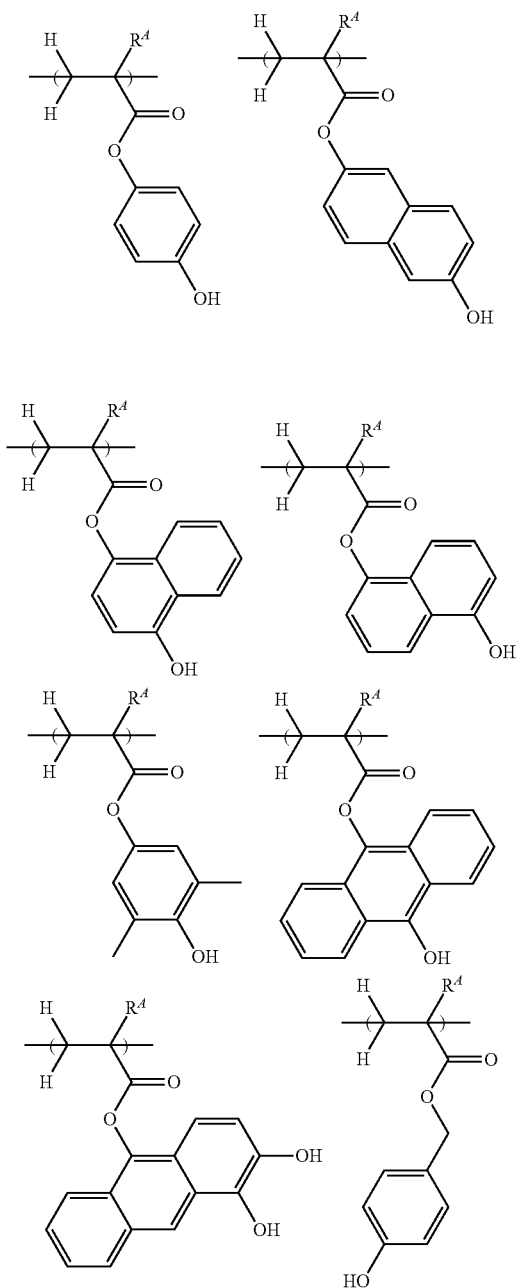

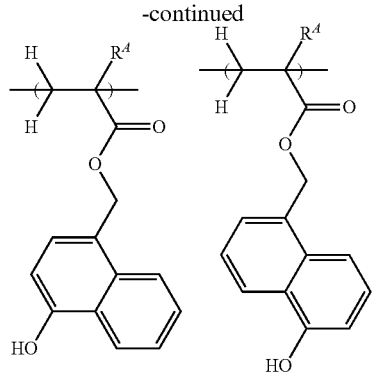

Herein $R^A$ is as defined above.

The content of repeat units (B1) is preferably 10 to 95 mol %, more preferably 40 to 90 mol % based on the overall repeat units of the polymer. It is noted that when the polymer contains repeat units (B3) and/or (B4) for imparting higher etch resistance to the polymer, and these repeat units have a phenolic hydroxy group as the substituent, preferably the content of repeat units (B1) plus repeat units (B3) and/or (B4) fills in the range. The repeat units (B1) may be of one type or a combination of plural types.

For endowing the positive resist composition with such characteristics that the exposed region is dissolved in alkaline aqueous solution, the polymer preferably comprises units having an acidic functional group protected with an acid labile group, that is, units which are protected with an acid labile group and turn alkali soluble under the action of acid. As a result of the acid labile group or protective group in the repeat units undergoing deprotection reaction under the action of acid, the polymer turns fully soluble in alkaline developer.

Of the relevant repeat units, repeat units having the formula (B2) are most preferred, which are also referred to as repeat units (B2), hereinafter.

(B2)

In formula (B2), $R^A$ is hydrogen, fluorine, methyl or trifluoromethyl.

In formula (B2), $R^{12}$ is halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group. The saturated hydrocarbyl group, and saturated hydrocarbyl moiety in the saturated hydrocarbylcarbonyloxy group and saturated hydrocarbyloxy group may be straight, branched or cyclic. Examples thereof include alkyl groups such as methyl, ethyl, propyl, isopropyl, butyl, pentyl and hexyl; cycloalkyl groups such its cyclopropyl, cyclobutyl, cyclopentyl and cyclohexyl; and combinations thereof. A carbon count within the upper limit ensures a sufficient solubility in alkaline developer. When c is 2 or more, a plurality of groups $R^{12}$ may be identical or different.

In formula (B2), $A^2$ is a single bond or $C_1$-$C_{10}$ saturated hydrocarbylene group in which any constituent —$CH_2$— may be replaced by —O—. The saturated hydrocarbylene group may be straight, branched or cyclic. Examples thereof include alkanediyl groups such as methylene, ethane-1,2-diyl, propane-1,3-diyl, butane-1,4-diyl, pentane-1,5-diyl, hexane-1,6-diyl, and structural isomers thereof; cyclic saturated hydrocarbylene groups such as cyclopropanediyl, cyclobutanediyl, cyclopentanediyl, and cyclohexanediyl; and combinations thereof. For the saturated hydrocarbylene croup containing an ether bond, in case of s=1 in formula (B2), the ether bond may be incorporated at any position excluding the position between the α- and β-carbons relative to the ester oxygen. In case of s=0, the atom bonding to the backbone becomes an ether oxygen atom, and a second ether bond may be incorporated at any position excluding the position between the α- and β-carbons relative to the ether oxygen. Saturated hydrocarbylene groups having no more than 10 carbon atoms are desirable because of a sufficient solubility in alkaline developer.

In formula (B2), s is 0 or 1. The subscript t is an integer of 0 to 2: the corresponding structure represents a benzene skeleton when t=0, a naphthalene skeleton when t=1, and an anthracene skeleton when t=2. The subscript c is an integer satisfying 0≤c≤5+2t−e, d is 0 or 1, and e is an integer of 1 to 3. In case t=0, preferably c is an integer of 0 to 3 and e is an integer of 1 to 3; in case t=1 or 2, preferably c is an integer of 0 to 4 and e is an integer of 2 to 3.

In formula (B2), X is an acid labile group when e=1. X is hydrogen or an acid labile group when e=2 or 3, at least one X being an acid labile group. That is, repeat units (B2) are such that at least one phenolic hydroxy group attached to the aromatic ring is protected with an acid labile group, or a carboxy group attached to the aromatic ring is protected with an acid labile group. An adequate group may be selected, without any limits, from those acid labile groups which are commonly used in many well-known chemically amplified resist compositions as long as the group is eliminated under the action of acid to resume an acidic group.

A choice of a tertiary saturated hydrocarbyl group as the acid labile group is preferred for the reason that even when a resist film is formed to a thickness of 10 to 100 nm and processed to form a fine pattern having a line width of up to 45 nm, the pattern has reduced LER. Of the tertiary saturated hydrocarbyl groups, tertiary alkyl groups of 4 to 18 carbon atoms are preferred because the corresponding monomer for use in polymerization is available through distillation. The group attached to the tertiary carbon atom in the tertiary saturated hydrocarbyl group is typically a $C_1$-$C_{15}$ saturated hydrocarbyl group which may contain an oxygen-containing functional group such as ether bond or carbonyl group, and the groups attached to the tertiary carbon atom may bond together to form a ring.

Examples of the group attached to the tertiary carbon atom include methyl, ethyl, propyl, adamantyl, norbornyl, tetrahydrofuran-2-yl, 7-oxanorbornan-2-yl, cyclopentyl, 2-tetrahydrofuryl, tricyclo[5.2.1.0$^{2,6}$]decyl, tetracyclo[4.4.0.1$^{2,5}$1$^{7,10}$]dodecyl, and 3-oxo-1-cyclohexyl.

Examples of the tertiary saturated hydrocarbyl group having such a substituent group include, but are not limited to, tert-butyl, tert-pentyl, 1-ethyl-1-methylpropyl, 1,1-diethylpropyl, 1,1,2trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-isopropylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl-1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

A group having the following formula (B2-1) is also suitable as the acid labile group. The group having formula (B2-1) is often used as the acid labile group. It is a good choice of the acid labile group that ensures to form a pattern having a substantially rectangular pattern-substrate interface in a consistent manner. An acetal structure is formed when X is a group having formula (B2-1).

(B2-1)

In formula (B2-1), $R^{L1}$ is hydrogen or a $C_1$-$C_{10}$ saturated hydrocarbyl group. $R^{L2}$ is a $C_1$-$C_{30}$ saturated hydrocarbyl group. The saturated hydrocarbyl group may be straight, branched or cyclic.

A choice of $R^{L1}$ may depend on the designed sensitivity of labile group to acid. For example, hydrogen is selected when the acid labile group is designed to ensure relatively high stability and to be decomposed with strong acid. A straight alkyl group is selected when the acid labile group is designed to have relatively high reactivity and high sensitivity to pH changes. Although the choice varies with a particular combination of acid generator and basic compound in the resist composition, $R^{L1}$ is preferably a group in which the carbon in bond with acetal carbon is secondary, when $R^{L2}$ is a relatively large alkyl group substituted at the end and the acid labile group is designed to undergo a substantial change of solubility by decomposition. Examples of $R^{L1}$ bonded to acetal carbon via secondary carbon include isopropyl, sec-butyl, cyclopentyl, and cyclohexyl.

In the acetal group, $R^{L2}$ is preferably a $C_7$-$C_{30}$ polycyclic alkyl group fix acquiring a higher resolution. When $R^{L2}$ is a polycyclic alkyl group, a bond is preferably formed between secondary carbon on the polycyclic structure and acetal oxygen. The acetal oxygen bonded to secondary carbon on the cyclic structure, as compared with the acetal oxygen bonded to tertiary carbon on the cyclic structure, ensures that a corresponding polymer becomes a stable compound, suggesting that the resist composition has better shelf stability and is not degraded in resolution. Said acetal oxygen, as compared with $R^{L2}$ bonded to primary carbon via a straight alkyl group of at least one carbon atom, ensures that a corresponding polymer has a higher glass transition temperature (Tg), suggesting that a resist pattern after development is not deformed by bake.

Preferred examples of the group having formula (B2-1) are given below, but not limited thereto. Herein $R^{L1}$ is as defined above.

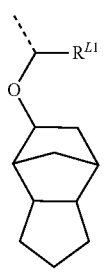

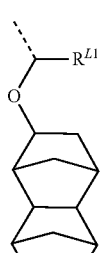

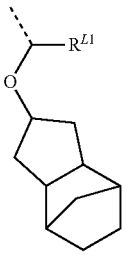

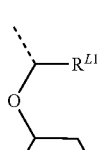

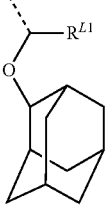

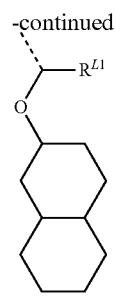

Another choice of acid labile group is a phenolic hydroxy group having hydrogen substituted by —CH$_2$COO— (tertiary saturated hydrocarbyl group). The tertiary saturated hydrocarbyl group used herein may be the same as the aforementioned tertiary saturated hydrocarbyl groups used for the protection of phenolic hydroxy group.

The content of repeat units (B2) is preferably 5 to 45 mol % of the overall repeat units of the polymer. The repeat units (B2) may be of one type or a mixture of two or more types.

In a preferred embodiment, the polymer further comprises repeat units of at least one type selected from units having the formulae (B3), (B4) and (B5), These repeat units are simply referred to as repeat units (B3), (B4) and (B5), respectively.

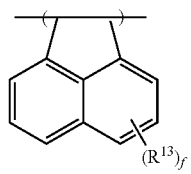
(B3)

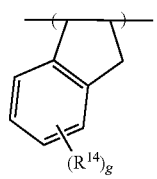
(B4)

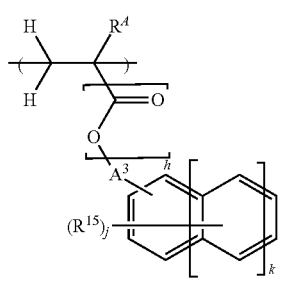
(B5)

In formulae (B3) and (B4), $R^{13}$ and $R^{14}$ are each independently hydroxy, halogen, an optionally halogenated $C_2$-$C_8$ saturated hydrocarbylcarbonyloxy group, optionally halogenated $C_1$-$C_8$ saturated hydrocarbyl group, or optionally halogenated $C_1$-$C_8$ saturated hydrocarbyloxy group. The saturated hydrocarbyl group, saturated hydrocarbyloxy group and saturated hydrocarbylcarbonyloxy group may be straight, branched or cyclic. When f is 2 or more, a plurality of groups $R^{13}$ may be identical or different. When g is 2 or more, a plurality of groups $R^{14}$ may be identical or different.

In formulae (B3) and (B4), f and g are each independently an integer of 0 to 4.

In formula (B4), $R^A$ is as defined above. $R^{15}$ is an acetyl group, $C_1$-$C_{20}$ saturated hydrocarbyl group, $C_1$-$C_{20}$ saturated hydrocarbyloxy group, $C_2$-$C_{20}$ saturated hydrocarbylcarbonyloxy group, $C_2$-$C_{20}$ saturated hydrocarbyloxyhydrocarbyl group, $C_2$-$C_{20}$ saturated hydrocarbylthiohydrocarbyl group, halogen atom, nitro group, cyano group, sulfinyl group or sulfonyl group. The saturated hydrocarbyl group, saturated hydrocarbyloxy group, saturated hydrocarbylcarbonyloxy group, saturated hydrocarbyloxyhydrocarbyl group, and saturated hydrocarbylthiohydrocarbyl group may be straight, branched or cyclic. When j is 2 or more, a plurality of groups $R^{15}$ may be identical or different.

$R^{15}$ is preferably selected from halogen atoms such as chlorine, bromine, and iodine, saturated hydrocarbyl groups such as methyl, ethyl, propyl, butyl, pentyl, hexyl, cyclopentyl, cyclohexyl, and structural isomers thereof, and saturated hydrocarbyloxy groups such as methoxy, ethoxy, propoxy, butoxy, pentyloxy, hexyloxy, cyclopentyloxy, cyclohexyloxy, and structural isomers of their hydrocarbon moiety. Inter alia, methoxy and ethoxy are useful.

Also, a saturated hydrocarbylcarbonyloxy group may be introduced into a polymer even at the end of polymerization by the chemical modification method and is thus advantageously used for fine adjustment of solubility of a base polymer in alkaline developer. Suitable saturated hydrocarbylcarbonyloxy groups include methylcarbonyloxy, ethylcarbonyloxy, propylcarbonyloxy, butylcarbonyloxy, pentylcarbonyloxy, hexylcarbonyloxy, cyclopentylcarbonyloxy, cyclohexylcarbonyloxy, benzoyloxy, and structural isomers of their hydrocarbon moiety. As long as the carbon count is not more than 20, the group is effective for appropriately controlling and adjusting (typically reducing) the solubility of a base polymer in alkaline developer and for preventing scum or development defects from forming.

Of the preferred substituent groups mentioned above, chlorine, bromine, iodine, methyl, ethyl, and methoxy are especially useful because corresponding monomers are readily furnished.

In formula (B5), $A^3$ is a single bond or a $C_1$-$C_{10}$ saturated hydrocarbylene group in which any constituent —$CH_2$— may be replaced by —O—. The saturated hydrocarbylene group rimy be straight, brandied or cyclic. Examples thereof include alkanediyl groups such as methylene, ethane-1,2-diyl, propane-1,3-diyl, butane-1,4-diyl, pentane-1,5-diyl, hexane-1,6-diyl, and structural isomers thereof, cyclic saturated hydrocarbylene groups such as cyclopropanediyl, cyclobutanediyl, cyclopentanediyl, and cyclohexanediyl, and combinations thereof. For the saturated hydrocarbylene group containing an ether bond, in case of h=1 in formula (B5), the ether bond may be incorporated at any position excluding the position between the α- and β-carbons relative to the ester oxygen. In case of h=0, the atom bonding to the backbone becomes an ether oxygen atom, and a second ether bond, may be incorporated at any position excluding the position between the α- and β-carbons relative to the ether oxygen. Saturated hydrocarbylene groups having no more than 10 carbon atoms are desirable because of a sufficient solubility in alkaline developer.

In formula (B5), j is an integer of 0 to 5 and h is 0 or 1. The subscript k is an integer of 0 to 2, and the corresponding structure represents a benzene skeleton when k=0, a naphthalene skeleton when k=1, and an anthracene skeleton when k=2. In case of k=0, preferably j is an integer of 0 to 3. In case of k=1 or 2, preferably j is an integer of 0 to 4.

Preferred examples of the repeat units (B5) wherein h=0 and $A^3$ is a single bond (meaning that the aromatic ring is directly bonded to the main chain of the polymer), that is, repeat units free of a linker: —C(=O)—O-$A^3$- include units derived from styrene, 4-chlorostyrene, 4-bromostyrene, 4-methylstene, 4-methoxystyrene, 4-acetoxystyrene, 2-hydroxypropylstyrene, 2-vinylnaphthalene, and 3-vinylnaphthalene.

Preferred examples of the repeat units (B5) wherein h=1, that is, having a linker: —C(=O)—O-$A^3$- are shown below, but not limited thereto. Herein $R^A$ is as defined above.

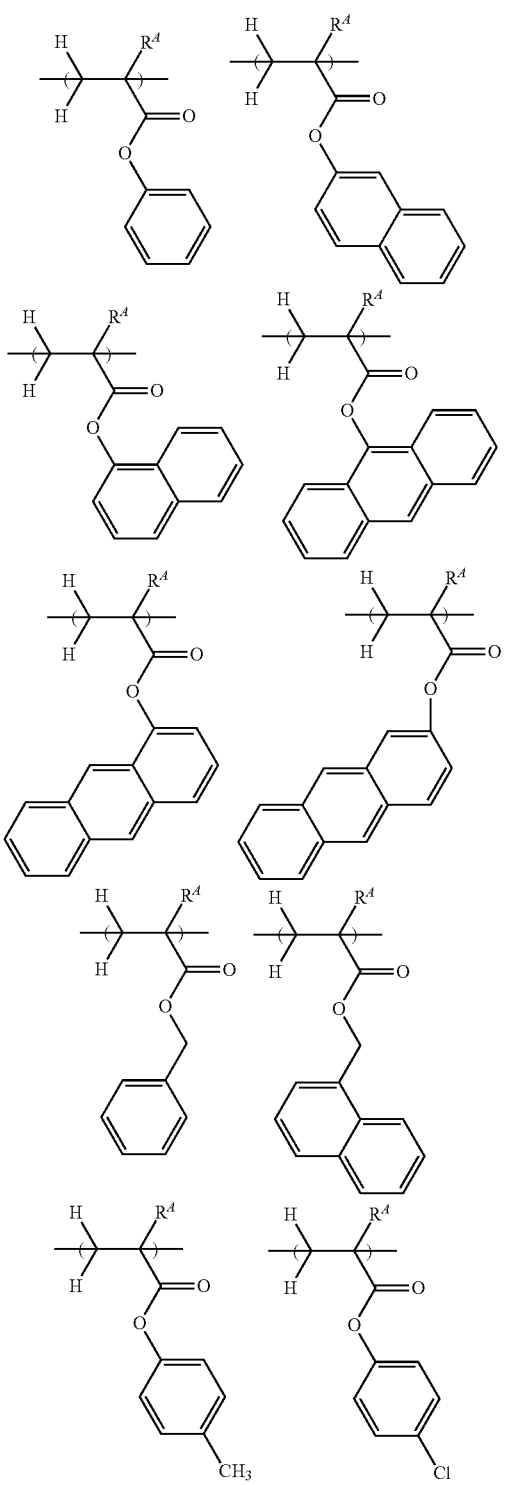

-continued

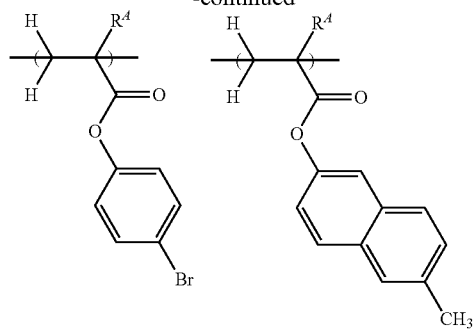
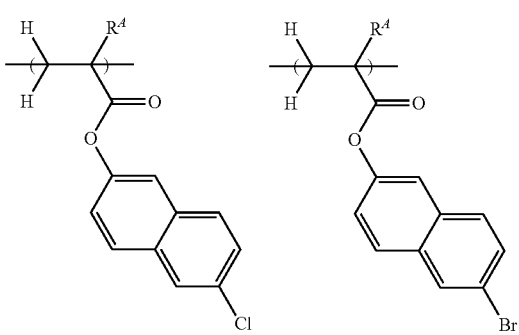
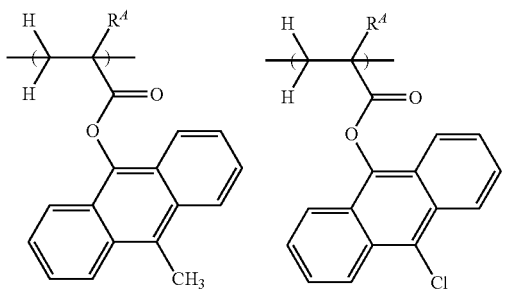
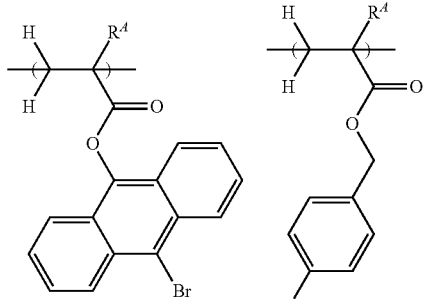
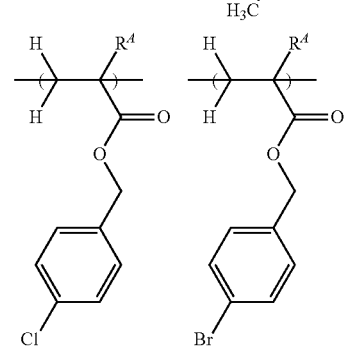

-continued

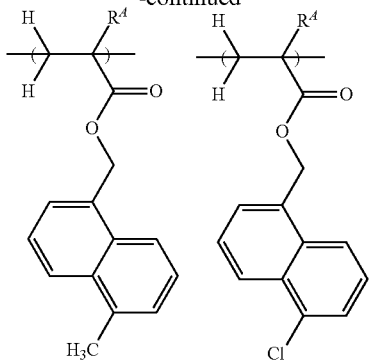
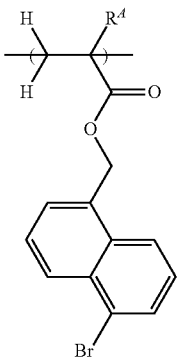

When repeat units of at least one type selected from repeat units (B3) to (B5) are incorporated, better performance is obtained because not only the aromatic ring possesses etch resistance, but the cyclic structure incorporated into the main chain also exerts the effect of improving etch resistance and resistance to EB irradiation during pattern inspection step.

The content of repeat units (B3) to (B5) is preferably at least 5 mol % based on the overall repeat units of the polymer for obtaining the effect of improving etch resistance. Also, the content of repeat units (B3) to (B5) is preferably up to 35 mol %, more preferably up to 30 mol % based on the overall repeat units of the polymer. Their content of up to 35 mol % is preferred because the risk of forming development defects is eliminated. Each of the repeat units (B3) to (B5) may be of one type or a combination of plural types.

It is preferred that the polymer comprise repeat units (B1), repeat units (B2), and repeat units of at least one type selected from repeat units (B3) to (B5), because both etch resistance and high resolution are achievable. The total content of these repeat units is preferably at least 60 mol %, more preferably at least. 70 mol %, even more preferably at least 80 mol % based on the overall repeat units of the polymer.

In another preferred embodiment, the polymer further comprises repeat units of at least one type selected from repeat units having the formula (B6), repeat units having the formula (B7), repeat units having the formula (B8), repeat units having the formula (B9), repeat units having the formula (B10), repeat units having the formula (B11), repeat units having the formula (B12), and repeat units having the formula (B13), shown below. Notably these repeat units are also referred to as repeat units (B6) to (B13). This embodiment achieves effective control of acid diffusion, and forms a pattern with an improved resolution and a reduced LER.

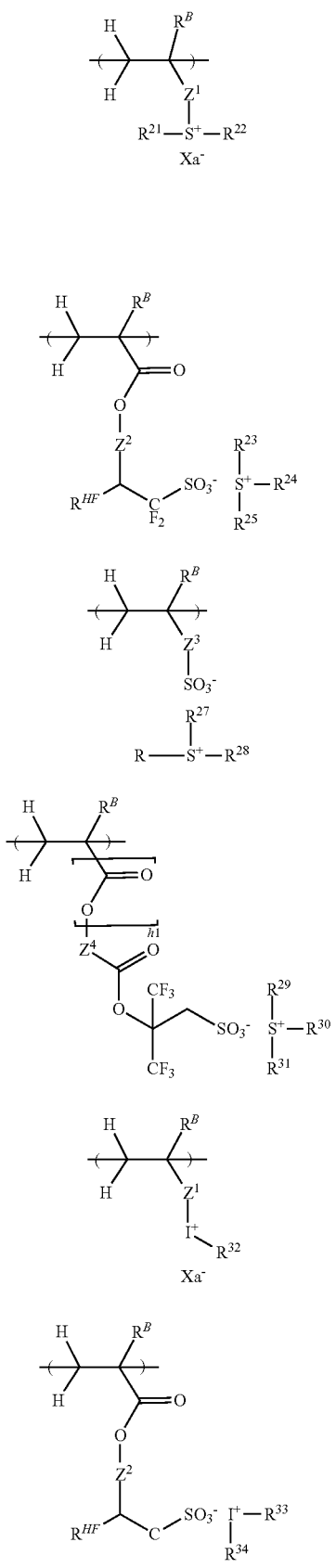
(B6)
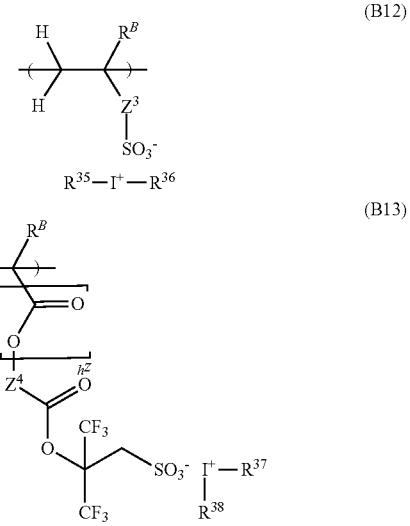
(B7)

(B8)

(B9)

(B10)

(B11)

(B12)

(B13)

In formulae (B6) to (B13), $R^B$ is each independently hydrogen or methyl. $Z^1$ is a single bond, a $C_1$-$C_6$ aliphatic hydrocarbylene group, phenylene group, naphthylene group or $C_7$-$C_{18}$ group obtained by combining the foregoing, —O—$Z^{11}$—, —C(=O)—O—$Z^{11}$—, or —C(=O)—NH—$Z^{11}$—, wherein $Z^{11}$ is a $C_1$-$C_6$ aliphatic hydrocarbylene group, phenylene group, naphthylene group or $C_7$-$C_{18}$ group obtained by combining the foregoing, which may contain a carbonyl moiety, ester bond, ether bond or hydroxy moiety. $Z^2$ is a single bond or —$Z^{21}$—C(=O)—O—, wherein $Z^{21}$ is a $C_1$-$C_{20}$ hydrocarbylene group which may contain a heteroatom. $Z^3$ is a single bond, methylene, ethylene, phenylene, fluorinated phenylene, trifluoromethyl-substituted phenylene, —O—$Z^{31}$—, —C(=O)—O—$Z^{31}$—, or —C(=O)—NH—$Z^{31}$—, wherein $Z^{31}$ is a $C_1$-$C_6$ aliphatic hydrocarbylene group, phenylene group, fluorinated phenylene group, trifluoromethyl-substituted phenylene group, or $C_7$-$C_{20}$ group obtained by combining the foregoing, which may contain a carbonyl moiety, ester bond, ether bond or hydroxy moiety. $Z^4$ is a single bond or $C_1$-$C_{30}$ hydrocarbylene group which may contain a heteroatom h$^1$ and h$^2$ are each independently 0 or 1, h$^1$ and h$^2$ are 0 when $Z^4$ is a single bond.

In formulae (B7) and (B11) wherein $Z^2$ is —$Z^{21}$—C(=O)—O—, $Z^{21}$ is a hydrocarbylene group which may contain a heteroatom. Illustrative, non-limiting examples of the hydrocarbylene group $Z^{21}$ are given below.

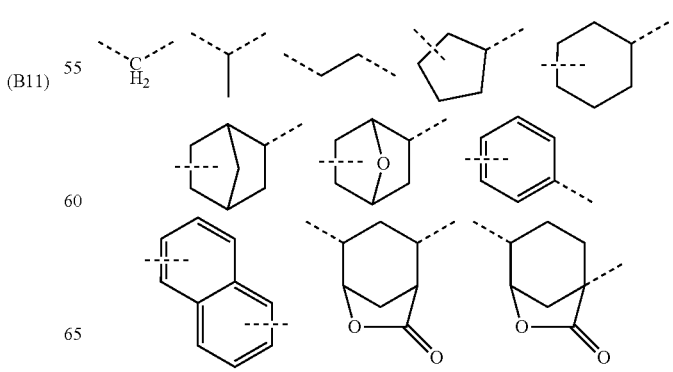

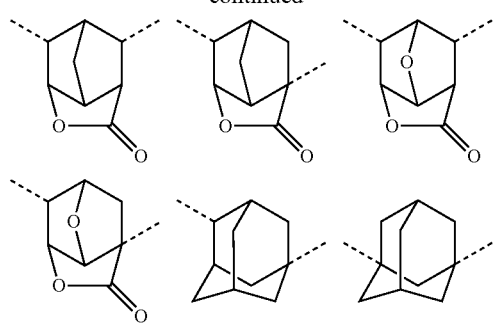

In formulae (B7) and (B11), $R^{HF}$ is hydrogen or trifluoromethyl, Examples of the repeat units (B7) and (B11) wherein $R^{HF}$ is hydrogen are as described in JP-A 2010-116550. Examples of the repeat units (B7) and (B11) wherein $R^{HF}$ is trifluoromethyl are as described in JP-A 2010-077404. Examples of the repeat units (B8) and (B12) are as described in JP-A 2012-246265 and JP-A 2012-246426.

In formulae (B6) and (B10), $Xa^-$ is a non-nucleophilic counter ion. Examples of the non-nucleophilic counter ion $Xa^-$ are as described in JP-A 2010-113209 and JP-A 2007-145797.

Preferred examples of the anion in the monomer from which repeat units (B9) and (B13) are derived are shown below, but not limited thereto.

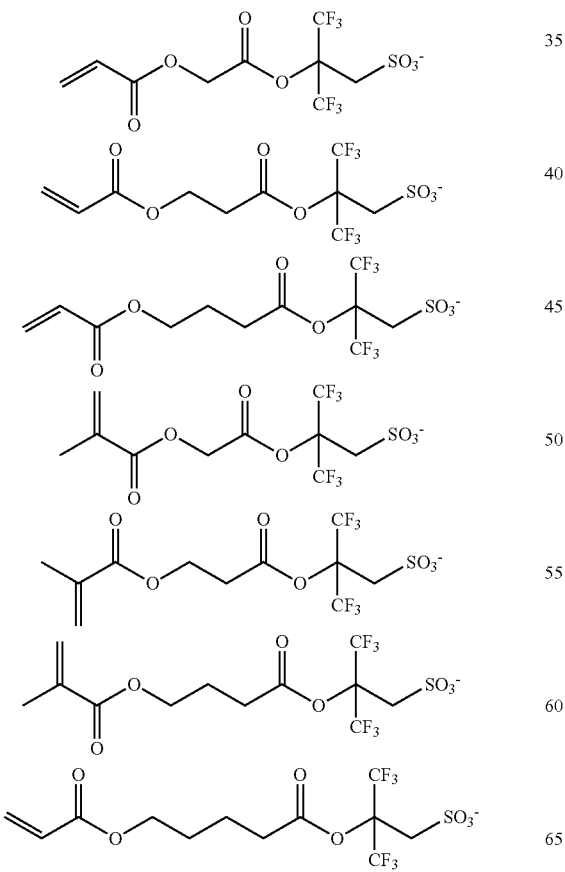

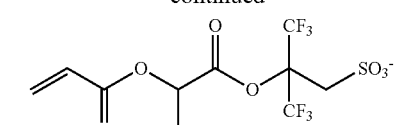
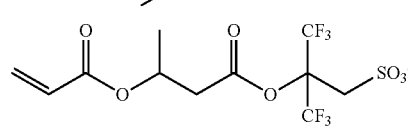
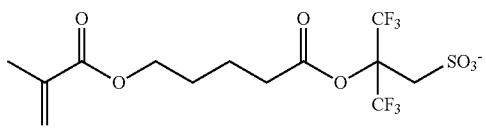
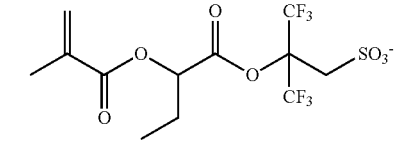
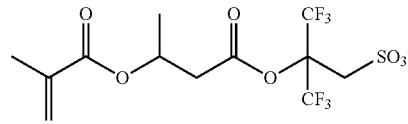
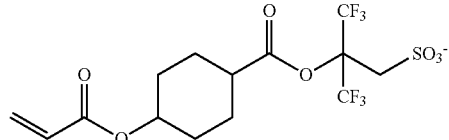
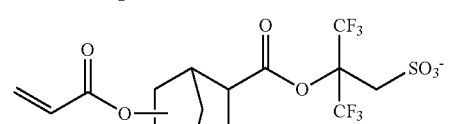
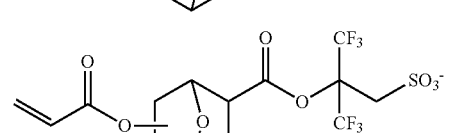
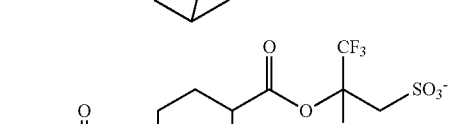
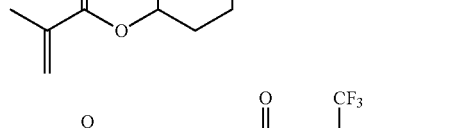
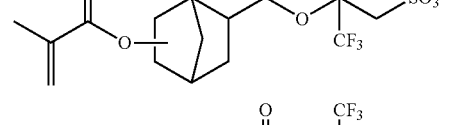

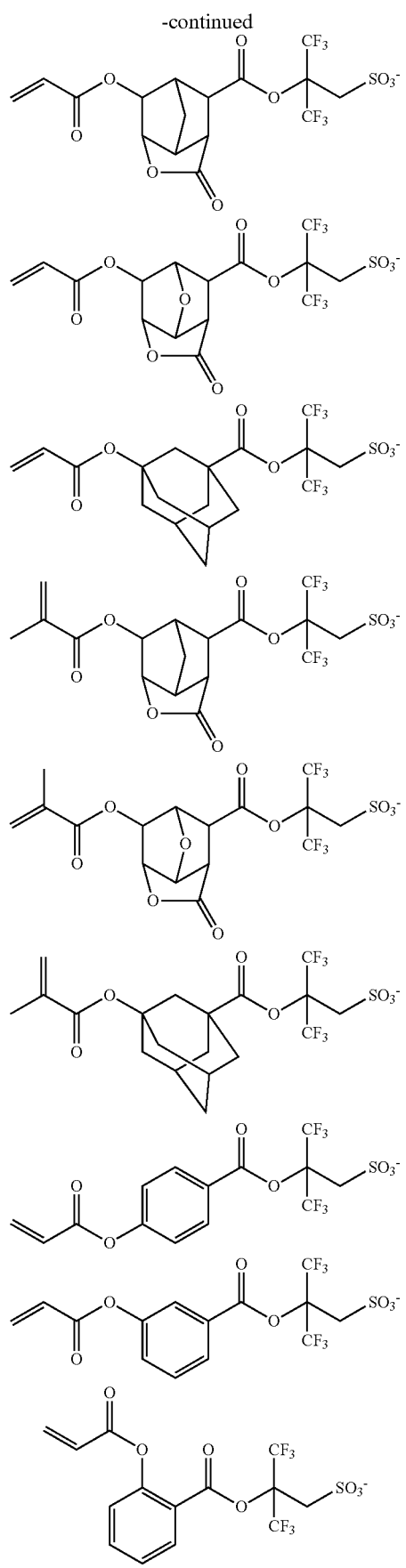

-continued

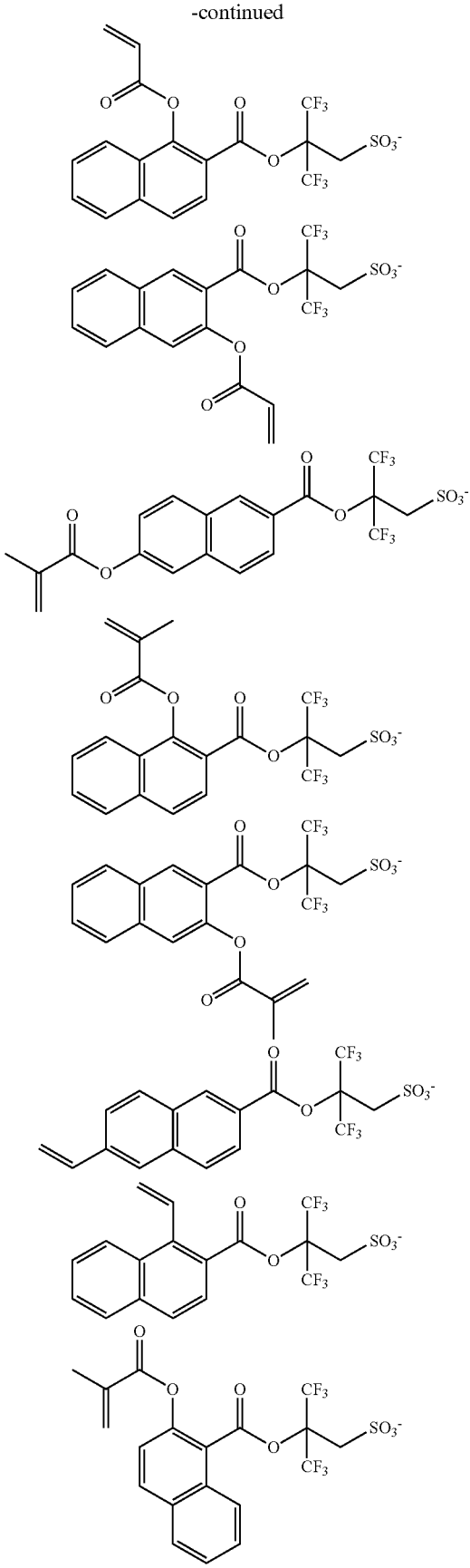

In formulae (B6) to (B13), $R^{21}$ to $R^{38}$ are each independently a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^1$ to $R^4$. In these hydrocarbyl groups, some or all of alae hydrogen atoms may be substituted by a moiety containing a heteroatom such as oxygen, sulfur, nitrogen or halogen, and a moiety containing a heteroatom such as oxygen, sulfur or nitrogen may intervene in a carbon-carbon bond, so that the group may contain a hydroxy, fluorine, chlorine, bromine, iodine, cyano, carbonyl, ether bond, ester bond, sulfonic ester bond, carbonate bond, lactone ring, sultone ring, carboxylic anhydride or haloalkyl moiety.

A pair of $R^{21}$ and $R^{22}$ may bond together to form a ring with the sulfur atom to which they are attached. A pair of $R^{23}$ and $R^{24}$, $R^{26}$ and $R^{27}$, or $R^{29}$ and $R^{30}$ may bond together to form a ring with the sulfur atom to which they are attached. Examples of the ring are shown below.

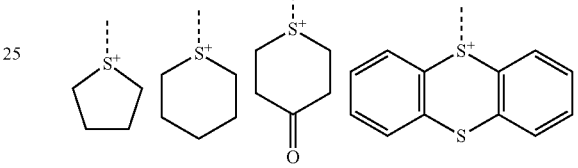

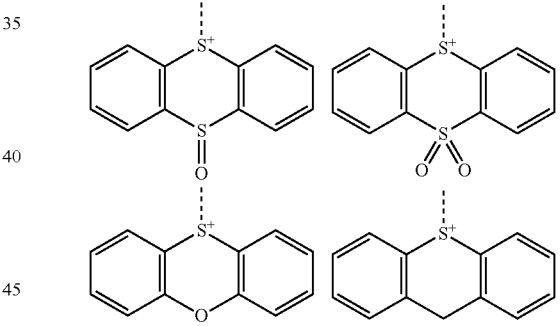

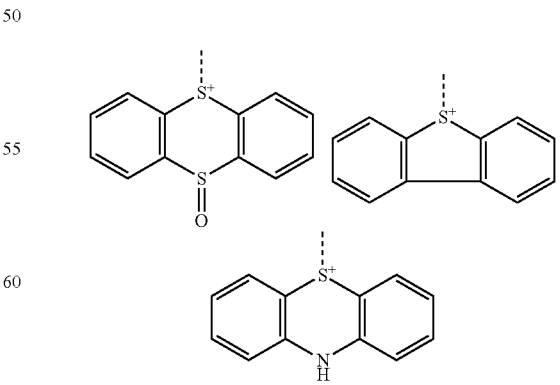

Exemplary structures of the sulfonium cation in formulae (B7) to (B9) are shown below, but not limited thereto.

-continued
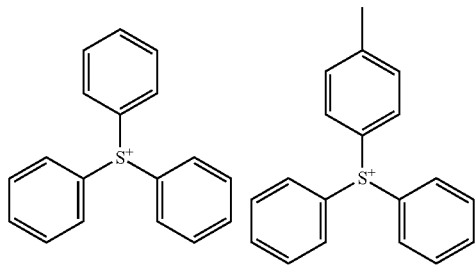
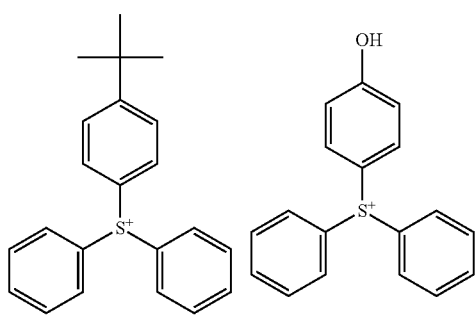
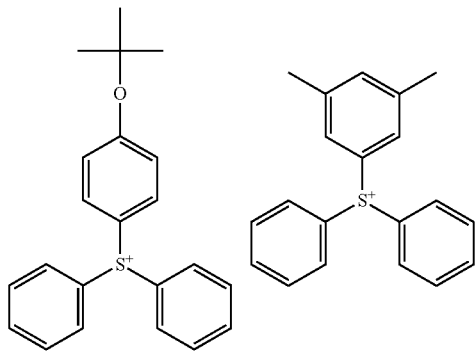
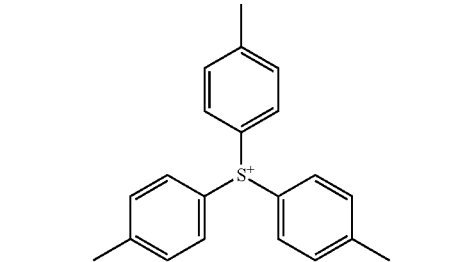
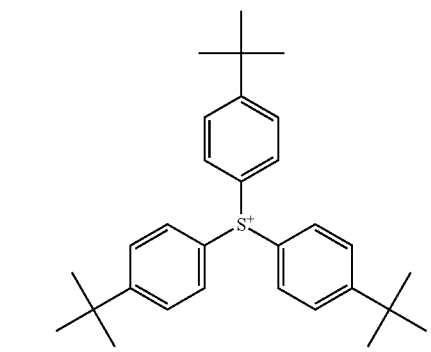
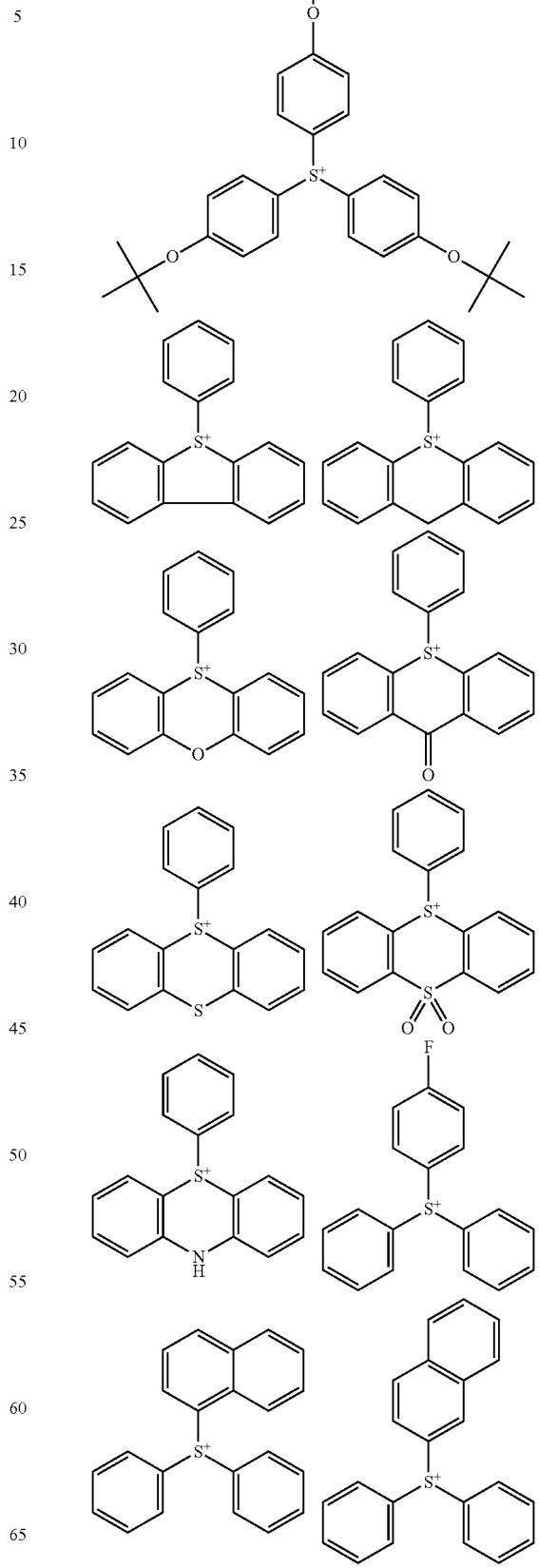

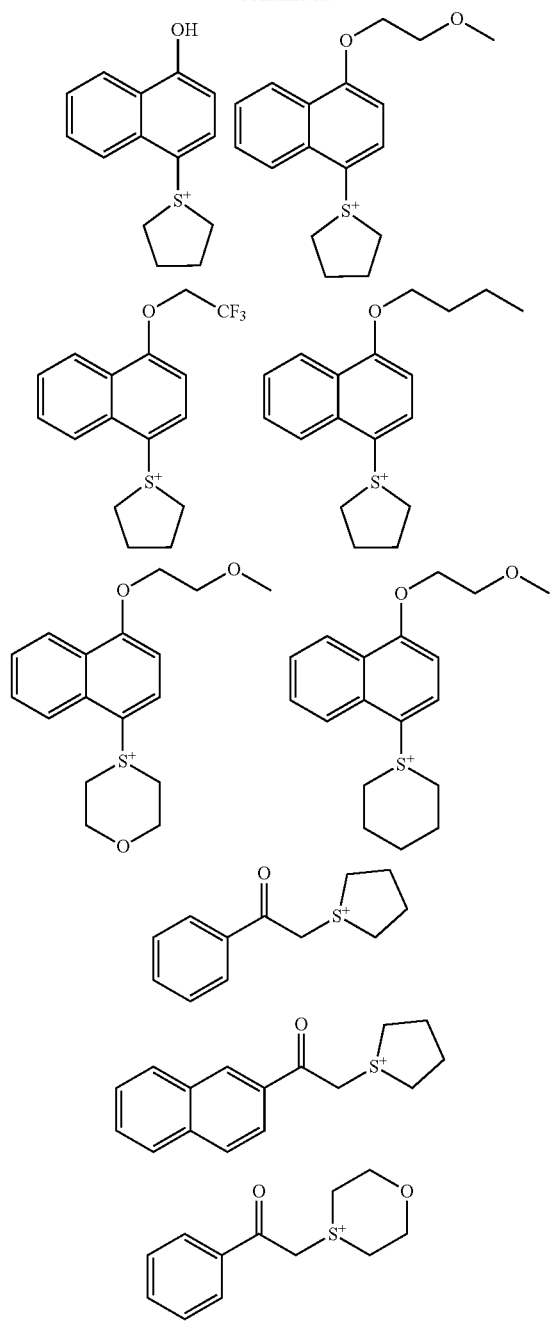
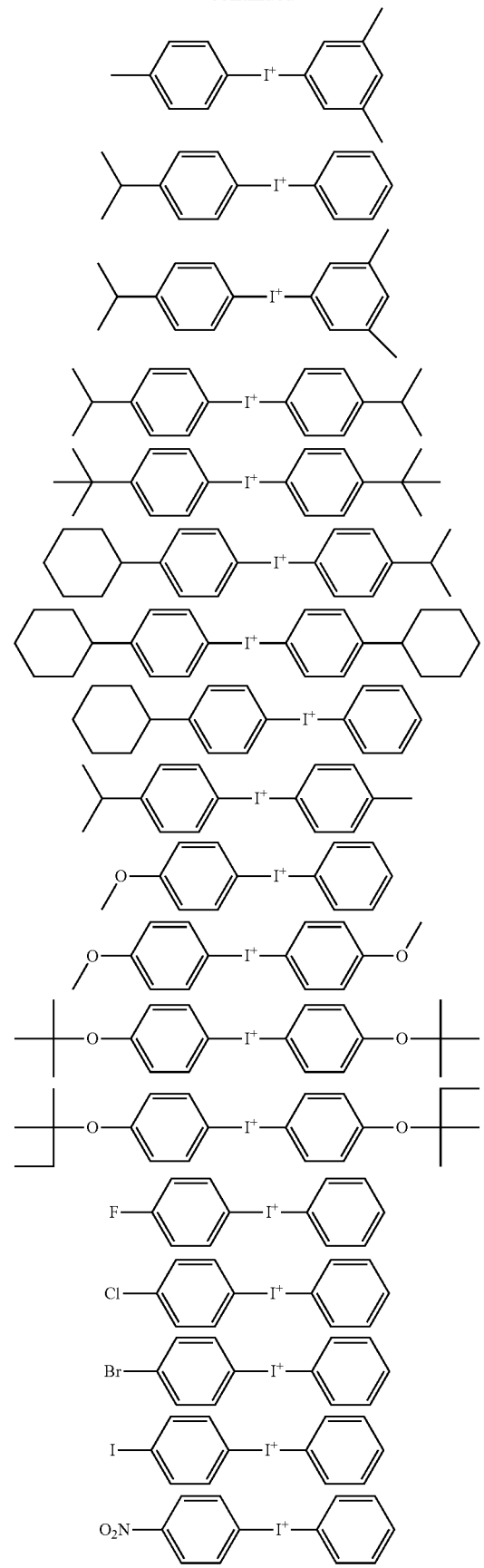
Exemplary structures of the iodonium cation in formulae (B10) to (B13) are shown below, but not limited thereto.
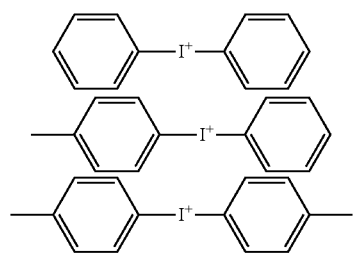

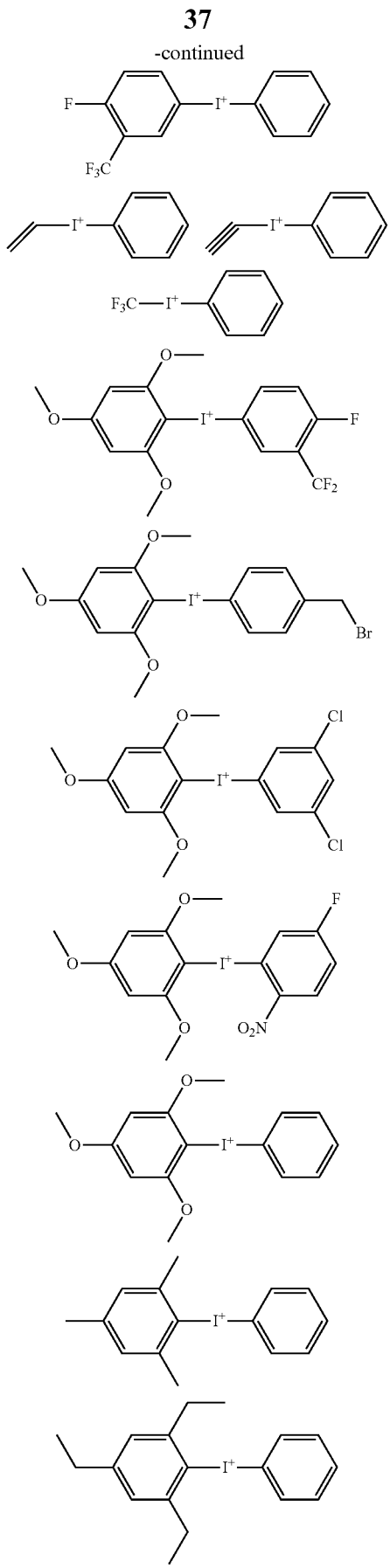

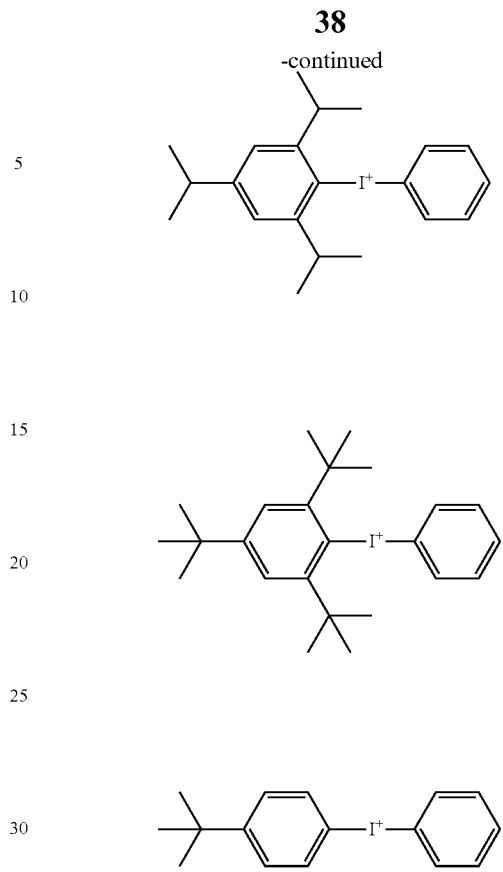

The repeat units (B6) to (B13) are capable of generating an acid upon receipt of high-energy radiation. With the relevant units bound to a polymer, an appropriate control of acid diffusion becomes possible, and a pattern with reduced LER and improved CDU can be formed. Since the acid-generating unit is bound to a polymer, the chemical flare phenomenon that acid volatilizes from the exposed region and re-deposits on the unexposed region during bake in vacuum is suppressed. This is effective for improving LER and CDU and for suppressing unwanted deprotection reaction in the unexposed region for thereby reducing defects. When the repeat units (B6) to (B13) are included, their content is preferably 0.5 to 30 mol % based on the overall repeat units of the polymer. Each of the repeat units (B6) to (B13) may be of one type or a combination of plural types.

The base polymer (B) may be a mixture of a first polymer comprising repeat units (B1) and repeat units (B6) to (B13) and a second polymer comprising repeat units (B1), but not repeat units (B6) to (B13). In the mixture, the amount of the second polymer not containing repeat units (B6) to (B13) is preferably 2 to 5,000 parts by weight, more preferably 10 to 1,000 parts by weight per 100 parts by weight of the first polymer containing repeat units (B6) to (B13).

The polymer may further comprise (meth)acrylate units protected with an acid labile group or (meth)acrylate units having an adhesive group such as lactone structure or hydroxy group other than phenolic hydroxy as commonly used in the art. These repeat units are effective for fine adjustment of properties of a resist film, but not essential.

Examples of the (meth)acrylate unit Laving an adhesive group include repeat units having the following formulae (B14) to (B16), which are also referred to as repeat units (B14) to (B16). While these units do not exhibit acidity, they may be used as auxiliary units for providing adhesion to substrates or adjusting solubility.

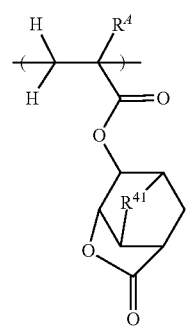

(B14)

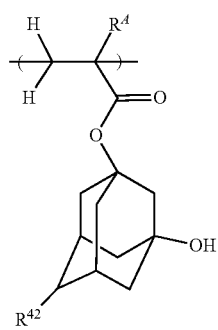

(B15)

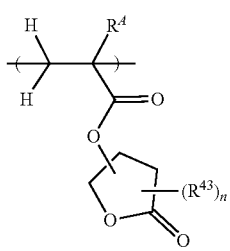

(B16)

In formulae (B14) to (B16), $R^4$ is as defined above. $R^{41}$ is —O— or methylene. $R^{42}$ is hydrogen or hydroxy. $R^{43}$ is a $C_1$-$C_4$ saturated hydrocarbyl group, and n is an integer of 0 to 3.

When the repeat units (B14) to (B16) are included, their content is preferably 0 to 30 mol %, more preferably 0 to 20 mol % based on the overall repeat units of the polymer. Each of the repeat units (B14) to (B16) may be of one type or a combination of plural types.

The polymer may be synthesized by combining suitable monomers optionally protected with a protective group, copolymerizing them in the standard way, and effecting to deprotection reaction if necessary. The copolymerization reaction is preferably radical polymerization or anionic polymerization though not limited thereto. For the polymerization reaction, reference may be made to JP-A 2004-115630, for example.

The polymer should preferably have a Mw of 1,000 to 50,000, and more preferably 2,000 to 20,000. A Mw of at least 1,000 eliminates the risk that pattern features are rounded at their top, inviting degradations of resolution, LER and CDU. A Mw of up to 50.000 eliminates the risk that LER and CDU are degraded when a pattern with a line width of up to 100 nm is formed. As used herein, MW is measured by GPC versus polystyrene standards using tetrahydrofuran (THF) solvent.

The polymer preferably has a narrow molecular weight distribution or dispersity (Mw/Mn) of 1.0 to 2.0, more preferably 1.0 to 1.8. A polymer with such a narrow dispersity eliminates the risk that foreign particles are left on the pattern after development and the pattern profile is aggravated.

(C) Photoacid Generator

The chemically amplified positive resist composition may further comprise (C) a photoacid generator (PAG), also referred to as acid generator of addition type. The PAG used herein may be any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators.

Suitable PAGs include nonafluorobutane sulfonate, partially fluorinated sulfonates described in JP-A 2012-189977, paragraphs [0247]-[0251], partially fluorinated sulfonates described in JP-A 2013-101271, paragraphs [0261]-[0265], and those described in JP-A 2008-111103, paragraphs [0122]-[0142] and JP-A 2010-215608, paragraphs [0080]-[0081]. Among others, arylsulfonate and alkanesulfonate type PAGs are preferred because they generate acids having an appropriate strength to deprotect the acid labile group in the repeat units having formula (B2).

The preferred PAGs are compounds having a sulfonium anion of the structure shown below. Notably the cation that pairs with the anion is as exemplified for the sulfonium cation in formulae (B7) to (B9) and the iodonium cation in formulae (B11) to (B13).

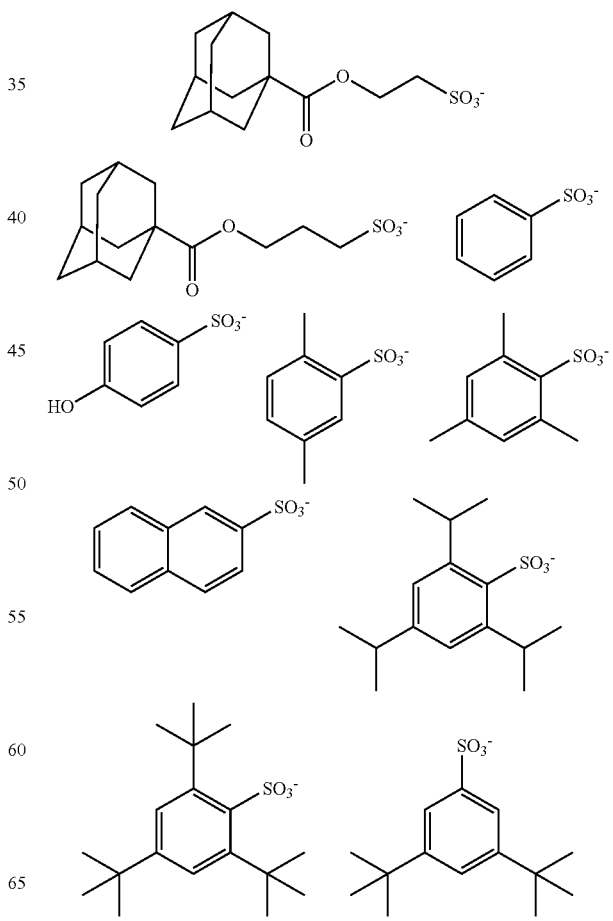

41
-continued
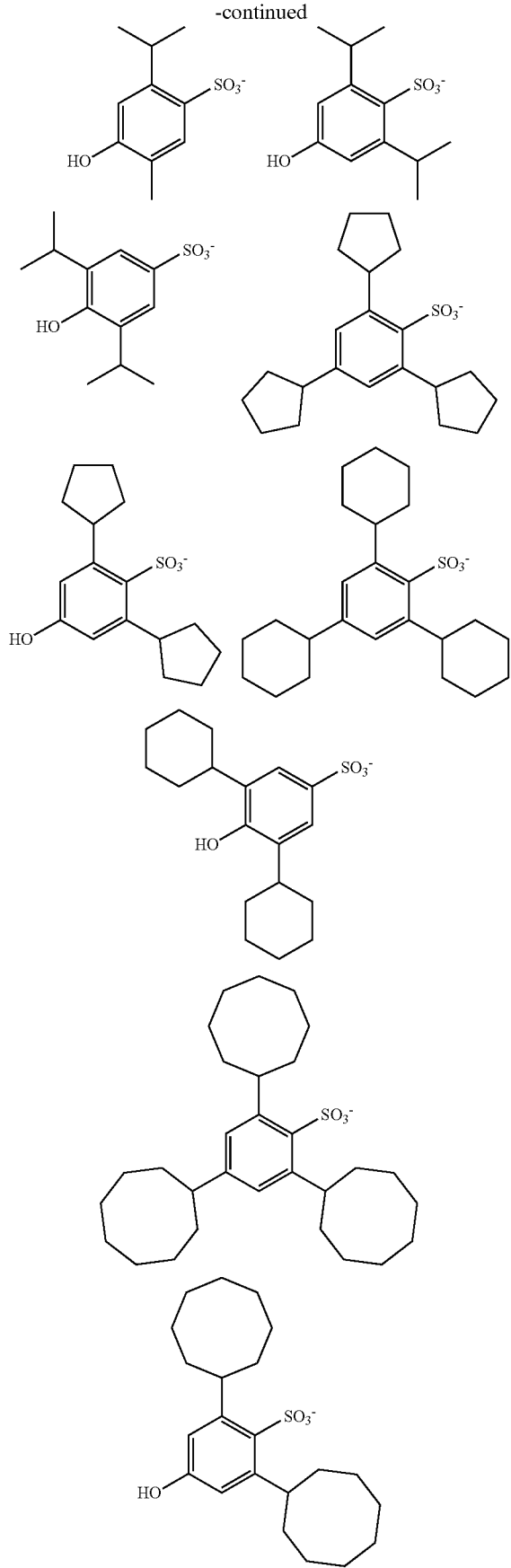
42
-continued
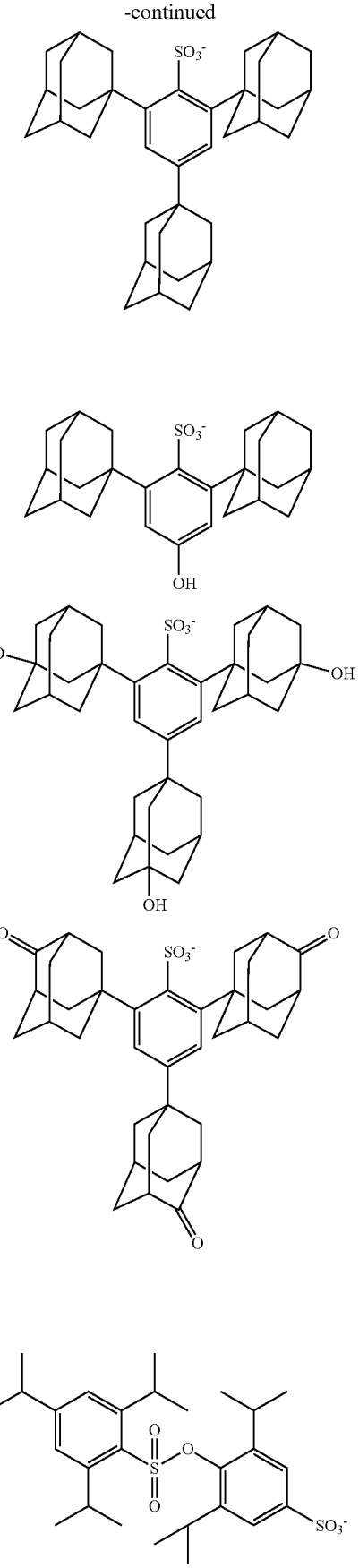

43
-continued
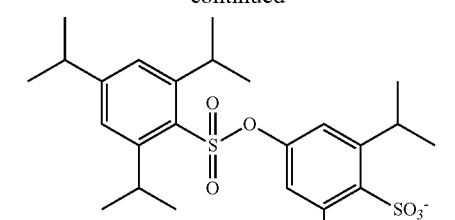
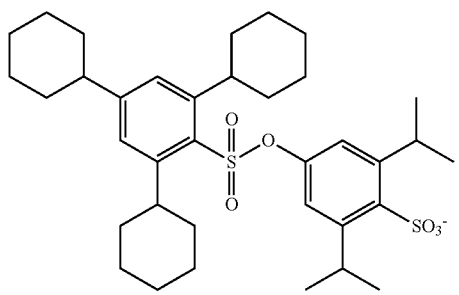
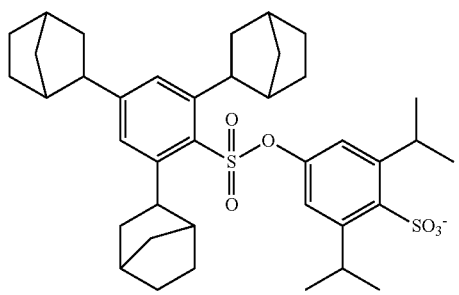
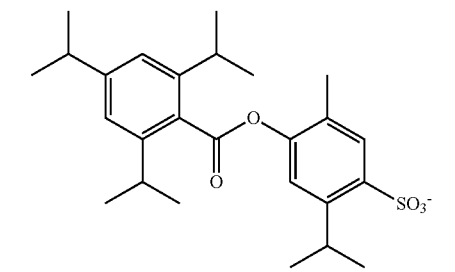
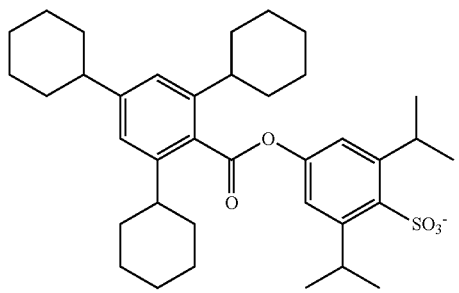
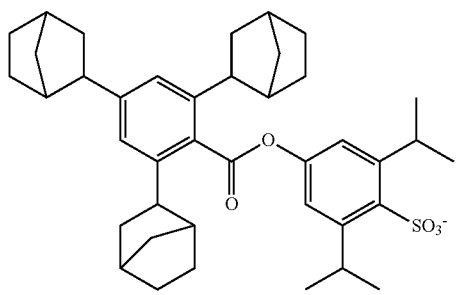
44
-continued
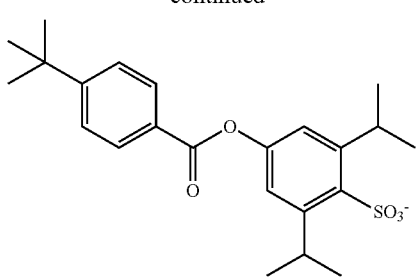
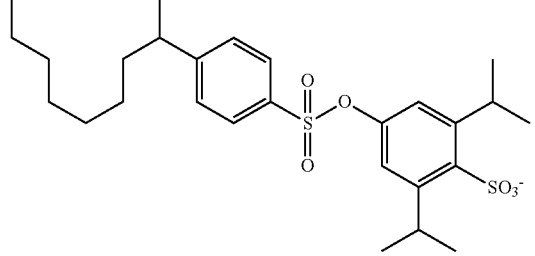
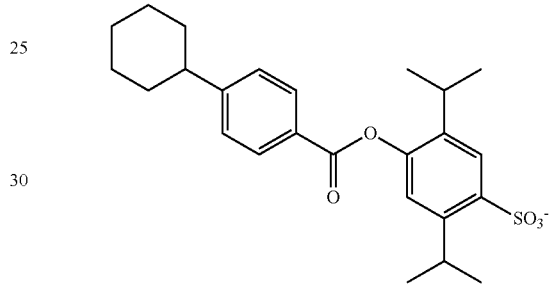
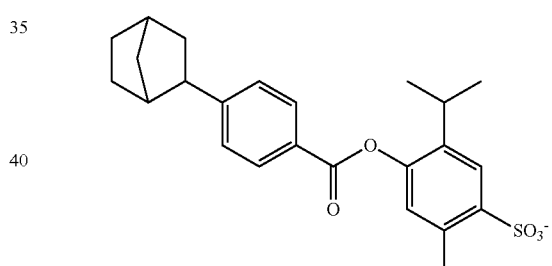
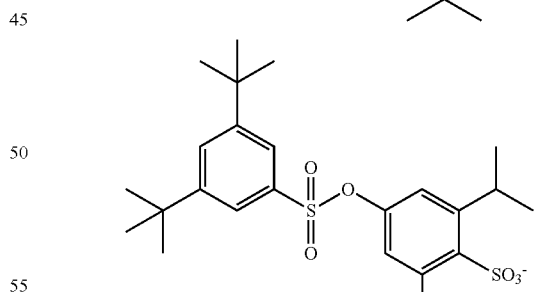
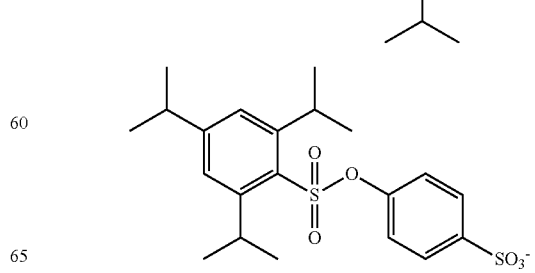

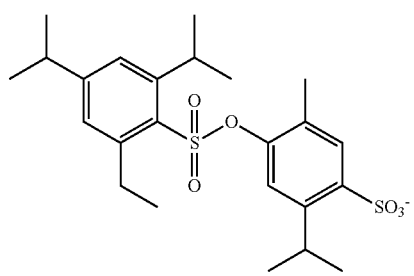
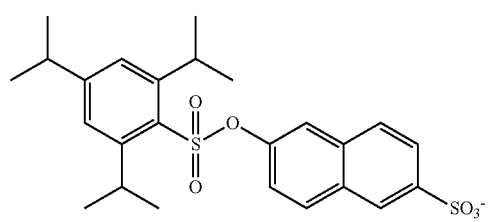
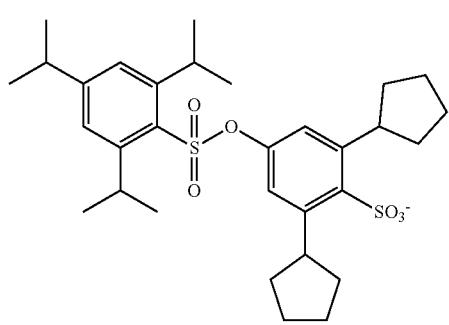
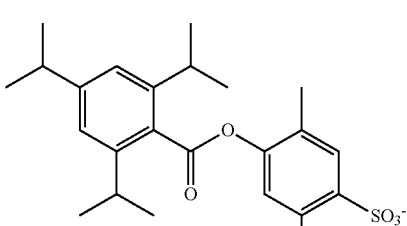
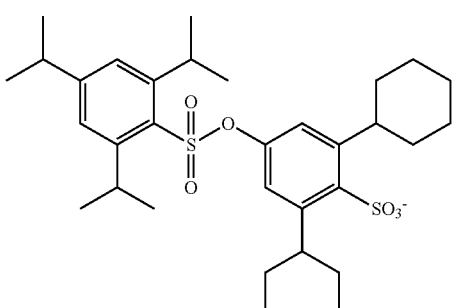
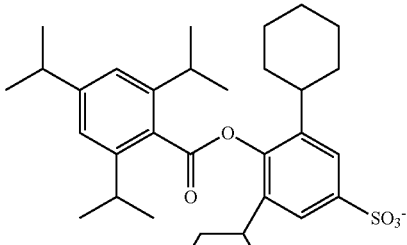
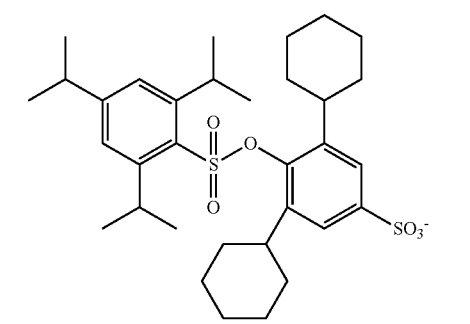
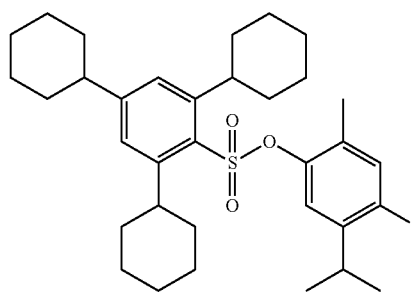
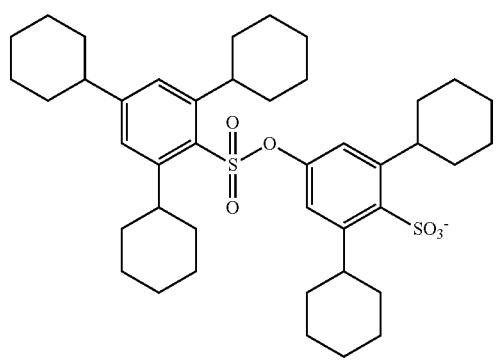
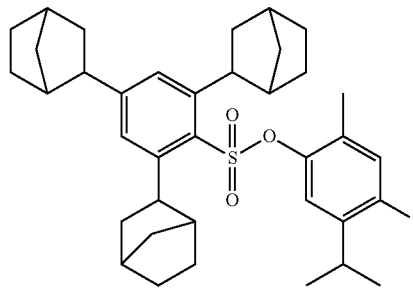
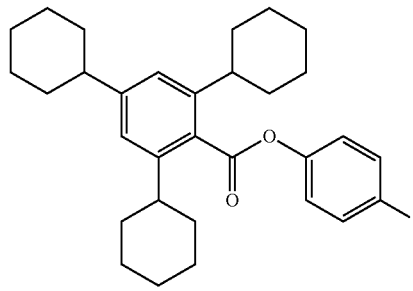

-continued
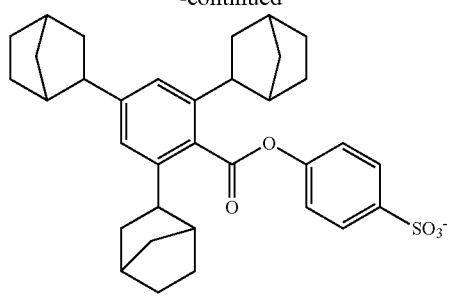
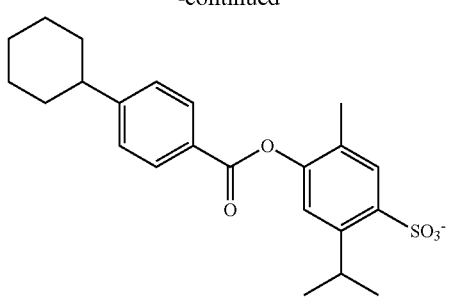
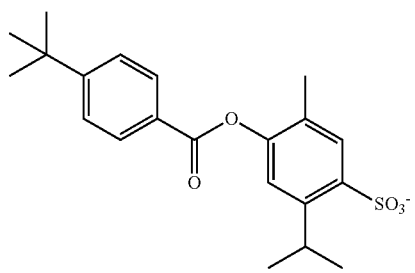
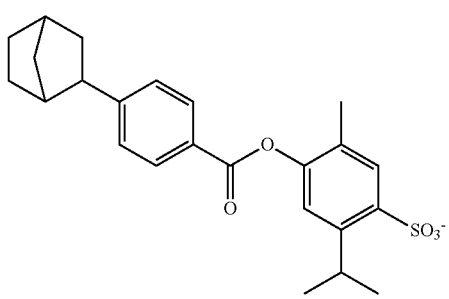
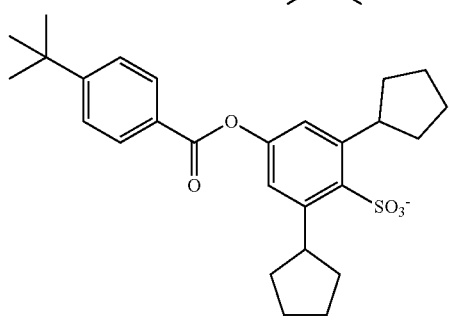
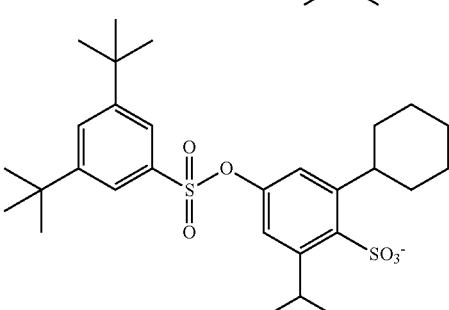
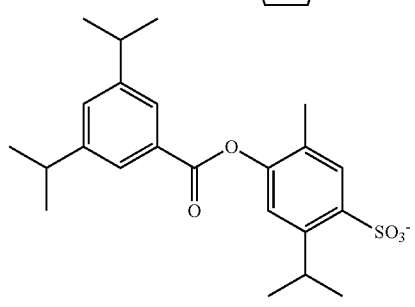
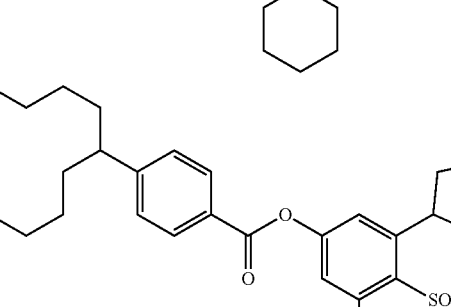
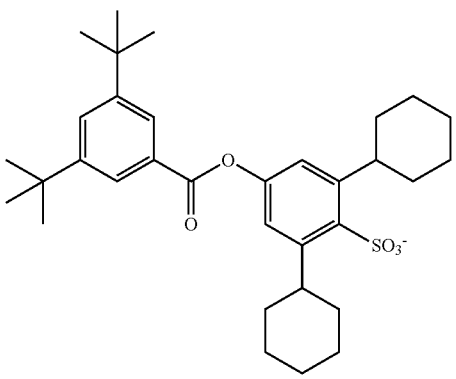
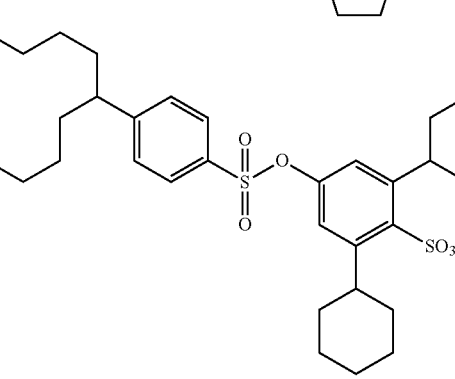

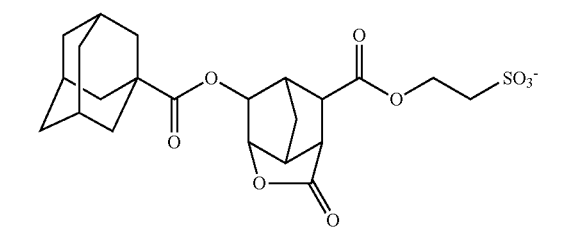
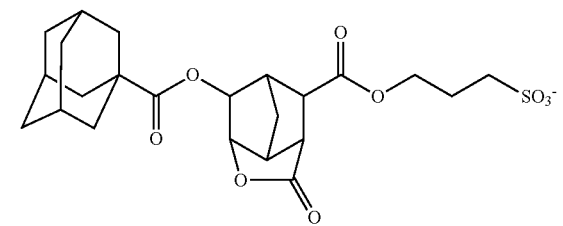
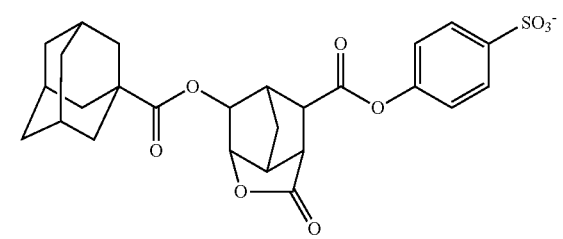
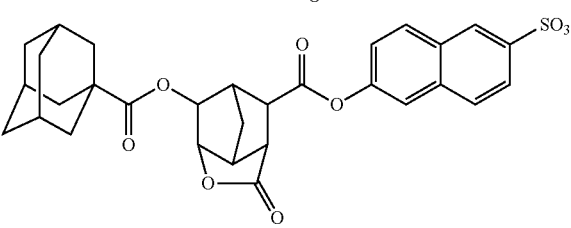
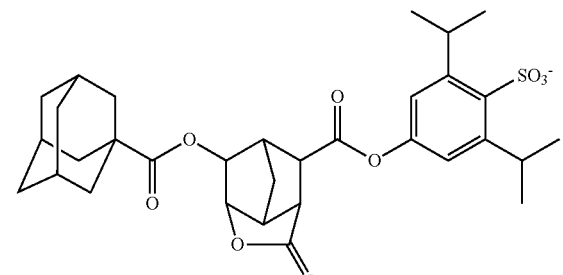
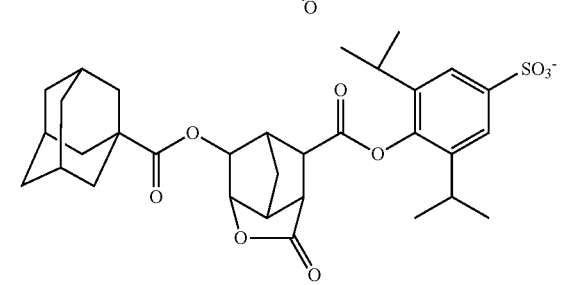
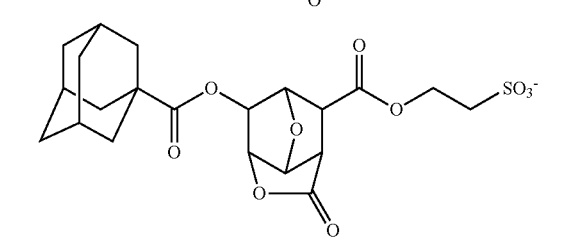
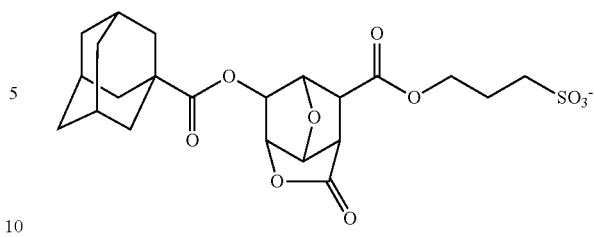
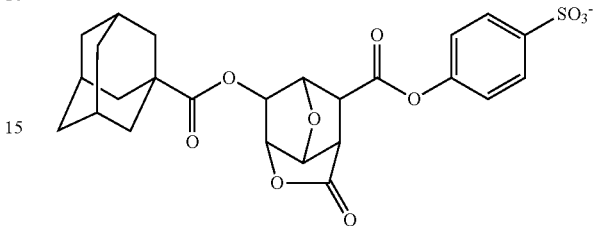
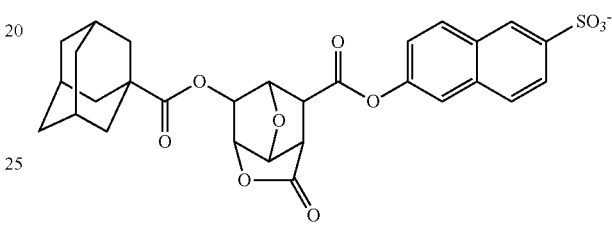
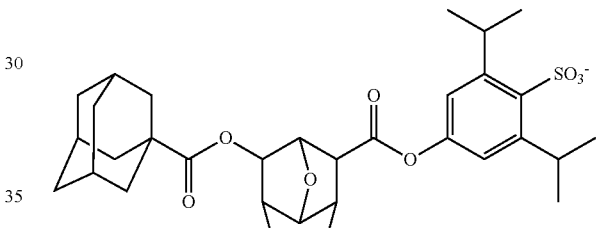
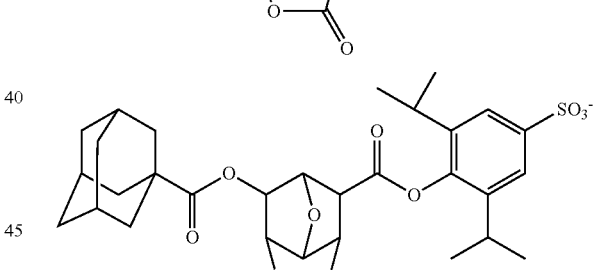
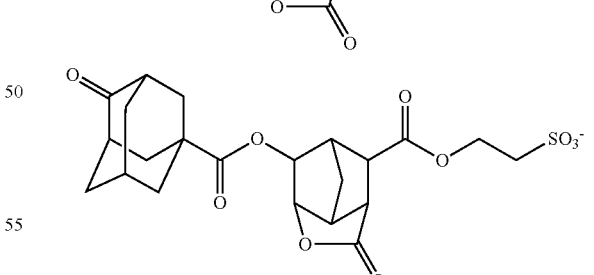
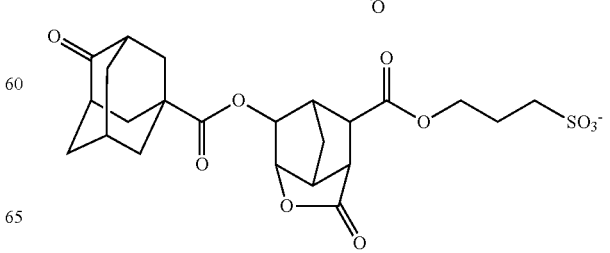

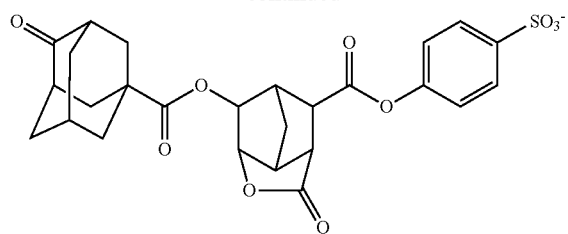
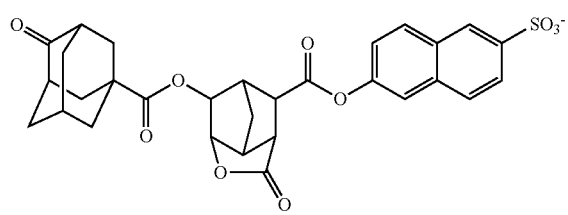
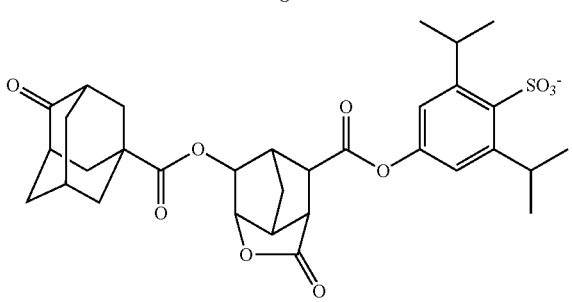
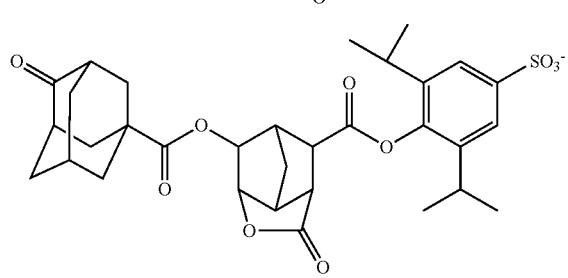
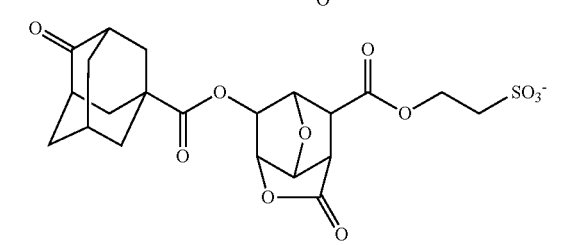
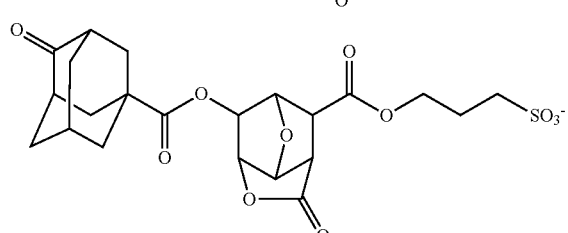
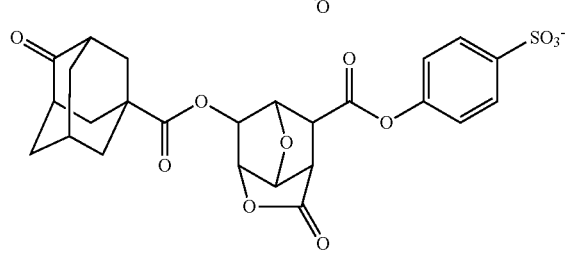
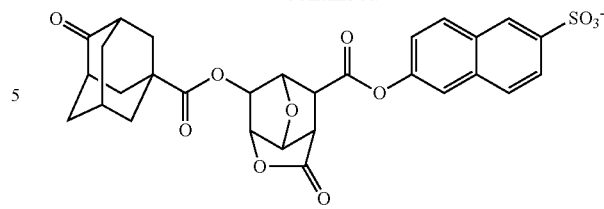
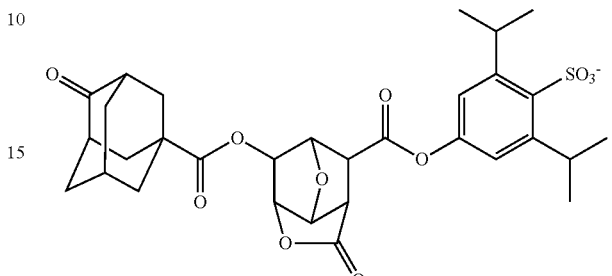
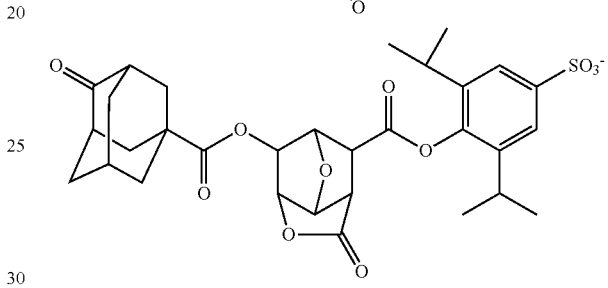
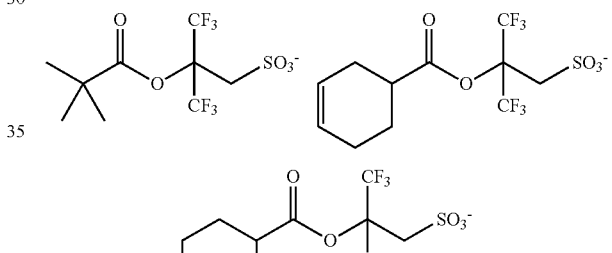
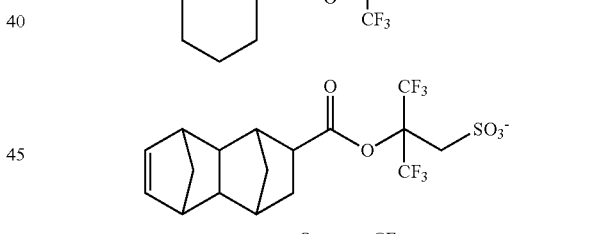
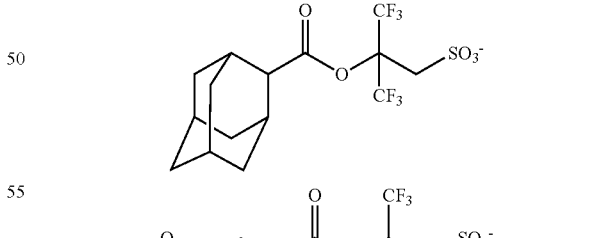
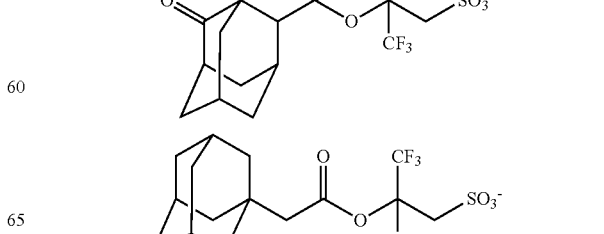

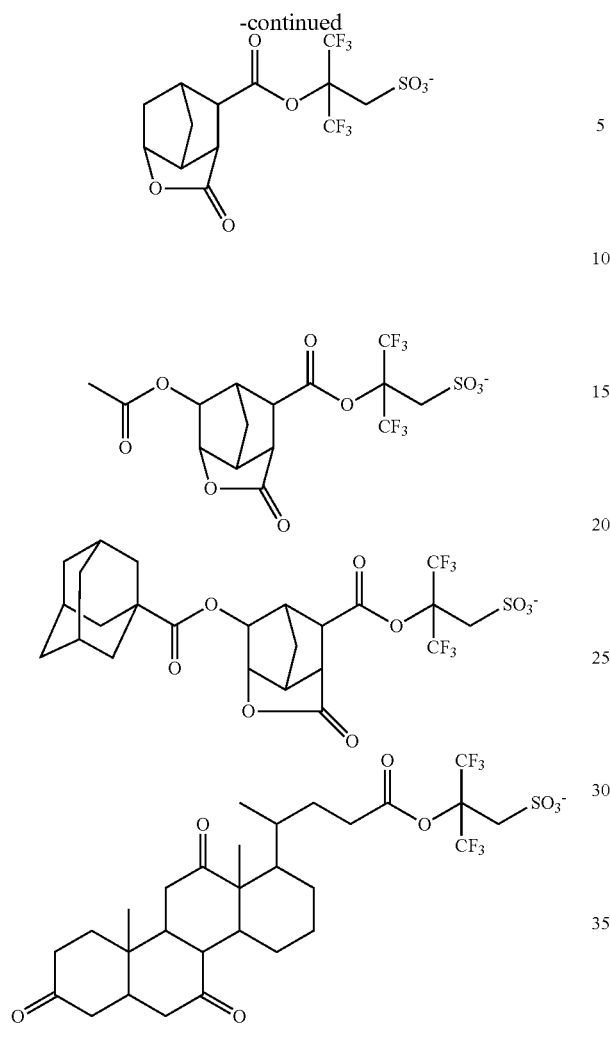

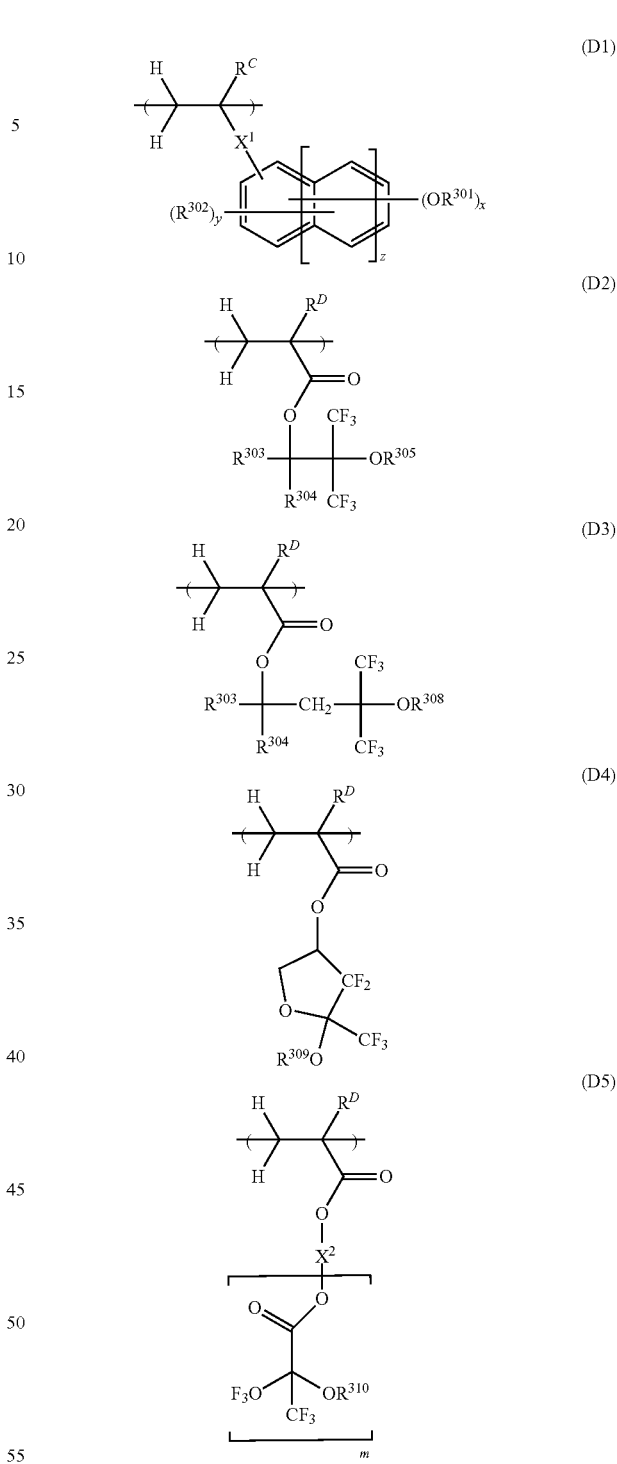

An appropriate amount of the photoacid generator of addition type (C) used is 1 to 30 parts, more preferably 2 to 20 parts by weight per 80 parts by weight of the base polymer (B). Where the base polymer contains repeat units (B6) to (B13) (that is, in the case of polymer-bound acid generator), the acid generator of addition type may be omitted. The photoacid generator may be used alone or in admixture.

(D) Fluorinated Polymer

The positive resist composition may further comprise (D) a fluorinated polymer comprising repeat units having the formula (D1) and repeat units of at least one type selected from repeat units having the formulae (D2), (D3), (D4), and (D5), for the purposes of enhancing contrast, preventing chemical flare of acid upon exposure to high-energy radiation, preventing mixing of acid from an anti-charging film in the step of coating an anti-charging film-forming material on a resist film, and suppressing unexpected unnecessary pattern degradation. Notably, repeat units having formulae (D1), (D2), (D3), (D4), and (D5) are simply referred to as repeat units (D1), (D2), (D3), (D4), and (D5), respectively. Since the fluorinated polymer also has a surface active function it can prevent insoluble residues from re-depositing onto the substrate during the development step and is thus effective for preventing development defects.

In formulae (D1) to (D5), $R^C$ is each independently hydrogen or methyl. $R^D$ is each independently hydrogen, fluorine, methyl or trifluoromethyl. $R^{301}$ is hydrogen or a $C_1$-$C_5$ straight or branched hydrocarbyl group in which a heteroatom-containing moiety may intervene in a carbon-carbon bond. $R^{302}$ is a $C_1$-$C_5$ straight or branched hydrocarbyl group in which a heteroatom-containing moiety may intervene in a carbon-carbon bond. $R^{303}$, $R^{304}$, $R^{306}$ and $R^{307}$ are each independently hydrogen or a $C_1$-$C_{10}$ saturated hydrocarbyl group. $R^{305}$, $R^{308}$, $R^{309}$ and $R^{310}$ are each independently hydrogen, a $C_1$-$C_{15}$ hydrocarbyl group or fluorinated hydrocarbyl group, or an acid labile group, with the proviso that an ether bond or carbonyl moiety may intervene in a carbon-carbon bond in the hydrocarbyl groups or fluorinated hydrocarbyl groups represented by $R^{305}$, $R^{308}$, $R^{309}$ and $R^{310}$. $X^1$ is a single bond, —C(=O)—O— or —C(=O)—NH—. $X^2$ is a $C_1$-$C_{20}$ (m+1)-valent hydrocarbon group or fluorinated hydrocarbon group. The subscript x is an integer of 1 to 3, y is an integer satisfying $0 \leq y \leq 5+2z-x$, z is 0 or 1, and m is an integer of 1 to 3.

Examples of the $C_1$-$C_5$ hydrocarbyl groups $R^{301}$ and $R^{302}$ include alkyl, alkenyl and alkynyl groups, with the alkyl groups being preferred. Suitable alkyl groups include methyl, ethyl, n-propyl, isopropyl, n-butyl, isobutyl, sec-butyl, and n-pentyl. In these groups, a moiety containing a heteroatom such as oxygen, sulfur or nitrogen may intervene in a carbon-carbon bond.

In formula (D1), —$OR^{301}$ is preferably a hydrophilic group. In this case, $R^{301}$ is preferably hydrogen or a $C_1$-$C_5$ alkyl group in which oxygen intervenes in a carbon-carbon bond.

Examples of the repeat unit (D1) are given below, but not limited thereto. Herein $R^C$ is as defined above.

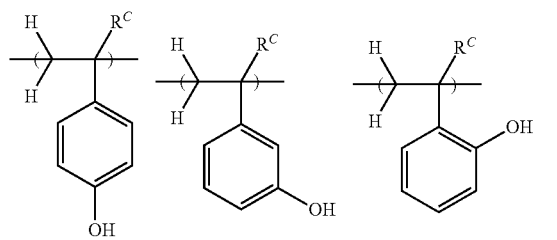

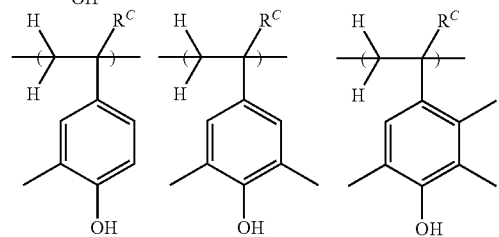

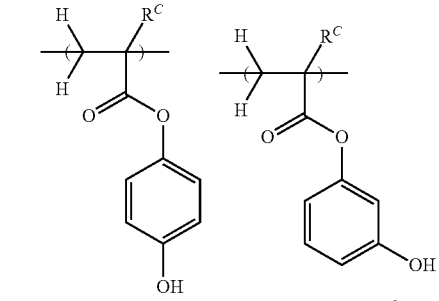

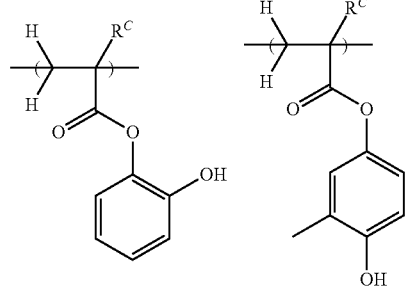

-continued

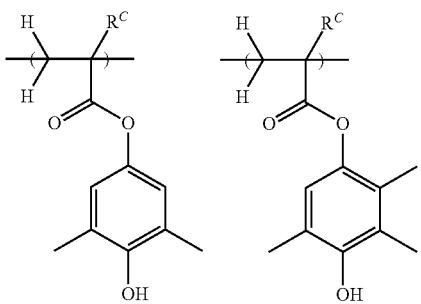

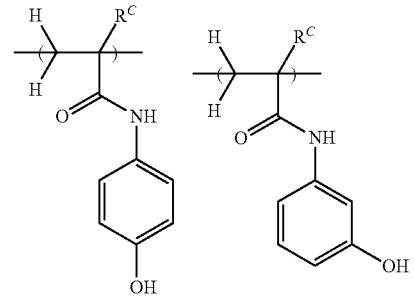

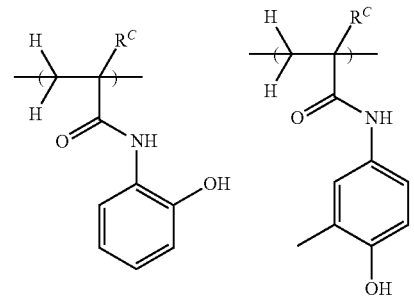

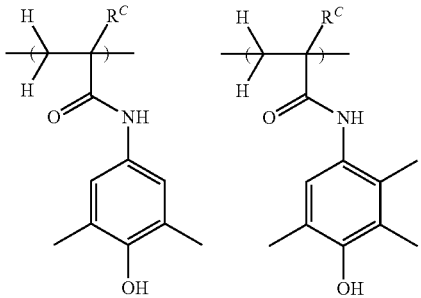

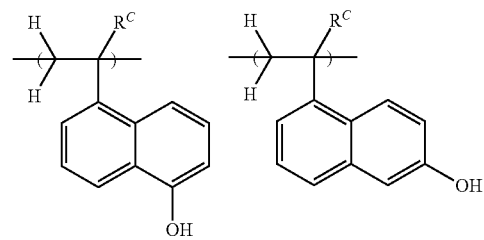

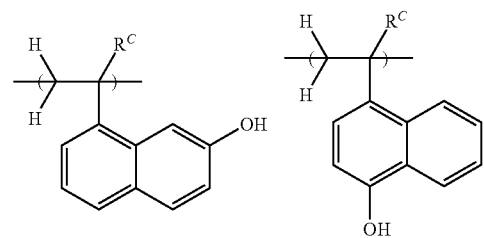

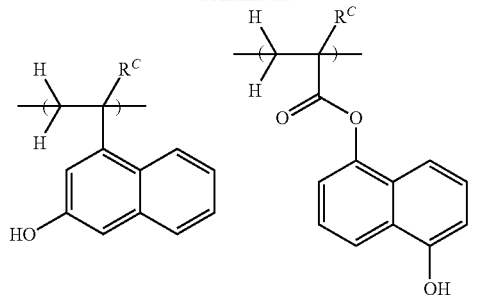
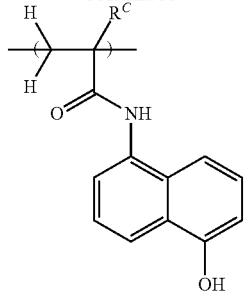
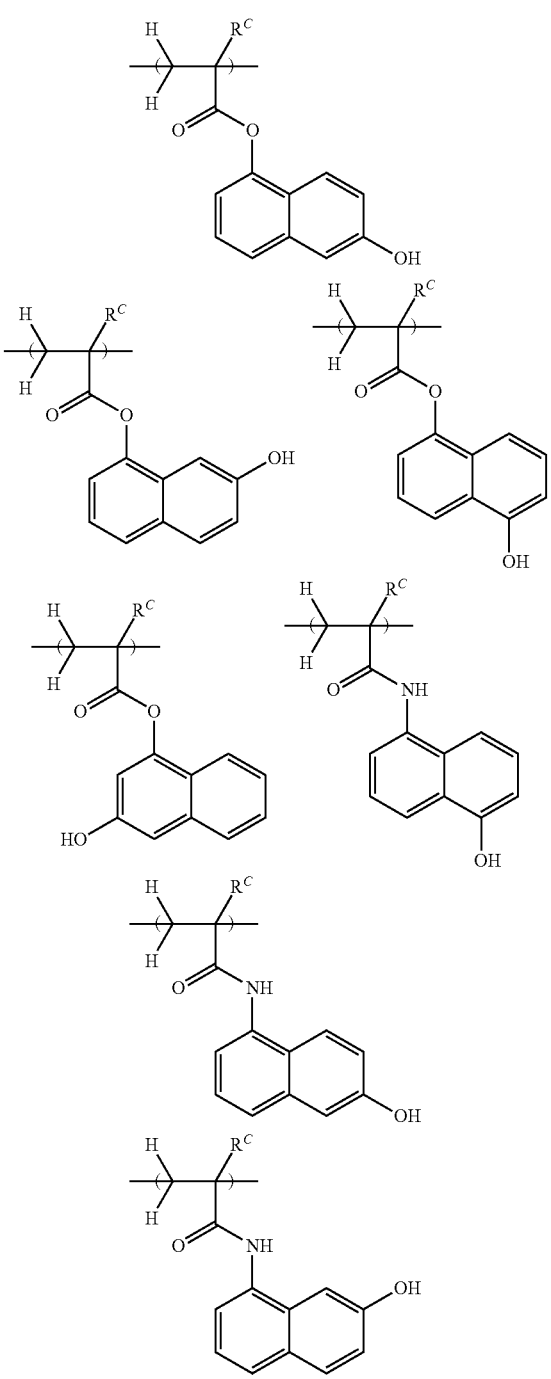
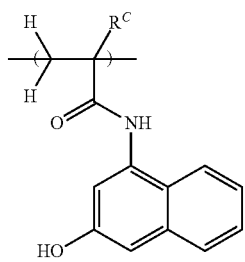

In formula (D1), $X^1$ is preferably —C(=O)—O— or —C(=O)—NH—. The inclusion of carbonyl in $X^1$ enhances the ability to trip the acid originating from the anti-charging film. Also preferably $R^C$ is methyl. A polymer wherein $R^C$ is methyl is a rigid polymer having a high glass transition temperature (Tg) which is effective for suppressing acid diffusion. As a result, the stability with time of a resist film is improved, and neither resolution nor pattern profile is degraded.

In formulae (D2) and (D3), examples of the $C_1$-$C_{10}$ saturated hydrocarbyl group represented by $R^{303}$, $R^{304}$, $R^{306}$ and $R^{307}$ include alkyl groups such as methyl, ethyl, n-propyl, isopropyl, n-butyl, isobutyl, sec-butyl, tert-butyl, n-pentyl, n-hexyl, n-heptyl, n-octyl, n-nonyl, and n-decyl, and cyclic saturated hydrocarbyl groups such as cyclopropyl, cyclobutyl, cyclopentyl, cyclohexyl, adamantyl, and norbornyl. Inter glia, $C_1$-$C_6$ saturated hydrocarbyl groups are preferred.

In formulae (D2) to (D5), examples of the $C_1$-$C_{15}$ hydrocarbyl group represented by $R^{305}$, $R^{308}$, $R^{309}$ and $R^{310}$ include alkyl, alkenyl and alkynyl groups, with the alkyl groups being preferred. Suitable alkyl groups include n-undecyl, n-dodecyl, tridecyl, tetradecyl and pentadecyl as well as those exemplified above. The fluorinated hydrocarbyl groups correspond to the foregoing hydrocarbyl groups in which some or all carbon-bonded hydrogen atoms are substituted by fluorine atoms.

Examples of the $C_1$-$C_{20}$ (m+1)-valent hydrocarbon group or fluorinated hydrocarbon group $X^2$ include the foregoing hydrocarbyl groups and fluorinated hydrocarbyl groups, with m number of hydrogen atoms being eliminated.

Examples of the repeat units (D2) to (D5) are given below, but not limited thereto. Herein $R^D$ is as defined above.

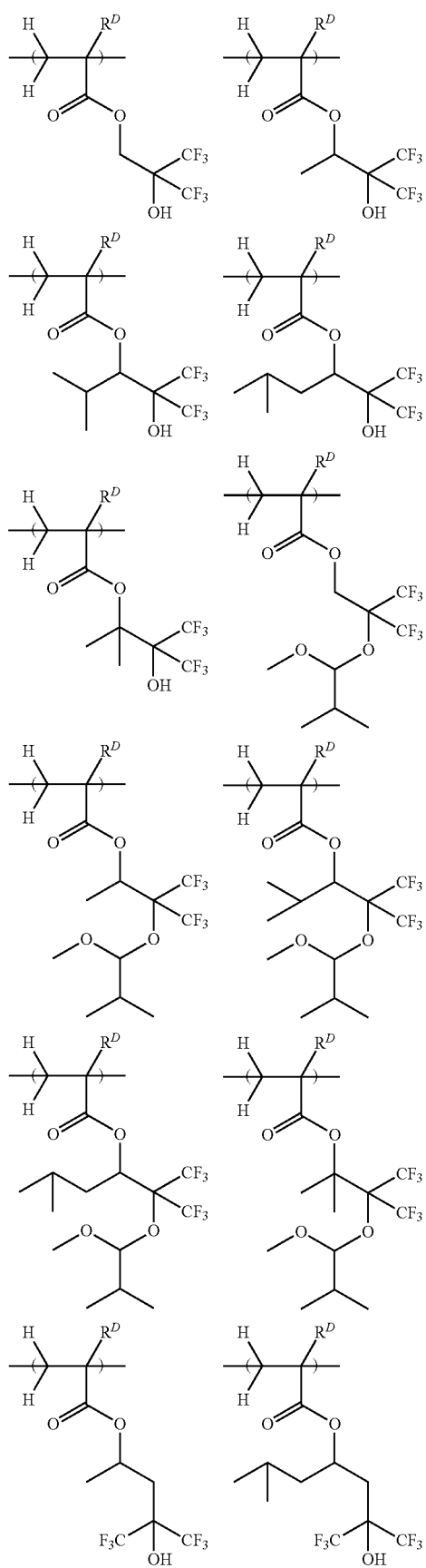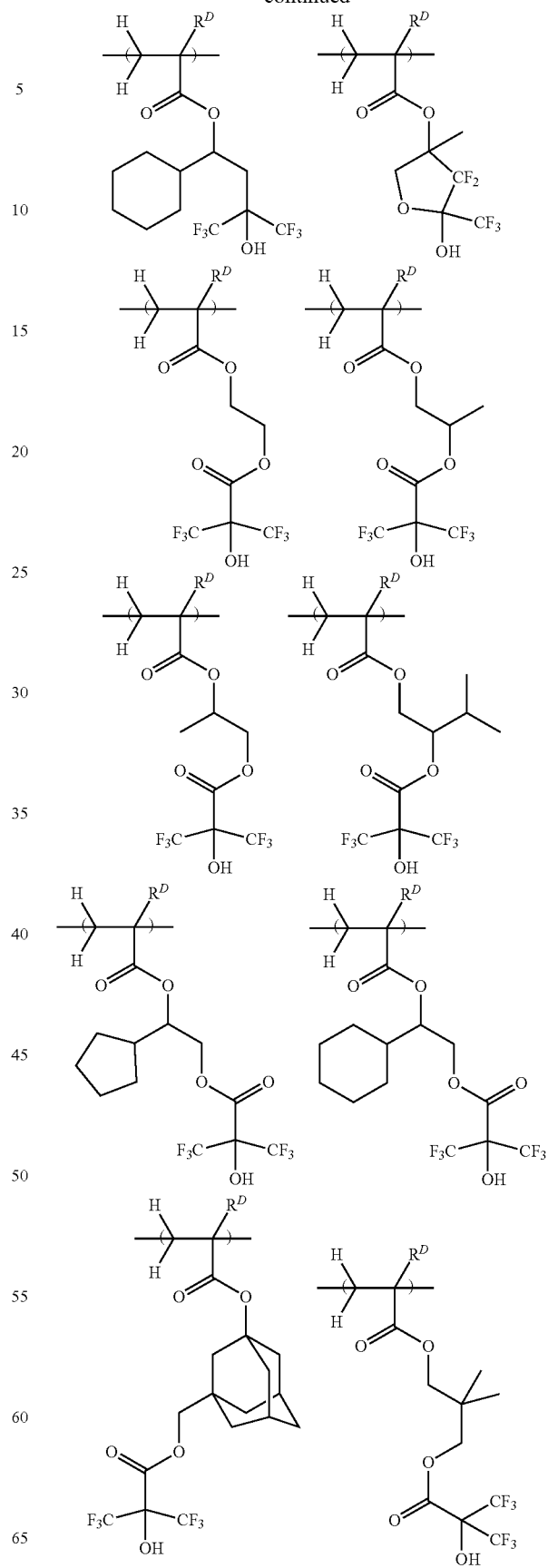

-continued

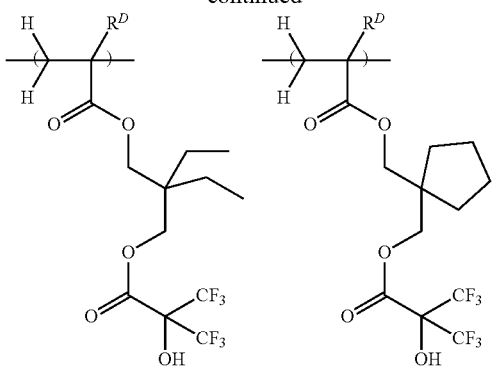
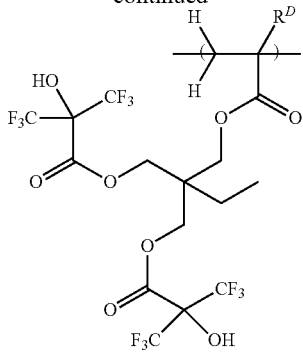

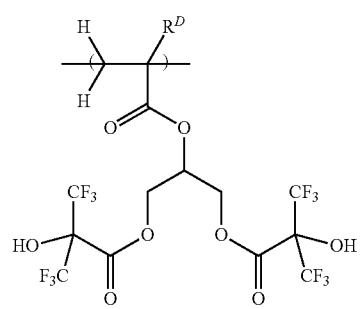

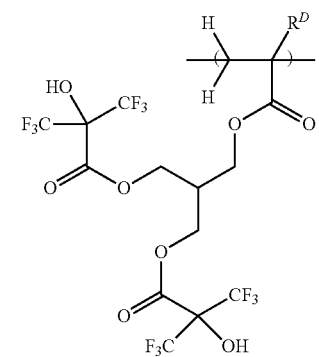

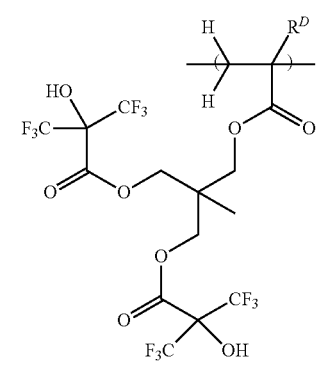

-continued

The repeat unit (D1) is preferably incorporated in an amount of 5 to 85 mol %, more preferably 15 to 80 mol % based on the overall repeat units of the fluorinated polymer (D). The repeat units (D2) to (D5) are preferably incorporated in an amount of 15 to 95 mol %, more preferably 20 to 85 mol % based on the overall repeat units of the fluorinated polymer (D). Each of repeat units (D2) to (D5) may be used alone or in admixture.

The fluorinated polymer (D) may comprise additional repeat units as well as the repeat units (D1) to (D5). Suitable additional repeat units include those described in U.S. Pat. No. 9,091,918 (JP-A 2014-177407, paragraphs [0046]-[0078]). When the fluorinated polymer (D) comprises additional repeat units, their content is preferably up to 50 mol % based on the overall repeat units.

The fluorinated polymer (D) may be synthesized by combining suitable monomers optionally protected with a protective group, copolymerizing them in the standard way, and effecting deprotection reaction if necessary. The copolymerization reaction is preferably radical polymerization or anionic polymerization though not limited thereto. For the polymerization reaction, reference may be made to JP-A 2004-115630.

The fluorinated polymer (D) should preferably have a Mw of 2,000 to 50,000, and more preferably 3,000 to 20,000. A fluorinated polymer with a Mw of less than 2,000 helps acid diffusion, degrading resolution and detracting from age stability. A polymer with too high Mw has a reduced solubility in solvent, with a risk of leaving coating defects. The fluorinated polymer preferably has a dispersity: (Mw/Mn) of 1.0 to 2.2, more preferably 1.0 to 1.7.

In the positive resist composition, the fluorinated polymer (D) is preferably used in an amount of 0.01 to 30 parts, more preferably 0.1 to 20 parts by weight per 80 parts by weight of the base polymer (B). The fluorinated polymer (D) may be used alone or in admixture.

(E) Organic Solvent

The positive resist composition may further comprise (E) an organic solvent. The organic solvent used herein is not particularly limited as long as the components are soluble therein. Examples of the organic solvent are described in JP-A 2008-111103, paragraphs [0145] to (U.S. Pat. No. 7,537,880). Specifically, exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene: glycol monoethyl ether acetate, ethyl lactate (EL), ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone (GBL), and mixtures thereof.

Of the above organic solvents, it is recommended to use 1-ethoxy-2-propanol, PGMEA, PGMEF, cyclohexanone, EL, GBL, and mixtures thereof. Where an acid labile group of acetal form is used, a high boiling alcohol solvent such as diethylene glycol, propylene glycol, glycerol, 1,4-butanediol or 1,3-butanediol may be added to accelerate deprotection reaction of acetal.

In the positive resist composition, the organic solvent (E) is preferably used in an amount of 200 to 10,000 parts, more preferably 400 to 5,000 parts by weight per 80 parts by weight of the base polymer (B). The organic solvent (E) may be used alone or in admixture.

(F) Basic Compound

In the positive resist composition, (F) a basic compound may be added as the acid diffusion inhibitor other than component (A) for the purpose of correcting a pattern profile or the like. The basic compound is effective for controlling acid diffusion. Even when the resist film is applied to a substrate having an outermost surface layer made of a chromium-containing material, the basic compound is effective for minimizing the influence of the acid generated in the resist film on the chromium-containing material.

Numerous basic compounds are known useful including primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, carbamate derivatives, and ammonium salts. Examples are described in Patent Document 9, for example, and any such compounds are useful. Of the foregoing basic compounds, preferred are tris[2-(methoxymethoxy)ethyl]amine, tris[2-(methoxymethoxy)ethyl]amine-N-oxide, dibutylaminobenzoic acid, morpholine derivatives and imidazole derivatives.

In the positive resist composition, the basic compound (F) is preferably added in an amount of 0 to 10 parts, and more preferably 0 to 5 parts by weight per 80 parts by weight of the base polymer (B). The basic compounds may be used alone or in admixture.

(G) Surfactant

In the positive resist composition, any of surfactants commonly used for improving coating characteristics to the substrate may be added as an optional component.

Numerous surfactants are known in the art, for example, in JP-A 2004-115630. A choice may be made with reference to such patent documents. An appropriate amount of the surfactant (G) used is 0 to 5 parts by weight per 80 parts by weight of the base polymer (B). The surfactants may be used alone or in admixture.

Process

Another embodiment of the invention is a pattern forming process comprising the steps of applying the chemically amplified positive resist composition defined above onto a substrate to form a resist film thereon, exposing the resist film patternwise to high-energy radiation, and developing the exposed resist film in a developer to form a resist pattern.

The substrate used herein may be selected from, for example, substrates for IC fabrication, e.g., Si, SiO, $SiO_2$, SiN, SiON, TiN, WSi, BPSG, SOG, and organic antireflective coating, and substrates for mask circuit fabrication, e.g., Cr, CrO, CrON, $MoSi_2$, Si, SiO, and $SiO_2$.

The resist composition is first applied onto a substrate by a suitable coating technique such as spin coating. The coating is prebaked on a hotplate preferably at a temperature of 60 to 150° C. for 1 to 20 minutes, more preferably at 80 to 140° C. for 1 to 10 minutes to form a resist film of 0.03 to 2 µm thick.

Then the resist film is exposed patternwise to high-energy radiation such as UV, deep UV, excimer laser (KrF, ArF), EUV, x-ray, γ-ray, synchrotron radiation or EB. The resist composition of the invention is especially effective in the EUV or EB lithography.

On use of UV, deep-UV, EUV, excimer laser, x-ray y-ray of synchrotron radiation as the high-energy radiation, the resist film is exposed through a mask having a desired pattern, preferably in a dose of 1 to 500 $mJ/cm^2$, more preferably 10 to 400 $mJ/cm^2$. On use of EB, a pattern may be written directly in a dose of preferably 1 to 500 $\mu C/cm^2$, more preferably 10 to 400 $\mu C/cm^2$.

The exposure may be performed by conventional lithography whereas the immersion lithography of holding a liquid between the mask and the resist film may be employed if desired. In the immersion lithography, a protective film which is insoluble in water may be used.

The resist film is then baked (PEB) on a hotplate preferably at 60 to 150° C. for 1 to 20 minutes, more preferably at 80 to 140° C. for 1 to 10 minutes.

Thereafter, the resist film is developed with a developer in the form of an aqueous base solution, for example, 0.1 to 5 wt %, preferably 2 to 3 wt % aqueous solution of tetramethylammonium hydroxide (TMAH) preferably for 0.1 to 3 minutes, more preferably 0.5 to 2 minutes by conventional techniques such as dip, puddle and spray techniques. In this way, a desired resist pattern is formed on the substrate.

From the positive resist composition, a pattern with a high resolution and improved LER and CDU can be formed. The resist composition is effectively applicable to a substrate, specifically a substrate having a surface layer of material to which a resist film is less adherent and which is likely to invite pattern stripping or pattern collapse, and particularly a substrate having sputter deposited on its outermost surface metallic chromium or a chromium compound containing at least one light element selected from oxygen, nitrogen and carbon or a substrate having an outermost surface layer of $SiO_x$. The invention is especially effective for pattern formation on a photomask blank as the substrate.

The resist pattern forming process is successful in forming a pattern having a high resolution and improved LER and CDU through exposure and development even when a substrate having the outermost surface made of a material having a potential impact on a resist pattern profile, typically chromium or silicon-containing material, e.g., photomask blank is used because the positive resist composition is effective far controlling acid diffusion on the substrate interface.

EXAMPLES

Examples and Comparative Examples are given below by way of illustration and not by way of limitation. All parts are by weight (pbw). The monomer constitutional ratio in a copolymer is a molar ratio. THF stands for tetrahydrofuran.

Mw is measured by GPC versus polystyrene standards. Analytic instruments are as shown below.

IR: NICOLET 6700 by Thermo Fisher Scientific Inc.
$^1$H-NMR: ECA-500 by JEOL Ltd.
$^{19}$F-NMR: ECA-500 by JEOL Ltd.
LC-MS: Acquity UPLC H-Class system and Acquity QDa by Waters

[1] Synthesis of Acid Diffusion Inhibitor

Synthesis Example 1-1

Synthesis of compound Q-A: 3,3,3',3'-tetrakis(trifluoromethyl)-1λ4-1,1'-spirobi[3H-2,1-benzoxathiol]

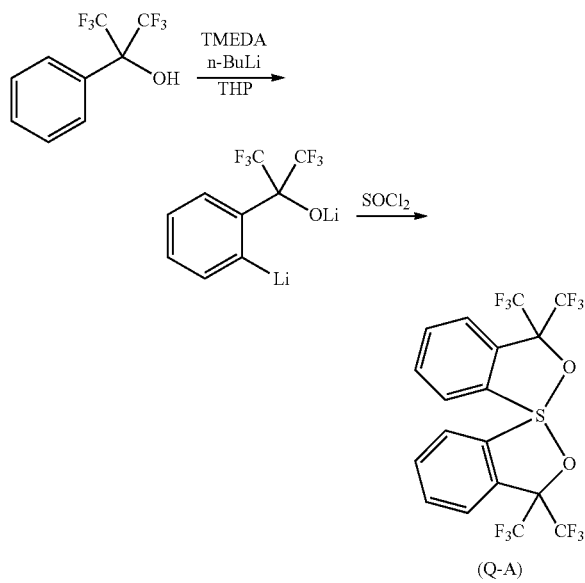

Under ice cooling, 2.1 g of N,N,N,N-tetramethylethylenediamine (TMEDA) was added dropwise to 32 mL of hexane solution of n-butyllithium (n-BuLi), followed by 30 minutes of aging. Under ice cooling, a mixture of 9.8 g of 1,1,1,3,3,3-hexafluoro-2-phenyl-2-propanol and THF was added dropwise thereto, followed by 20 hours of stirring. Further 50 g of THF was added to the solution, yielding a dilithio compound. A reactor was charged with 21.2 g of thionyl chloride. Under ice cooling, the THF solution of the dilithio compound was added dropwise to the reactor where it was aged for 18 hours. Thereafter, a saturated ammonium chloride aqueous solution was added to the solution to quench the reaction. The organic layer was taken out, washed with water, and concentrated under reduced pressure. Hexane was added to the concentrate for recrystallization. The crystals were collected by filtration and dried in vacuum, obtaining 4.2 g of the target compound Q-A (yield 41%).

Figure 2:
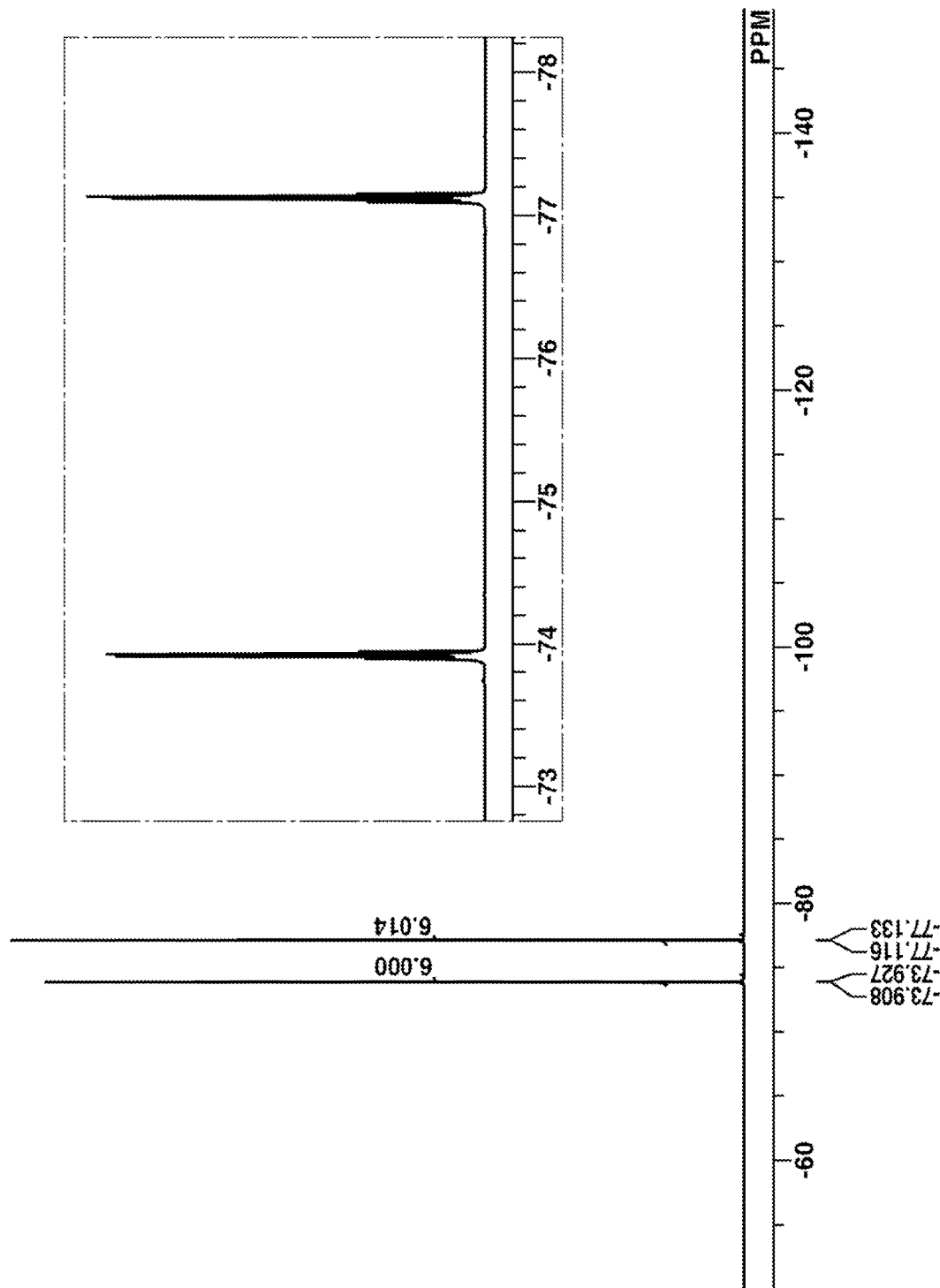
FIG. 2 is a diagram showing the $^{19}$F-NMR spectrum of Compound Q-A in Synthesis Example 1-1.

The compound Q-A was analyzed by spectroscopy. The NMR spectra, $^1$H-NMR and $^{19}$F-NMR is DMSO-d$_6$ are shown in FIGS. 1 and 2, respectively. In $^1$H-NMR analysis, a minute amount of water was observed.

IR (D-ATR): 3133, 1466, 1448, 1299, 1271, 1210, 1169, 1146, 1115, 1048, 972, 965, 956, 767, 738, 703, 679, 665, 571, 535, 526, 497 cm$^{-1}$.

LC/MS; Positive [M+H]$^{30}$ 517

Synthesis Example 1-2

Synthesis of compound Q-B: 1-chloro-1-[2-(1-hydroxy-1-methylethyl)phenyl]-3,3'-dimethyl[3H-2,1-benzoxathiol]

(1) Synthesis of Intermediate In-1; bis(2-carboxyphenyl)sulfide

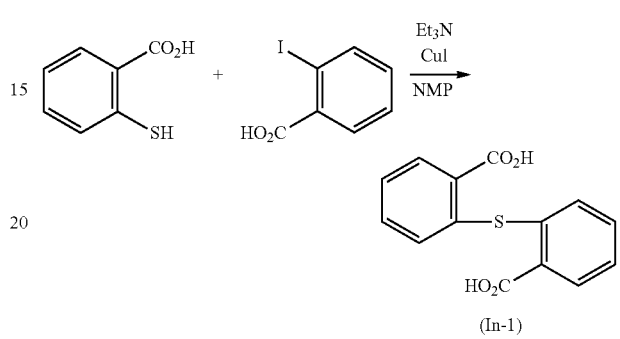

At room temperature, 34.0 g of triethylamine was added dropwise to a mixture of 15.4 g of thiosalicylic acid, 24.8 g of 2-iodobenzoic acid, 0.5 g clipper iodide, and N-methylpyrrolidone (NMP). The solution was aged at 100° C. for 15 hours. Dilute hydrochloric acid was added to the reaction solution. The insoluble or powder was collected by filtration. The powder was dissolved in methanol, after which deionized water was added thereto for recrystallization. The crystals were collected by filtration and heat dried in vacuum, obtaining 23 g of Intermediate In-1 (yield 84%).

(2) Synthesis of Intermediate 2,2'-dicarboxydiphenylsulfide dimethyl ester

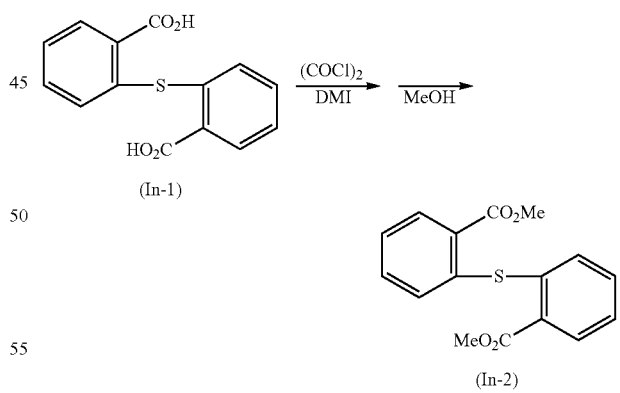

Intermediate In-1, 19.2 g, was dissolved in 100 g of 1,3-dimethyl-2-imidazolidinone (DMI). At room temperature, 26.7 g of oxalyl chloride was added dropwise to the solution, followed by 2 hours of aging. At room temperature, 100 g of methanol was added dropwise to the solution, followed by 3 hours of aging. Thereafter, 300 g of deionized water was added to quench the reaction. 200 g of toluene was added to the solution. The organic layer was taken out, washed with water, and concentrated under reduced pressure. The solvent removal left 22.9 g of concentrated residue. The residue as Intermediate In-2 was subjected to the subsequent reaction.

(3) Synthesis of Intermediate In-3: bis[2-(1-hydroxy-1-methylethyl)phenyl]sulfide

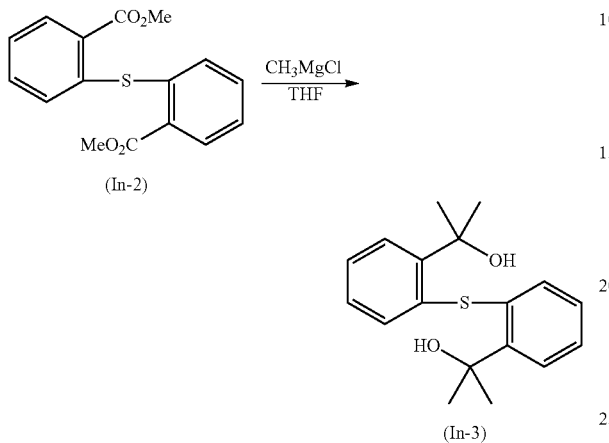

Intermediate In-2, 22.9 g, was dissolved in 75 g of THF. Under ice cooling, 100 g of THF solution of methyl magnesium chloride was added dropwise to the solution, followed by 20 hours of aging. Dilute hydrochloric acid was added to quench the reaction. Thereafter, 220 g of toluene was added to the reaction solution. The organic layer was taken out, washed with water, and concentrated under reduced pressure. To the concentrated residue, 100 g of hexane was added for crystallization. The crystals were collected by filtration and heat dried in vacuum, obtaining 15.7 g of the desired compound, Intermediate In-3 (yield 77%).

(4) Synthesis of Intermediate In-4; 1-chloro-1-[2-(1-hydroxy-1-methylethyl)phenyl]-3,3'-dimethyl [3H-2,1-benzoxathiol]

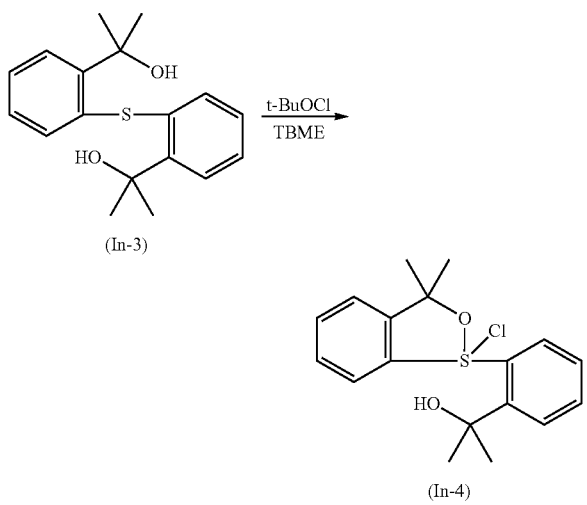

Intermediate In-3.9.1 g, was dissolved in 50 g of tert-butyl methyl ether (TBME). Under ice cooling, 3.3 g of tert-butyl hypochlorite was added dropwise to the solution, followed by 3 hours of aging. The insoluble or powder was collected by filtration, washed with TBME, and heat dried in vacuum, obtaining 8.2 g of the desired compound, Intermediate In-4 (yield 81%).

(5) Synthesis of compound Q-B: 1-chloro-1-[2-(1-hydroxy-1-methylethyl)phenyl]-3,3'-dimethyl[3H-2,1-benzoxathiol]

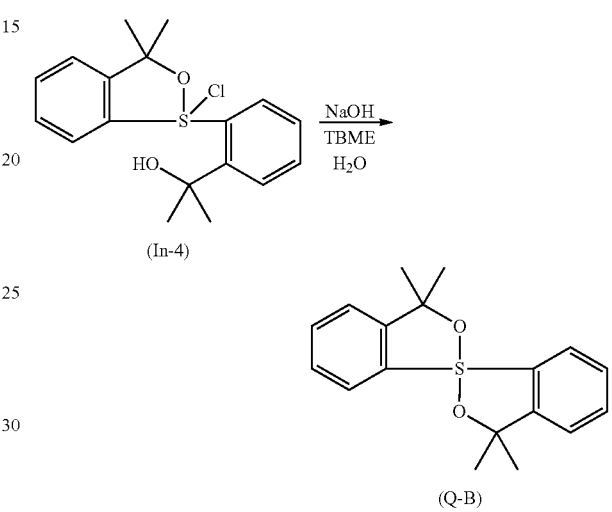

At room temperature, 37 g of a 25 wt % sodium hydroxide aqueous solution was added dropwise to a mixture of 8.2 g of Intermediate In-4 and 40 g of TBME, followed by 1 hour of aging. Then, 20 g of methyl isobutyl ketone was added to the solution. The organic layer was taken out, washed with deionized water, and concentrated under reduced pressure. Hexane was added to the concentrate for crystallization. The crystals were collected by filtration and heat dried in vacuum, obtaining 5.1 g of the target compound Q-B (yield 73%).

The compound Q-B was analyzed by spectroscopy. The NMR spectrum, $^1$H-NMR in DMSO-$d_6$ is shown in FIG. 3.

IR (D-ATR): 2974, 2928, 1468, 1446, 1436, 1374, 1357, 1285, 1251, 1165, 1156, 960, 945, 869, 782, 768, 743, 631, 622, 539, 532, 481, 458, 430 cm$^{-1}$

LC/MS: Positive [M+H]$^+$ 301

[2]Synthesis of Polymers

Synthesis Example 2-1

Synthesis of Polymer A-1

A 3-L flak was charged with 407.5 g of acetoxystyrene, 42.5 g of acenaphthylene, and 1,275 g of toluene solvent. The reactor was cooled at −70° C. under nitrogen atmosphere, after which vacuum pumping and nitrogen flow were repeated 3 times. The reactor was warmed up to room temperature, after which 34.7 g of 2,2'-azobis(2,4-dimethylvaleronitrile) (V-65 by Fujifilm Wako Pure Chemical Corp.) was added as polymerization initiator. The reactor was heated at 55° C., at which reaction took place for 40 hours. With stirring, a mixture of 970 g methanol and 180 g water was added dropwise to the reaction solution. At the end of addition, the solution was allowed to stand for 30 minutes, during which it separated into two layers. The lower layer (Polymer layer) was concentrated under reduced pressure. The polymer layer was dissolved in a mixture of 0.45 L methanol and 0.54 L. THY again. 160 g of triethylamine and 30 g of water were added to the solution, which was heated at 60° C., at which deprotection reaction took place for 40 hours. The reaction solution was concentrated under reduced pressure. To the concentrate, 548 g of methanol and 112 g of acetone were added. With stirring, 990 g of hexane was added dropwise to the solution. At the end of addition, the solution was allowed to stand for 30 minutes, during which it separated into two layers. To the lower layer (polymer laver), 300 g of THY was added. With stirring, 1,030 g of hexane was added dropwise to the solution. After 30 minutes of standing, the lower layer (polymer layer) was concentrated under reduced pressure. The resulting polymer solution was neutralized with 82 g of acetic acid, concentrated, dissolved in 0.3 L of acetone, and admitted into 10 L. of water for precipitation. The precipitate was collected by filtration and dried, obtaining 280 g of white solid (polymer). On analysis by $^1$H-NMR and GPC, the polymer had a copolymerization ratio of hydroxystyrene:acenaphthylene=89.3:10.7, a Mw of 5,000, and a Mw/Mn of 1.63.

To 100 g of the polymer, 50 g of (2-methyl-1-propenyl) methyl ether was added. The reaction under acidic conditions was followed by neutralization, separably operation, and crystallization. There was obtained 125 g of Polymer A-1.

Synthesis Examples 2-2 to 2-9

Synthesis of Polymers A-2 to A-7, P-1, and P-2

Polymers A-2 to A-7, P-1, and P-2 were synthesized by the same procedure as in Synthesis Example 2-1 aside from changing the type and amount of monomers.

The structure of Polymers A-1 to A-7. P-1, and P-2 is shown below.

A-1

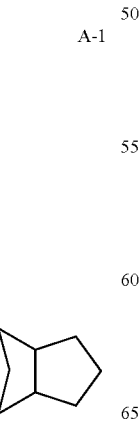

(a = 0.76, b = 0.12. c = 0.12, Mw = 5,500)

A-2

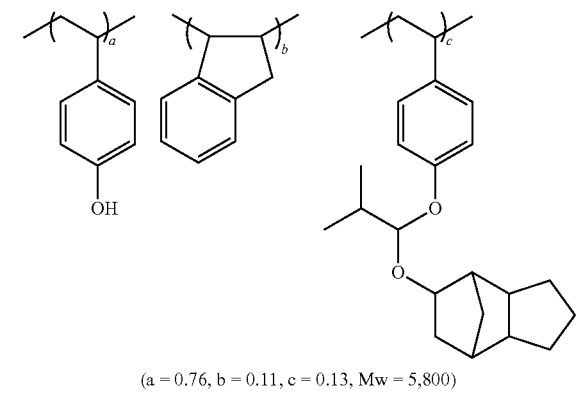

(a = 0.76, b = 0.11, c = 0.13, Mw = 5,800)

A-3

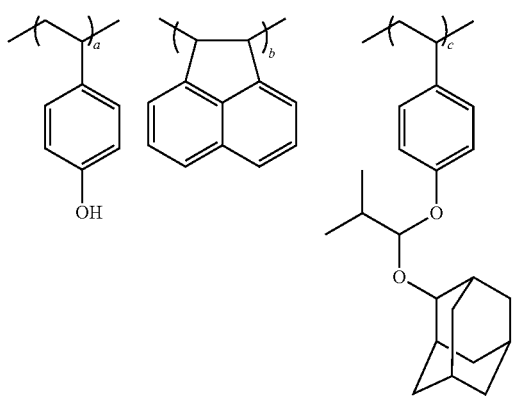

(a = 0.78, b = 0.11, c = 0.11, Mw = 5,500)

A-4

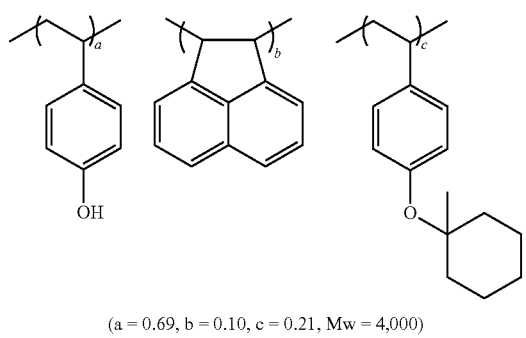

(a = 0.69, b = 0.10, c = 0.21, Mw = 4,000)

A-5

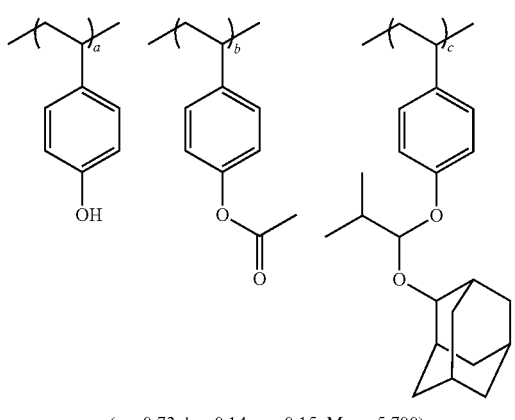

(a = 0.73, b = 0.14, c = 0.15, Mw = 5,700)

-continued

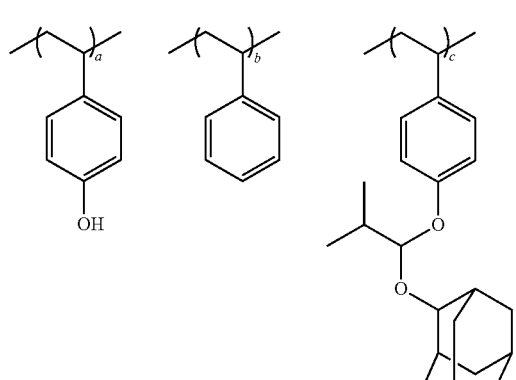
(a = 0.73, b = 0.13, c = 0.14, Mw = 5,400)
A-6

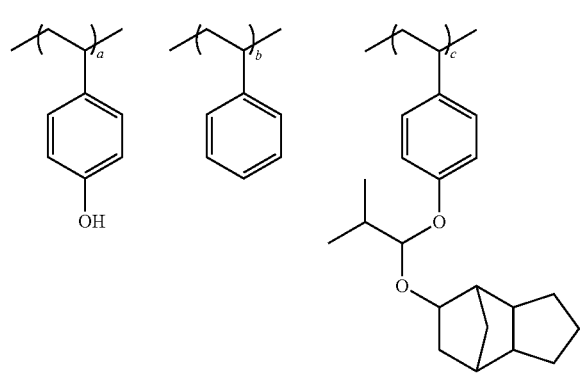
(a = 0.73, b = 0.13, c = 0.14, Mw = 5,400)
A-7

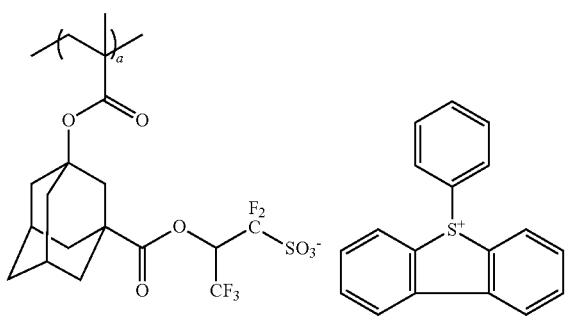

P-1

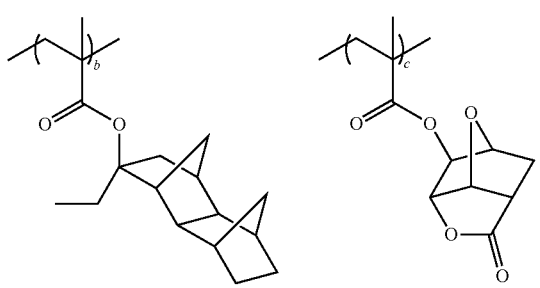

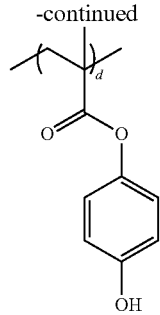
(a = 0.20, b = 0.30, c = 0.30, d = 0.20, Mw = 14.500)

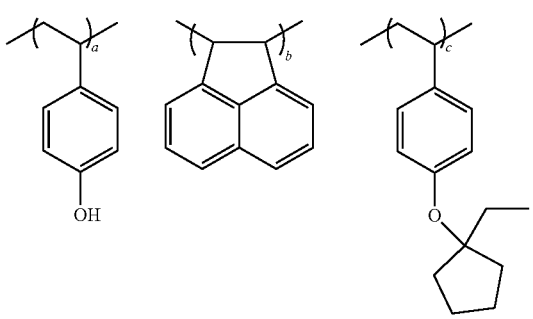
P-2

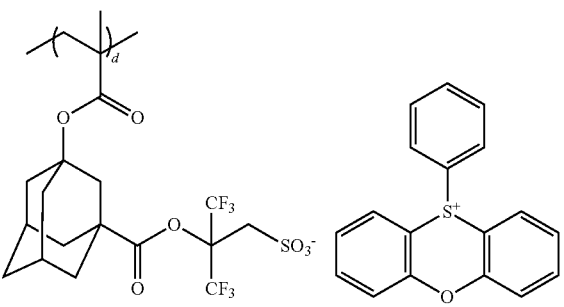
(a = 0.55, b = 0.10, c = 0.25, d = 0.10, Mw = 7,200)

[3] Preparation of Chemically Amplified Positive Resist Composition

Examples 1-1 to 1-30 and Comparative Examples 1-1 to 1-7

A chemically amplified positive resist composition (R-1 to R-30, CR-1 to CR-7) was prepared by dissolving selected components in an organic solvent in accordance with the formulation shown in Tables 1 to 3, and filtering the solution through a UPE filter with a pore size of 0.02 μn.

In the column of organic solvent in Tables 1 to 3, PGME stands for propylene glycol monomethyl ether, PGMEA for propylene glycol monomethyl ether acetate, and EL for ethyl lactate.

The comparative acid diffusion inhibitors Q-C and Q-D, photoacid generators PAG-A to PAG-C, and fluorinated polymers C-1 to C-3 in Tables 1 to 3 are identified below.

Q-C and Q-D:
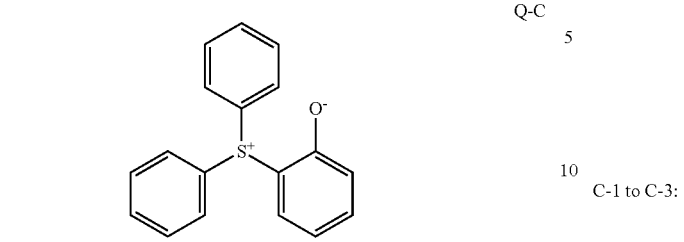
Q-C
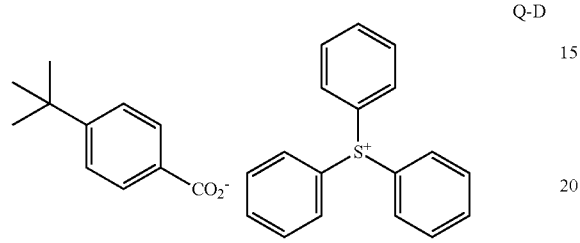
Q-D
PAG-A to PAG-C:
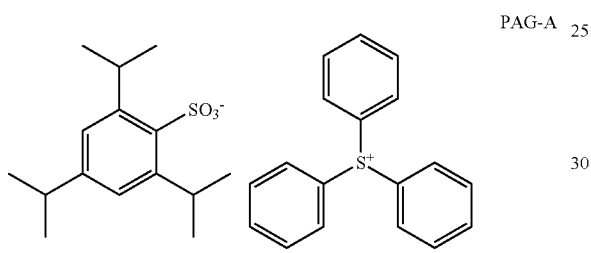
PAG-A
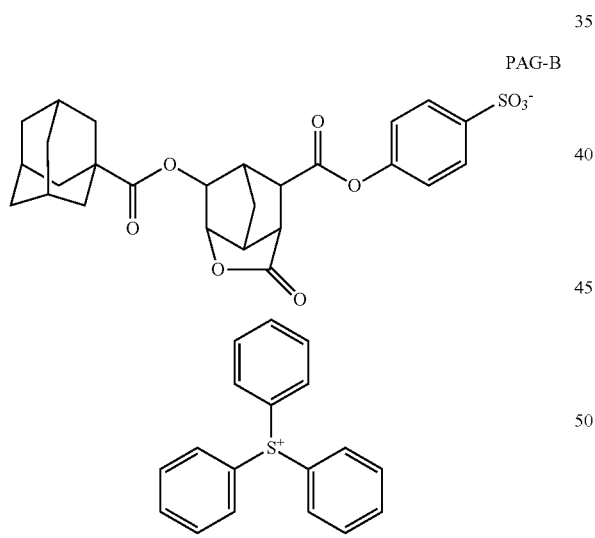
PAG-B
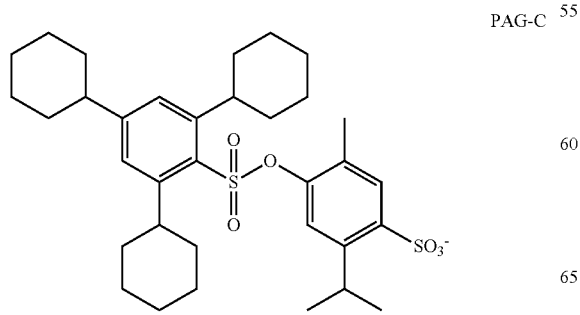
PAG-C
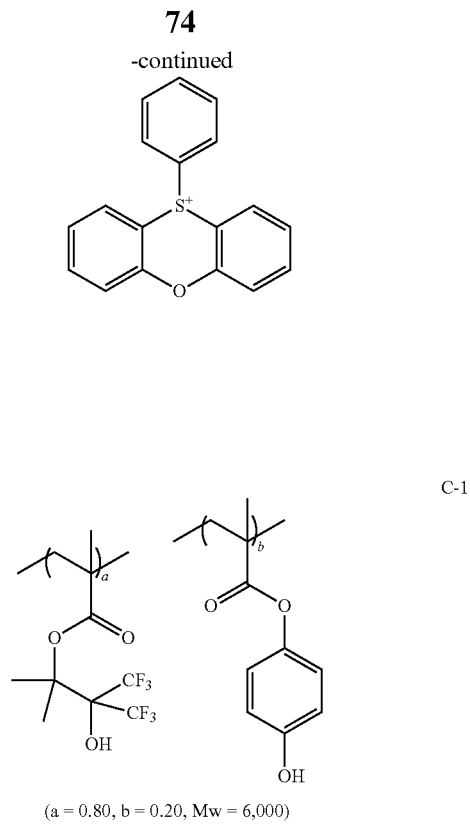
C-1 to C-3:
C-1
(a = 0.80, b = 0.20, Mw = 6,000)
C-2
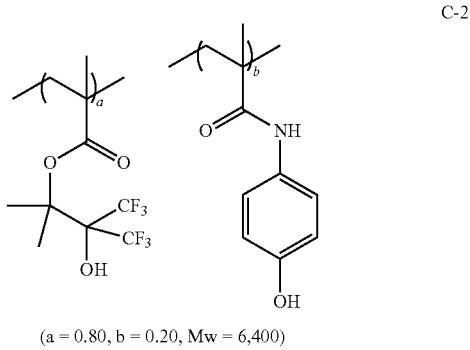
(a = 0.80, b = 0.20, Mw = 6,400)
C-3
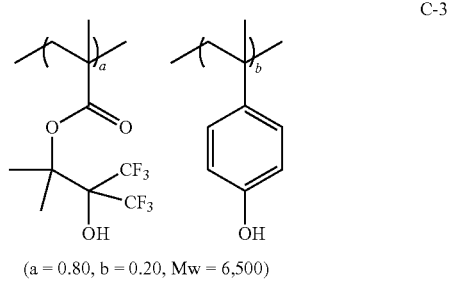
(a = 0.80, b = 0.20, Mw = 6,500)

TABLE 1

| | Resist composition | Acid diffusion inhibitor (pbw) | Polymer 1 (pbw) | Polymer 2 (pbw) | Acid generator (pbw) | Additive (pbw) | Solvent 1 (pbw) | Solvent 2 (pbw) | Solvent 3 (pbw) |
|---|---|---|---|---|---|---|---|---|---|
| Example 1-1 | R-1 | Q-A (5.0) | A-1 (80) | | PAG-A (10) | | PGMEA (386) | EL (1,932) | PGME (1,546) |
| 1-2 | R-2 | Q-A (5.0) | A-1 (80) | | PAG-B (10) | | PGMEA (386) | EL (1,932) | PGME (1,546) |
| 1-3 | R-3 | Q-A (5.0) | A-1 (80) | | PAG-C (10) | | PGMEA (386) | EL (1,932) | PGME (1,546) |
| 1-4 | R-4 | Q-A (5.0) | A-1 (80) | | PAG-C (10) | C-1 (3) | PGMEA (386) | EL (1,932) | PGME (1,546) |
| 1-5 | R-5 | Q-A (5.0) | A-1 (80) | | PAG-C (10) | C-2 (3) | PGMEA (386) | EL (1,932) | PGME (1,546) |
| 1-6 | R-6 | Q-A (5.0) | A-1 (80) | | PAG-C (10) | C-3 (3) | PGMEA (386) | EL (1,932) | PGME (1,546) |
| 1-7 | R-7 | Q-A (5.0) | A-2 (80) | | PAG-C (10) | | PGMEA (386) | EL (1,932) | PGME (1,546) |
| 1-8 | R-8 | Q-A (5.0) | A-3 (80) | | PAG-C (10) | | PGMEA (386) | EL (1,932) | PGME (1,546) |
| 1-9 | R-9 | Q-A (5.0) | A-4 (80) | | PAG-C (10) | | PGMEA (386) | EL (1,932) | PGME (1,546) |
| 1-10 | R-10 | Q-A (5.0) | A-5 (80) | | PAG-C (10) | | PGMEA (386) | EL (1,932) | PGME (1,546) |
| 1-11 | R-11 | Q-A (5.0) | A-6 (80) | | PAG-C (10) | | PGMEA (386) | EL (1,932) | PGME (1,546) |
| 1-12 | R-12 | Q-A (5.0) | A-7 (80) | | PAG-A (10) | | PGMEA (386) | EL (1,932) | PGME (1,546) |
| 1-13 | R-13 | Q-A (5.0) | A-7 (80) | | PAG-C (10) | | PGMEA (386) | EL (1,932) | PGME (1,546) |
| 1-14 | R-14 | Q-A (5.0) | A-7 (80) | | PAG-C (10) | C-1 (3) | PGMEA (386) | EL (1,932) | PGME (1,546) |
| 1-15 | R-15 | Q-A (5.0) | A-3 (40) | P-1 (40) | | | PGMEA (386) | EL (1,932) | PGME (1,546) |
| 1-16 | R-16 | Q-A (5.0) | A-3 (40) | P-2 (40) | | | PGMEA (386) | EL (1,932) | PGME (1,546) |
| 1-17 | R-17 | Q-A (5.0) | A-3 (40) | P-2 (40) | PAG-A (5) | C-1 (3) | PGMEA (386) | EL (1,932) | PGME (1,546) |
| 1-18 | R-18 | Q-A (5.0) | A-3 (40) | P-2 (40) | PAG-C (5) | C-1 (3) | PGMEA (386) | EL ) (1,932 | PGME (1,546) |
| 1-19 | R-19 | Q-A (5.0) | A-7 (40) | P-2 (40) | PAG-A (5) | C-1 (3) | PGMEA (386) | EL (1,932) | PGME (1,546) |
| 1-20 | R-20 | Q-A (5.0) | A-7 (40) | P-2 (40) | PAG-C (5) | C-1 (3) | PGMEA (386) | EL (1,932) | PGME (1,546) |

TABLE 2

| | Resist composition | Acid diffusion inhibitor (pbw) | Polymer 1 (pbw) | Polymer 2 (pbw) | Acid generator (pbw) | Additive (pbw) | Solvent 1 (pbw) | Solvent 2 (pbw) | Solvent 3 (pbw) |
|---|---|---|---|---|---|---|---|---|---|
| Example 1-21 | R-21 | Q-B (5.0) | A-1 (80) | | PAG-A (10) | | PGMEA (386) | EL (1,932) | PGME (1,546) |
| 1-22 | R-22 | Q-B (5.0) | A-1 (80) | | PAG-B (10) | | PGMEA (386) | EL (1,932) | PGME (1,546) |
| 1-23 | R-23 | Q-B (5.0) | A-1 (80) | | PAG-C (10) | | PGMEA (386) | EL (1,932) | PGME (1,546) |
| 1-24 | R-24 | Q-B (5.0) | A-1 (80) | | PAG-C (10) | C-1 (3) | PGMEA (386) | EL (1,932) | PGME (1,546) |
| 1-25 | R-25 | Q-B (5.0) | A-3 (80) | | PAG-C (10) | C-1 (3) | PGMEA (386) | EL (1,932) | PGME (1,546) |
| 1-26 | R-26 | Q-B (5.0) | A-4 (80) | | PAG-C (10) | C-1 (3) | PGMEA (386) | EL (1,932) | PGME (1,546) |
| 1-27 | R-27 | Q-B (5.0) | A-7 (80) | | PAG-C (10) | C-1 (3) | PGMEA (386) | EL (1,932) | PGME (1,546) |
| 1-28 | R-28 | Q-B (5.0) | A-3 (40) | P-2 (40) | PAG-A (5) | C-1 (3) | PGMEA (386) | EL (1,932) | PGME (1,546) |
| 1-29 | R-29 | Q-B (5.0) | A-7 (40) | P-2 (40) | PAG-A (5) | C-1 (3) | PGMEA (386) | EL (1,932) | PGME (1,546) |
| 1-30 | R-30 | Q-B (5.0) | A-7 (40) | P-2 (40) | PAG-C (5) | C-1 (3) | PGMEA (386) | EL (1,932) | PGME (1,546) |

TABLE 3

| | Resist composition | Acid diffusion inhibitor (pbw) | Polymer 1 (pbw) | Polymer 2 (pbw) | Acid generator (pbw) | Additive (pbw) | Solvent 1 (pbw) | Solvent 2 (pbw) | Solvent 3 (pbw) |
|---|---|---|---|---|---|---|---|---|---|
| Comparative Example 1-1 | CR-1 | Q-C (5.0) | A-1 (80) | | PAG-A (10) | | PGMEA (386) | EL (1,932) | PGME (1,546) |
| 1-2 | CR-2 | Q-C (5.0) | A-1 (80) | | PAG-B (10) | | PGMEA (386) | EL (1,932) | PGME (1,546) |
| 1-3 | CR-3 | Q-C (5.0) | A-1 (80) | | PAG-C (10) | | PGMEA (386) | EL (1,932) | PGME (1,546) |
| 1-4 | CR-4 | Q-C (5.0) | A-3 (40) | P-2 (40) | PAG-A (5) | C-1 (3) | PGMEA (386) | EL (1,932) | PGME (1,546) |
| 1-5 | CR-5 | Q-D (5.0) | A-1 (80) | | PAG-A (10) | | PGMEA (386) | EL (1,932) | PGME (1,546) |
| 1-6 | CR-6 | Q-D (5.0) | A-1 (80) | | PAG-B (10) | | PGMEA (386) | EL (1,932) | PGME (1,546) |
| 1-7 | CR-7 | Q-D (5.0) | A-1 (80) | | PAG-C (10) | | PGMEA (386) | EL (1,932) | PGME (1,546) |

[4] EB Lithography Test

Examples 2-1 to 2-30 and Comparative Examples 2-1 to 2-7

Using a coater/developer system ACT-M (Tokyo Election Ltd.), each of the positive resist compositions (R-1 to R-30 and CR-1 to CR-7) was spin coated onto a mask blank of 152 mm squares having the outermost surface in the form of a silicon oxide coating, which had been vapor-primed with hexamethyldisilazane (HMDS), and prebaked on a hotplate at 110° C. for 600 seconds to form a resist film of 80 mu thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The resist film was exposed to EB using an EB writer system EBM-5000Plus (NuFlare Technology Inc., accelerating voltage 50 kV), then baked (PEB) at 120° C. for 600 seconds, and developed in a 2.38 wt % TMAH aqueous solution, thereby yielding a positive pattern.

The resist pattern was evaluated as follows. The patterned mask blank was observed under a top-down scanning electron microscope (TDSEM). The optimum dose (Eop) was defined as the exposure dose ($\mu C/cm^2$) which provided a 1:1 resolution at the top and bottom of a 200-nm 1:1 line-and-space (LS) pattern. The resolution (or maximum resolution) was defined as the minimum line width of a L/S pattern that could be resolved at the optimum dose.

The 200-nm LS pattern printed by exposure at the optimum dose (Eop) was observed under SEM. For each of the edges of 32 lines of the LS pattern, edge detection was carried out at 80 points, from which a 3-fold value (3σ) of standard deviation (σ) or variation was determined and reported as LER (nm). Also, the size of lines was measured at 144 points within the blank substrate plane, from which a 3-fold value (3σ) of standard deviation (σ) was determined and reported as CDU (nm). A smaller value indicates a LS pattern with better CDU. The results are shown in Table 4.

TABLE 4

| | | Resist composition | Eop ($\mu C/cm^2$) | Maximum resolution (nm) | LER (nm) | CDU (nm) |
|---|---|---|---|---|---|---|
| Example | 2-1 | R-1 | 48 | 37 | 3.7 | 2.2 |
| | 2-2 | R-2 | 52 | 37 | 3.6 | 2.3 |
| | 2-3 | R-3 | 55 | 35 | 3.4 | 2.1 |
| | 2-4 | R-4 | 54 | 35 | 3.3 | 2.0 |
| | 2-5 | R-5 | 54 | 35 | 3.4 | 2.0 |
| | 2-6 | R-6 | 54 | 35 | 3.4 | 2.1 |
| | 2-7 | R-7 | 56 | 37 | 3.5 | 2.2 |
| | 2-8 | R-8 | 55 | 35 | 3.3 | 2.0 |
| | 2-9 | R-9 | 57 | 37 | 3.3 | 2.1 |
| | 2-10 | R-10 | 54 | 37 | 3.5 | 2.3 |
| | 2-11 | R-11 | 54 | 35 | 3.1 | 1.9 |
| | 2-12 | R-12 | 52 | 35 | 3.2 | 2.0 |
| | 2-13 | R-13 | 55 | 35 | 3.1 | 1.8 |
| | 2-14 | R-14 | 55 | 35 | 3.0 | 1.8 |
| | 2-15 | R-15 | 57 | 37 | 3.3 | 2.2 |
| | 2-16 | R-16 | 56 | 35 | 3.2 | 2.1 |
| | 2-17 | R-17 | 53 | 35 | 3.1 | 1.9 |
| | 2-18 | R-18 | 54 | 35 | 3.0 | 1.8 |
| | 2-19 | R-19 | 52 | 32 | 2.9 | 1.8 |
| | 2-20 | R-20 | 53 | 32 | 2.8 | 1.7 |
| | 2-21 | R-21 | 46 | 37 | 3.8 | 2.3 |
| | 2-22 | R-22 | 50 | 37 | 3.6 | 2.3 |
| | 2-23 | R-23 | 53 | 37 | 3.6 | 2.1 |
| | 2-24 | R-24 | 52 | 35 | 3.5 | 2.1 |
| | 2-25 | R-25 | 54 | 35 | 3.4 | 2.2 |
| | 2-26 | R-26 | 53 | 37 | 3.4 | 2.2 |
| | 2-27 | R-27 | 54 | 35 | 3.1 | 2.0 |
| | 2-28 | R-28 | 52 | 35 | 3.2 | 1.9 |
| | 2-29 | R-29 | 50 | 35 | 3.1 | 1.9 |
| | 2-30 | R-30 | 51 | 32 | 2.9 | 1.8 |
| Comparative Example | 2-1 | CR-1 | 46 | 40 | 4.2 | 2.5 |
| | 2-2 | CR-2 | 50 | 45 | 4.2 | 2.6 |
| | 2-3 | CR-3 | 52 | 40 | 3.9 | 2.4 |
| | 2-4 | CR-4 | 48 | 40 | 3.8 | 2.3 |
| | 2-5 | CR-5 | 57 | 45 | 4.4 | 2.9 |
| | 2-6 | CR-6 | 58 | 45 | 4.4 | 3.0 |
| | 7-7 | CR-7 | 59 | 45 | 4.2 | 2.8 |

All the inventive resist compositions (R-1 to R-30) comprising the compounds having formula (A1) show good resolution and reduced values of LER and CDU as compared with the comparative resist compositions (CR-1 to CR-7).

The inventive resist composition comprising the compound having formula (A1) where irreversible acid-trapping reaction takes place has a high acid diffusion controlling ability and shows satisfactory resolution and LER, as compared with the resist compositions of Comparative Examples 2-1 to 2-7 where reversible acid-trapping reaction takes place. Since the compound having formula (A1) is fully compatible with the casting solvent, it is uniformly dispersed within the resist film, which accounts for satisfactory values of LER and CDU.

It has been demonstrated that the chemically amplified positive resist compositions within the scope of the invention form patterns having a high resolution and improved LER and CDU. They are thus best suited in photolithography for the fabrication of semiconductor devices and photomask blanks.

Japanese Patent Application No. 2021-020953 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising (A) a sulfurane or selenurane compound having the following, formula (A1) and (B) a base polymer containing a polymer which is decomposed under the action of acid to increase its solubility in alkaline developer, the polymer comprising repeat units having the following formula (B1),

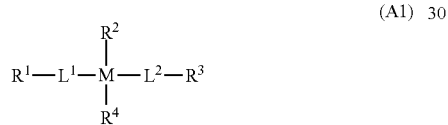

wherein $R^1$ to $R^4$ are each independently a $C_1$-$C_{20}$ hydrocarbyl group which may contain a heteroatom, $R^1$ and $R^2$ may bond together to form a ring with $L^1$ and M to which they are attached, each pair of $R^1$ and $R^2$, and $R^3$ and $R^4$ may bond together to form spiro rings containing M as the spiro atom, $L^1$ and $L^2$ are each independently —O— or —N(R)—, R is hydrogen or a $C_1$-$C_{20}$ hydrocarbyl group which may contain a heteroatom, and M is sulfur or selenium,

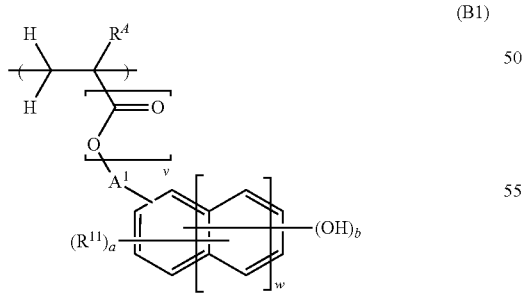

wherein $R^A$ is hydrogen, fluorine, methyl or trifluoromethyl, $R^{11}$ is halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group, $A^1$ is a single bond or a $C_1$-$C_{10}$ saturated hydrocarbylene group in which any constituent —$CH_2$— may be replaced by —O—, v is 0 or 1, w is an integer of 0 to 2, a is an integer satisfying 0≤a≤5+2w−b, and b is an integer of 1 to 3.

2. The positive resist composition of claim 1 wherein the polymer further comprises repeat units having the formula (B2):

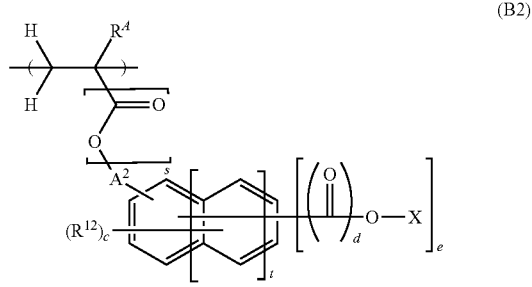

wherein $R^A$ is as defined above, $R^{12}$ is halogen, an optionally halogenated $C_2$-$C_8$ saturated hydrocarbylcarbonyloxy group, optionally halogenated $C_1$-$C_6$ saturated hydrocarbyl group, or optionally halogenated $C_1$-$C_6$ saturated hydrocarbyloxy group, $A^2$ is a single bond or $C_1$-$C_{10}$ saturated hydrocarbylene group in which any constituent —$CH_2$— may be replaced by —O—, s is 0 or 1, t is an integer of 0 to 2, c is an integer satisfying 0≤c≤5+2t−e, d is 0 or 1, e is an integer of 1 to 3, X is an acid labile group when e=1, and X is hydrogen or an acid labile group, at least one being an acid labile group, when e=2 or 3.

3. The positive resist composition of claim 1 wherein the polymer further comprises repeat units of at least one type selected from repeat units having the formula (B3), repeat units having the formula (B4), and repeat units having the formula (B5):

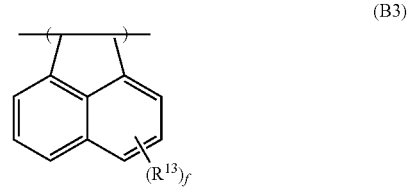

-continued (B5)
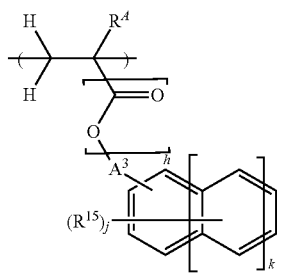

wherein $R^A$ is as defined above,
$R^{13}$ and $R^{14}$ are each independently hydroxy, halogen, an optionally halogenated $C_2$-$C_8$ saturated hydrocarbylcarbonyloxy group, optionally halogenated $C_1$-$C_8$ saturated hydrocarbyl group, or optionally halogenated $C_1$-$C_8$ saturated hydrocarbyloxy group,
$R^{15}$ is an acetyl group, $C_1$-$C_{20}$ saturated hydrocarbyl group, $C_1$-$C_{20}$ saturated hydrocarbyloxy group, $C_2$-$C_{20}$ saturated hydrocarbylcarbonyloxy group, $C_2$-$C_{20}$ saturated hydrocarbyloxyhydrocarbyl group, $C_2$-$C_{20}$ saturated hydrocarbylthiohydrocarbyl group, halogen, nitro group, cyano group, sulfinyl group, or sulfonyl group,
$A^3$ is a single bond or $C_1$-$C_{10}$ saturated hydrocarbylene group in which any constituent —$CH_2$— may be replaced by —O—,
f and g are each independently an integer of 0 to 4, h is 0 or 1, j is an integer of 0 to 5, and k is an integer of 0 to 2.

4. The positive resist composition of claim 1 wherein the polymer further comprises repeat units of at least one type selected from repeat units having the formulae (B6) to (B13):

(B6)
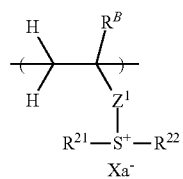

(B7)
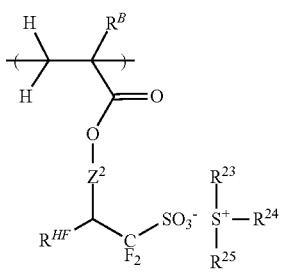

(B8)
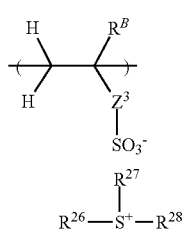

(B9)
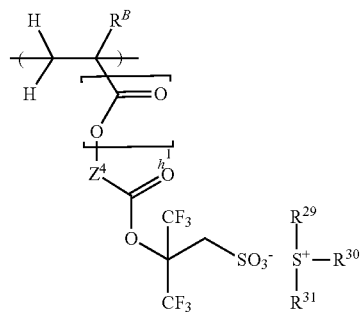

(B10)
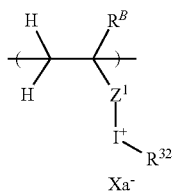

(B11)
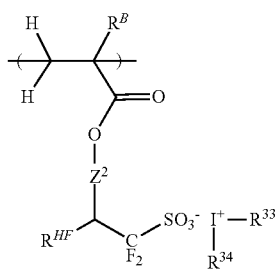

(B12)
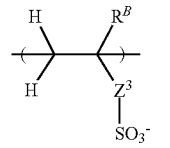

(B13)
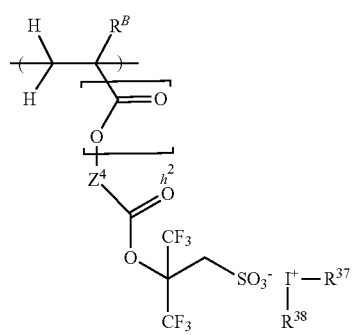

wherein $R^B$ is each independently hydrogen or methyl,
$Z^1$ is a single bond, a $C_1$-$C_6$ aliphatic hydrocarbylene group, phenylene group, naphthylene group or $C_7$-$C_{18}$ group obtained by combining the foregoing, —O—$Z^{11}$—, —C(=O)—O—$Z^{11}$—, or —C(=O)—NH—$Z^{11}$—, $Z^{11}$ is a $C_1$-$C_6$ aliphatic hydrocarbylene group, phenylene group, naphthylene group or $C_7$-$C_{18}$ group obtained by combining the foregoing, which may contain a carbonyl moiety, ester bond, ether bond or hydroxy moiety,
$Z^2$ is a single bond or —$Z^{21}$—C(=O)—O—, $Z^{21}$ is a $C_1$-$C_{20}$ hydrocarbylene group which may contain a heteroatom, $Z^3$ is a single bond, methylene, ethylene, phenylene, fluorinated phenylene, trifluoromethyl-substituted phenylene, —O—$Z^{31}$—, —C(=O)—O—$Z^{31}$—, or —C(=O)—NH—$Z^{31}$—, $Z^{31}$ is a $C_1$-$C_6$ aliphatic hydrocarbylene group, phenylene group, fluorinated phenylene group, trifluoromethyl-substituted phenylene group, or $C_7$-$C_{20}$ group obtained by combining the foregoing, which may contain a carbonyl moiety, ester bond, ether bond or hydroxy moiety, $Z^4$ is a single bond or $C_1$-$C_{30}$ hydrocarbylene group which may contain a heteroatom, $h^1$ and $h^2$ are each independently 0 or 1, $h^1$ and $h^2$ are 0 when $Z^4$ is a single bond, $R^{21}$ to $R^{38}$ are each independently a $C_1$-$C_{20}$ hydrocarbyl group which may contain a heteroatom, $R^{21}$ and $R^{22}$ may bond together to form a ring with the sulfur atom to which they are attached, $R^{23}$ and $R^{24}$, $R^{26}$ and $R^{27}$, or $R^{29}$ and $R^{30}$ may bond together to form a ring with the sulfur atom to which they are attached, $R^{HF}$ is hydrogen or trifluoromethyl, and $Xa^-$ is a non-nucleophilic counter ion.

5. The positive resist composition of claim 1, further comprising (C) a photoacid generator.

6. The positive resist composition of claim 1, further comprising (D) a polymer comprising repeat units having the formula (D1) and repeat units of at least one type selected from repeat units having the formulae (D2) to (D5):

(D1)

(D2)

(D3)

(D4)
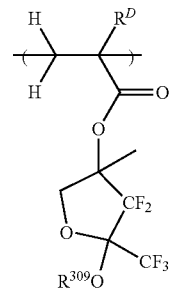

(D5)
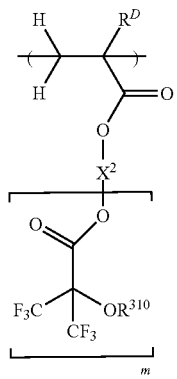

wherein $R^C$ is each independently hydrogen or methyl,
$R^D$ is each independently hydrogen, fluorine, methyl or trifluoromethyl,
$R^{301}$ is hydrogen or a $C_1$-$C_5$ straight or branched hydrocarbyl group in which a heteroatom-containing moiety may intervene in a carbon-carbon bond,
$R^{302}$ is a $C_1$-$C_5$ straight or branched hydrocarbyl group in which a heteroatom-containing moiety may intervene in a carbon-carbon bond,
$R^{303}$, $R^{304}$, $R^{306}$ and $R^{307}$ are each independently hydrogen or a $C_1$-$C_{10}$ saturated hydrocarbyl group,
$R^{305}$, $R^{308}$, $R^{309}$ and $R^{310}$ are each independently hydrogen, a $C_1$-$C_{15}$ hydrocarbyl group, $C_1$-$C_{15}$ fluorinated hydrocarbyl group, or acid labile group,
when $R^{305}$, $R^{308}$, $R^{309}$ and $R^{310}$ each are a hydrocarbyl or fluorinated hydrocarbyl group, an ether bond or carbonyl moiety may intervene in a carbon-carbon bond,
x is an integer of 1 to 3, y is an integer satisfying 0≤y≤5+2z−x, z is 0 or 1, m is an integer of 1 to 3,
$X^1$ is a single bond, —C(=O)—O— or C(=O)—NH—, and
$X^2$ is a $C_1$-$C_{20}$ (m+1)-valent hydrocarbon group or $C_1$-$C_{20}$ (m+1)-valent fluorinated hydrocarbon group.

7. The positive resist composition of claim 1, further comprising (E) an organic solvent.

8. A resist pattern forming process comprising the steps of:
applying the chemically amplified positive resist composition of claim 1 onto a substrate to form a resist film thereon,
exposing the resist film patternwise to high-energy radiation, and
developing the exposed resist film in an alkaline developer.

9. The process of claim 8 wherein the high-energy radiation is EUV or EB.

10. The process of claim 8 wherein the substrate has the outermost surface of a silicon-containing material.

11. The process of claim 8 wherein the substrate is a photomask blank.

12. A photomask blank which is coated with the chemically amplified positive resist composition of claim 1.

* * * * *